US012777805B2

(12) United States Patent
Seo et al.

(10) Patent No.: US 12,777,805 B2
(45) Date of Patent: Oct. 27, 2026

(54) LIGHT-EMITTING ELEMENT, LIGHT-EMITTING DEVICE, DISPLAY DEVICE, ELECTRONIC DEVICE, AND LIGHTING DEVICE

(71) Applicant: Semiconductor Energy Laboratory Co., Ltd., Kanagawa-ken (JP)

(72) Inventors: Satoshi Seo, Sagamihara (JP); Takahiro Ishisone, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 205 days.

(21) Appl. No.: 18/760,300

(22) Filed: Jul. 1, 2024

(65) Prior Publication Data

US 2024/0365578 A1 Oct. 31, 2024

Related U.S. Application Data

(63) Continuation of application No. 18/213,584, filed on Jun. 23, 2023, now Pat. No. 12,029,059, which is a
(Continued)

(30) Foreign Application Priority Data

Aug. 10, 2012 (JP) ................................ 2012-177795

(51) Int. Cl.
*H10K 59/35* (2023.01)
*H10H 20/811* (2025.01)
(Continued)

(52) U.S. Cl.
CPC ......... *H10K 59/351* (2023.02); *H10H 20/811* (2025.01); *H10K 50/11* (2023.02);
(Continued)

(58) Field of Classification Search
None
See application file for complete search history.

(56) References Cited

U.S. PATENT DOCUMENTS 5,409,783 A 4/1995 Tang et al.
5,420,288 A 5/1995 Ohta et al.
(Continued)

FOREIGN PATENT DOCUMENTS

CN 001543659 A 11/2004
CN 001905238 A 1/2007
(Continued)

OTHER PUBLICATIONS

Kondakova.M et al., "High-efficiency, low-voltage phosphorescent organic light-emitting diode devices with mixed host", J. Appl. Phys. (Journal of Applied Physics) , Nov. 4, 2008, vol. 104, pp. 094501-1-094501-17.
(Continued)

*Primary Examiner* — Whitney Moore
(74) *Attorney, Agent, or Firm* — Husch Blackwell LLP

(57) ABSTRACT

A light-emitting element which uses a plurality of kinds of light-emitting dopants emitting light in a balanced manner and has high emission efficiency is provided. Further, a light-emitting device, a display device, an electronic device, and a lighting device each having reduced power consumption by using the above light-emitting element are provided. A light-emitting element which includes a plurality of light-emitting layers including different phosphorescent materials is provided. In the light-emitting element, the light-emitting layer which includes a light-emitting material emitting light with a long wavelength includes two kinds of carrier-transport compounds having properties of transporting carriers with different polarities. Further, in the light-emitting element, the triplet excitation energy of a host material included in the light-emitting layer emitting light with a
(Continued)

short wavelength is higher than the triplet excitation energy of at least one of the carrier-transport compounds.

10 Claims, 25 Drawing Sheets

Related U.S. Application Data continuation of application No. 17/326,732, filed on May 21, 2021, now Pat. No. 11,690,239, which is a continuation of application No. 16/879,023, filed on May 20, 2020, now Pat. No. 11,018,313, which is a continuation of application No. 16/178,875, filed on Nov. 2, 2018, now Pat. No. 10,665,808, which is a continuation of application No. 15/418,185, filed on Jan. 27, 2017, now Pat. No. 10,121,984, which is a continuation of application No. 14/858,343, filed on Sep. 18, 2015, now Pat. No. 9,559,324, which is a continuation of application No. 13/961,293, filed on Aug. 7, 2013, now Pat. No. 9,142,710.

(51) Int. Cl.

| | |
|---|---|
| ***H10K 50/11*** | (2023.01) |
| ***H10K 50/13*** | (2023.01) |
| ***H10K 50/15*** | (2023.01) |
| ***H10K 50/16*** | (2023.01) |
| ***H10K 59/38*** | (2023.01) |
| ***H10K 59/80*** | (2023.01) |
| ***H10K 85/00*** | (2023.01) |
| ***H10K 101/00*** | (2023.01) |
| ***H10K 101/10*** | (2023.01) |
| ***H10K 101/25*** | (2023.01) |
| ***H10K 101/30*** | (2023.01) |
| ***H10K 101/40*** | (2023.01) |

(52) U.S. Cl.

CPC ............ *H10K 50/13* (2023.02); *H10K 59/38* (2023.02); *H10K 85/00* (2023.02); *H10K 50/15* (2023.02); *H10K 50/16* (2023.02); *H10K 59/8051* (2023.02); *H10K 59/8052* (2023.02); *H10K 2101/10* (2023.02); *H10K 2101/25* (2023.02); *H10K 2101/30* (2023.02); *H10K 2101/40* (2023.02); *H10K 2101/90* (2023.02)

(56) References Cited

U.S. PATENT DOCUMENTS

| | | | |
|---|---|---|---|
| 5,597,890 | A | 1/1997 | Jenekhe |
| 5,597,925 | A | 1/1997 | Ohta et al. |
| 5,610,309 | A | 3/1997 | Ohta et al. |
| 5,656,401 | A | 8/1997 | Ohta et al. |
| 5,709,492 | A | 1/1998 | Yasunaga et al. |
| 6,097,147 | A | 8/2000 | Baldo et al. |
| 6,863,997 | B2 | 3/2005 | Thompson et al. |
| 6,869,695 | B2 | 3/2005 | Thompson et al. |
| 6,911,271 | B1 | 6/2005 | Lamansky et al. |
| 6,939,624 | B2 | 9/2005 | Lamansky et al. |
| 6,951,694 | B2 | 10/2005 | Thompson et al. |
| 7,009,338 | B2 | 3/2006 | D'Andrade et al. |
| 7,175,922 | B2 | 2/2007 | Jarikov et al. |
| 7,183,010 | B2 | 2/2007 | Jarikov |
| 7,227,027 | B2 | 6/2007 | Qiu et al. |
| 7,285,907 | B2 | 10/2007 | D'Andrade et al. |
| 7,332,857 | B2 | 2/2008 | Seo et al. |
| 7,381,479 | B2 | 6/2008 | Lamansky et al. |
| 7,553,557 | B2 | 6/2009 | Thompson et al. |
| 7,553,560 | B2 | 6/2009 | Lamansky et al. |
| 7,572,522 | B2 | 8/2009 | Seo et al. |
| 7,597,967 | B2 | 10/2009 | Kondakova et al. |
| 7,771,844 | B2 | 8/2010 | Inoue et al. |
| 7,803,469 | B2 | 9/2010 | Lee et al. |
| 7,928,650 | B2 | 4/2011 | Mori et al. |
| 7,943,925 | B2 | 5/2011 | Yamazaki |
| 7,993,760 | B2 | 8/2011 | Komori et al. |
| 8,021,574 | B2 | 9/2011 | Kawamura et al. |
| 8,025,815 | B2 | 9/2011 | Kawamura et al. |
| 8,029,697 | B2 | 10/2011 | Kawamura et al. |
| 8,034,256 | B2 | 10/2011 | Kawamura et al. |
| 8,034,465 | B2 | 10/2011 | Liao et al. |
| 8,154,195 | B2 | 4/2012 | Nishimura et al. |
| 8,211,552 | B2 | 7/2012 | Nishimura et al. |
| 8,221,907 | B2 | 7/2012 | Kawamura et al. |
| 8,247,086 | B2 | 8/2012 | Inoue et al. |
| 8,274,214 | B2 | 9/2012 | Ikeda et al. |
| 8,294,142 | B2 | 10/2012 | Nishimura et al. |
| 8,330,350 | B2 | 12/2012 | Nishimura et al. |
| 8,436,343 | B2 | 5/2013 | Nishimura et al. |
| 8,568,903 | B2 | 10/2013 | Kawamura et al. |
| 8,587,192 | B2 | 11/2013 | Nishimura et al. |
| 8,652,654 | B2 | 2/2014 | Inoue et al. |
| 8,653,553 | B2 | 2/2014 | Yamazaki et al. |
| 8,673,459 | B2 | 3/2014 | Seo et al. |
| 8,697,885 | B2 | 4/2014 | Kawakami et al. |
| 8,779,655 | B2 | 7/2014 | Nishimura et al. |
| 8,808,876 | B2 | 8/2014 | Takasu et al. |
| 8,853,680 | B2 | 10/2014 | Yamazaki et al. |
| 8,865,323 | B2 | 10/2014 | Inoue et al. |
| 8,877,352 | B2 | 11/2014 | Inoue et al. |
| 8,906,521 | B2 | 12/2014 | Suda et al. |
| 8,940,414 | B2 | 1/2015 | Inoue et al. |
| 8,963,127 | B2 | 2/2015 | Pieh et al. |
| 8,981,355 | B2 | 3/2015 | Seo |
| 8,993,129 | B2 | 3/2015 | Endo et al. |
| 8,994,263 | B2 | 3/2015 | Shitagaki et al. |
| 9,054,317 | B2 | 6/2015 | Monkman et al. |
| 9,059,430 | B2 | 6/2015 | Seo et al. |
| 9,065,058 | B2 | 6/2015 | Seo et al. |
| 9,082,995 | B2 | 7/2015 | Nishimura et al. |
| 9,142,710 | B2 | 9/2015 | Seo et al. |
| 9,159,942 | B2 | 10/2015 | Seo et al. |
| 9,175,213 | B2 | 11/2015 | Seo et al. |
| 9,209,415 | B2 | 12/2015 | Shitagaki et al. |
| 9,263,693 | B2 | 2/2016 | Seo et al. |
| 9,356,250 | B2 | 5/2016 | Ohsawa et al. |
| 9,559,324 | B2 | 1/2017 | Seo et al. |
| 9,590,208 | B2 | 3/2017 | Seo et al. |
| 9,604,928 | B2 | 3/2017 | Shitagaki et al. |
| 9,634,279 | B2 | 4/2017 | Seo et al. |
| 9,640,775 | B2 | 5/2017 | Oohisa et al. |
| 9,735,372 | B2 | 8/2017 | Seo et al. |
| 10,062,867 | B2 | 8/2018 | Seo et al. |
| 10,177,329 | B2 | 1/2019 | Kim et al. |
| 10,193,077 | B2 | 1/2019 | Inoue et al. |
| 10,367,160 | B2 | 7/2019 | Seo et al. |
| 10,693,094 | B2 | 6/2020 | Seo et al. |
| 10,833,282 | B2 | 11/2020 | Seo et al. |
| 10,978,661 | B2 | 4/2021 | Seo et al. |
| 2003/0124381 | A1 | 7/2003 | Thompson et al. |
| 2003/0175553 | A1 | 9/2003 | Thompson et al. |
| 2003/0205696 | A1 | 11/2003 | Thoms et al. |
| 2004/0076853 | A1 | 4/2004 | Jarikov |
| 2004/0178720 | A1 | 9/2004 | Lee et al. |
| 2005/0048310 | A1 | 3/2005 | Cocchi et al. |
| 2005/0106415 | A1 | 5/2005 | Jarikov et al. |
| 2005/0196775 | A1 | 9/2005 | Swager et al. |
| 2005/0214576 | A1 | 9/2005 | Lamansky et al. |
| 2005/0221116 | A1 | 10/2005 | Cocchi et al. |
| 2005/0221121 | A1 | 10/2005 | Ishihara et al. |
| 2006/0024526 | A1 | 2/2006 | Thompson et al. |
| 2006/0134464 | A1 | 6/2006 | Nariyuki |
| 2006/0159955 | A1 | 7/2006 | Inoue et al. |
| 2006/0228577 | A1 | 10/2006 | Nagara |
| 2007/0090756 | A1 | 4/2007 | Okada et al. |
| 2007/0099026 | A1 | 5/2007 | Lee et al. |
| 2007/0222374 | A1 | 9/2007 | Egawa et al. |
| 2007/0244320 | A1 | 10/2007 | Inoue et al. |
| 2007/0247061 | A1 | 10/2007 | Adamovich et al. |

(56) References Cited

U.S. PATENT DOCUMENTS

| | | | |
|---|---|---|---|
| 2007/0247829 | A1 | 10/2007 | Fiedler et al. |
| 2008/0160345 | A1 | 7/2008 | Inoue et al. |
| 2008/0217604 | A1 | 9/2008 | Yokoyama et al. |
| 2008/0281098 | A1 | 11/2008 | Lamansky et al. |
| 2008/0286604 | A1 | 11/2008 | Inoue et al. |
| 2009/0045731 | A1 | 2/2009 | Nishimura et al. |
| 2009/0191427 | A1 | 7/2009 | Liao et al. |
| 2010/0052527 | A1 | 3/2010 | Ikeda et al. |
| 2010/0141122 | A1 | 6/2010 | Begley et al. |
| 2010/0145044 | A1 | 6/2010 | Inoue et al. |
| 2010/0171109 | A1 | 7/2010 | Nishimura et al. |
| 2010/0184942 | A1 | 7/2010 | Chen et al. |
| 2010/0244725 | A1 | 9/2010 | Adamovich et al. |
| 2010/0295027 | A1 | 11/2010 | Kawamura et al. |
| 2010/0331585 | A1 | 12/2010 | Kawamura et al. |
| 2011/0001146 | A1 | 1/2011 | Yamazaki et al. |
| 2011/0057178 | A1 | 3/2011 | Shitagaki et al. |
| 2011/0204353 | A1 | 8/2011 | Yamazaki |
| 2011/0210316 | A1 | 9/2011 | Kadoma et al. |
| 2011/0215714 | A1 | 9/2011 | Seo et al. |
| 2012/0098417 | A1 | 4/2012 | Inoue et al. |
| 2012/0138906 | A1 | 6/2012 | Thompson et al. |
| 2012/0205632 | A1 | 8/2012 | Shitagaki et al. |
| 2012/0205687 | A1 | 8/2012 | Yamazaki et al. |
| 2012/0206035 | A1 | 8/2012 | Shitagaki et al. |
| 2012/0217486 | A1 | 8/2012 | Takemura et al. |
| 2012/0217487 | A1 | 8/2012 | Yamazaki et al. |
| 2012/0242219 | A1 | 9/2012 | Seo et al. |
| 2012/0248421 | A1 | 10/2012 | Yamazaki et al. |
| 2012/0256535 | A1 | 10/2012 | Seo et al. |
| 2012/0267618 | A1 | 10/2012 | Monkman et al. |
| 2013/0048964 | A1 | 2/2013 | Takeda et al. |
| 2013/0092913 | A1 | 4/2013 | Nishimura et al. |
| 2013/0240851 | A1 | 9/2013 | Seo et al. |
| 2013/0240933 | A1 | 9/2013 | Yamazaki et al. |
| 2013/0270531 | A1 | 10/2013 | Seo et al. |
| 2013/0277654 | A1 | 10/2013 | Seo et al. |
| 2013/0292656 | A1 | 11/2013 | Seo et al. |
| 2013/0320377 | A1 | 12/2013 | Yamazaki et al. |
| 2014/0034927 | A1 | 2/2014 | Seo et al. |
| 2014/0061604 | A1 | 3/2014 | Seo et al. |
| 2014/0159097 | A1 | 6/2014 | Yamazaki et al. |
| 2015/0069352 | A1 | 3/2015 | Kim et al. |
| 2015/0228912 | A1 | 8/2015 | Inoue et al. |
| 2019/0097155 | A1 | 3/2019 | Kim et al. |
| 2021/0226146 | A1 | 7/2021 | Seo et al. |

FOREIGN PATENT DOCUMENTS

| | | | |
|---|---|---|---|
| CN | 101128559 | A | 2/2008 |
| CN | 101728417 | A | 6/2010 |
| CN | 107230744 | A | 10/2017 |
| EP | 0669387 | A | 8/1995 |
| EP | 1202608 | A | 5/2002 |
| EP | 1359790 | A | 11/2003 |
| EP | 2166585 | A | 3/2010 |
| EP | 2166586 | A | 3/2010 |
| EP | 2166587 | A | 3/2010 |
| EP | 2166588 | A | 3/2010 |
| EP | 2166589 | A | 3/2010 |
| EP | 2166590 | A | 3/2010 |
| EP | 2166591 | A | 3/2010 |
| EP | 2175490 | A | 4/2010 |
| EP | 2259285 | A | 12/2010 |
| EP | 2363398 | A | 9/2011 |
| EP | 2366753 | A | 9/2011 |
| EP | 2388842 | A | 11/2011 |
| EP | 1202608 | B | 2/2012 |
| EP | 2415769 | A | 2/2012 |
| EP | 2423209 | A | 2/2012 |
| EP | 2582206 | A | 4/2013 |
| EP | 2822019 | A | 1/2015 |
| JP | 06-107648 | A | 4/1994 |
| JP | 07-085972 | A | 3/1995 |
| JP | 2004-522276 | | 7/2004 |
| JP | 2005-104971 | A | 4/2005 |
| JP | 2006-203172 | A | 8/2006 |
| JP | 2006-269232 | A | 10/2006 |
| JP | 2007-027092 | A | 2/2007 |
| JP | 2007-073620 | A | 3/2007 |
| JP | 2007-250296 | A | 9/2007 |
| JP | 2008-524848 | | 7/2008 |
| JP | 2008-247810 | A | 10/2008 |
| JP | 2008-288344 | A | 11/2008 |
| JP | 2009-035524 | A | 2/2009 |
| JP | 2010-034484 | A | 2/2010 |
| JP | 2010-121041 | A | 6/2010 |
| JP | 2010-135689 | A | 6/2010 |
| JP | 2010-161357 | A | 7/2010 |
| JP | 2011-077032 | A | 4/2011 |
| JP | 2011-511458 | | 4/2011 |
| JP | 2011-153269 | A | 8/2011 |
| JP | 2011-201869 | A | 10/2011 |
| JP | 2011-216628 | A | 10/2011 |
| JP | 2012-044125 | A | 3/2012 |
| JP | 2012-080093 | A | 4/2012 |
| JP | 2012-131775 | A | 7/2012 |
| JP | 2012-212879 | A | 11/2012 |
| JP | 2013-509670 | | 3/2013 |
| JP | 2013-125653 | A | 6/2013 |
| JP | 2011/132683 | | 7/2013 |
| JP | 2014-056814 | A | 3/2014 |
| JP | 2017-108108 | A | 6/2017 |
| KR | 2004-0019177 | A | 3/2004 |
| KR | 2007-0009305 | A | 1/2007 |
| KR | 2010-0138899 | A | 12/2010 |
| KR | 2011-0065507 | A | 6/2011 |
| KR | 2013-0115027 | A | 10/2013 |
| WO | WO-2000/070655 | | 11/2000 |
| WO | WO-2002/091814 | | 11/2002 |
| WO | WO-2003/059015 | | 7/2003 |
| WO | WO-2009/008359 | | 1/2009 |
| WO | WO-2009/097108 | | 8/2009 |
| WO | WO-2010/026859 | | 3/2010 |
| WO | WO-2010/082621 | | 7/2010 |
| WO | WO-2010/085676 | | 7/2010 |
| WO | WO-2010/134613 | | 11/2010 |
| WO | WO-2010/140549 | | 12/2010 |
| WO | WO-2011/027653 | | 3/2011 |
| WO | WO-2011/042443 | | 4/2011 |
| WO | WO-2012/033108 | | 3/2012 |
| WO | WO-2012/121101 | | 9/2012 |
| WO | WO-2012/127990 | | 9/2012 |
| WO | WO-2013/137088 | | 9/2013 |
| WO | WO-2013/154342 | | 10/2013 |
| WO | WO-2017/055963 | | 4/2017 |

OTHER PUBLICATIONS

Baldo.M et al., "Very High-Efficiency Green Organic Light-Emitting Devices Based on Electrophosphorescence", Appl. Phys. Lett. (Applied Physics Letters) , Jul. 5, 1999, vol. 75, No. 1, pp. 4-6.

Choong.V et al., "Organic Light-Emitting Diodes With a Bipolar Transport Layer", Appl. Phys. Lett. (Applied Physics Letters) , Jul. 12, 1999, vol. 75, No. 2, pp. 172-174.

Itano.K et al., "Exciplex formation at the organic solid-state interface: Yellow emission in organic light-emittingdiodes using green-fluorescent tris(8-quinolinolato)aluminum and hole-transporting molecular materials with low ionization potentials", Appl. Phys. Lett. (Applied Physics Letters) , Feb. 9, 1998, vol. 72, No. 6, pp. 636-638.

Seo.J et al., "Efficient blue-green organic light-emitting diodes based on heteroleptic tris-cyclometalated iridium(III) complexes", Thin Solid Films, Sep. 25, 2008, vol. 517, No. 5, pp. 1807-1810.

Adachi.C et al., "NEARLY 100% Internal Phosphorescence Efficiency in an Organic Light Emitting Device", J. Appl. Phys. (Journal of Applied Physics) , Nov. 15, 2001, vol. 90, No. 10, pp. 5048-5051.

Markham.J et al., "High-efficiency green phosphorescence from spin-coated single-layer dendrimer light-emitting diodes", Appl. Phys. Lett. (Applied Physics Letters) , Apr. 15, 2002, vol. 80, No. 15, pp. 2645-2647.

(56) References Cited

OTHER PUBLICATIONS

Fujita.M et al., "Reduction of operating voltage in organic light-emitting diode by corrugated photonic crystal structure", Appl. Phys. Lett. (Applied Physics Letters) , Dec. 6, 2004, vol. 85, No. 23, pp. 5769-5771.
Baldo.M et al., "Prospects for Electrically Pumped Organic Lasers", Phys. Rev. B (Physical Review. B), Jul. 19, 2002, vol. 66, pp. 035321-1-035321-16.
Gu.G et al., "Transparent Organic Light Emitting Devices", Appl. Phys. Lett. (Applied Physics Letters) , May 6, 1996, vol. 68, No. 19, pp. 2606-2608.
Baldo.M et al., "Highly Efficient Phosphorescent Emission From Organic Electroluminescent Devices", Nature, Sep. 10, 1998, vol. 395, pp. 151-154.
King.K et al., "Excited-state properties of a triply ortho-metalated iridium(III) complex", J. Am. Chem. Soc. (Journal of the American Chemical Society), Mar. 1, 1985, vol. 107, No. 5, pp. 1431-1432, ACS(American Chemical Society).
Hino.Y et al., "Red Phosphorescent Organic Light-Emitting Diodes Using Mixture System of Small-Molecule and Polymer Host", Jpn. J. Appl. Phys. (Japanese Journal of Applied Physics) , Apr. 21, 2005, vol. 44, No. 4B, pp. 2790-2794, The Japan Society of Applied Physics.
Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.
Chinese Office Action (Application No. 201310345426.6) Dated Mar. 14, 2016.
Yersin.H et al., Highly Efficient OLEDs with Phosphorescent Materials, 2008, pp. 1-97,283-309, Wiley-VCH Verlag Gmbh & Co.
Tokito.S et al., "Improvement in performance by doping", Organic EL Display, Aug. 20, 2004, pp. 67-99, Ohmsha.
Jeon.W et al., "Ideal host and guest system in phosphorescent OLEDs", Organic Electronics, 2009, vol. 10, pp. 240-246, Elsevier.
Su.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.
Rausch.A et al., "Matrix Effects on the Triplet State of the OLED Emitter Ir(4,6-dFppy)2(pic)(Flrpic): Investigations by High-Resolution Optical Spectroscopy", Inorg. Chem. (Inorganic Chemistry), 2009, vol. 48, No. 5, pp. 1928-1937.
Gong.X et al., "Phosphorescence from iridium complexes doped into polymer blends", J. Appl. Phys. (Journal of Applied Physics) , Feb. 1, 2004, vol. 95, No. 3, pp. 948-953.
Zhao.Q et al., "Synthesis and Photophysical, Electrochemical, and Electrophosphorescent Properties of a Series of Iridium(III) Complexes Based on Quinoline Derivatives and Different β-Diketonate Ligands", Organometallics, Jun. 14, 2006, vol. 25, No. 15, pp. 3631-3638.
Chen.F et al., "Triplet Exciton Confinement in Phosphorescent Polymer Light-Emitting Diodes", Appl. Phys. Lett. (Applied Physics Letters) , Feb. 17, 2003, vol. 82, No. 7, pp. 1006-1008.
Lee.J et al., "Stabilizing the efficiency of phosphorescent organic light-emitting diodes", SPIE Newsroom, Apr. 21, 2008, pp. 1-3.
Tokito.S et al., "Confinement of Triplet Energy on Phosphorescent Molecules for Highly-Efficient Organic Blue-Light-Emitting Devices", Appl. Phys. Lett. (Applied Physics Letters) , Jul. 21, 2003, vol. 83, No. 3, pp. 569-571.
Endo.A et al., "Efficient Up-Conversion of Triplet Excitons Into a Singlet State and Its Application for Organic Light Emitting Diodes", Appl. Phys. Lett. (Applied Physics Letters) , Feb. 24, 2011, vol. 98, No. 8, pp. 083302-1-083302-3.
Park.Y et al., "Efficient triplet harvesting by fluorescent molecules through exciplexes for high efficiency organic light-emitting diodes", Appl. Phys. Lett. (Applied Physics Letters) , Apr. 18, 2013, vol. 102, No. 15, pp. 153306-1-153306-5.
Chinese Office Action (Application No. 201710477473.4) Dated Aug. 28, 2018.
Lamansky.S et al., "Highly Phosphorescent Bis-Cyclometalated Iridium Complexes: Synthesis, Photophysical Characterization, and Use in Organic Light Emitting Diodes", J. Am. Chem. Soc. (Journal of the American Chemical Society), Apr. 13, 2001, vol. 123, No. 18, pp. 4304-4312.
Williams.J et al., "Light-emitting iridium complexes with tridentate ligands", Dalton Transactions, Feb. 19, 2008, No. 16, pp. 2081-2099.
Tokito.S et al., Organic EL Display, Aug. 20, 2004, pp. 4-186, Ohmsha.

LIGHT-EMITTING ELEMENT, LIGHT-EMITTING DEVICE, DISPLAY DEVICE, ELECTRONIC DEVICE, AND LIGHTING DEVICE

This application is a continuation of U.S. application Ser. No. 18/213,584 filed on Jun. 23, 2023 which is a continuation of U.S. application Ser. No. 17/326,732 filed on May 21, 2021 (now U.S. Pat. No. 11,690,239 issued Jun. 27, 2023) which is a continuation of U.S. application Ser. No. 16/879,023 filed on May 20, 2020 (now U.S. Pat. No. 11,018,313 issued May 25, 2021) which is a continuation of U.S. application Ser. No. 16/178,875, filed on Nov. 2, 2018 (now U.S. Pat. No. 10,665,808 issued May 26, 2020) which is a continuation of U.S. application Ser. No. 15/418,185, filed on Jan. 27, 2017 (now U.S. Pat. No. 10,121,984 issued Nov. 6, 2018) which is a continuation of U.S. application Ser. No. 14/858,343, filed on Sep. 18, 2015 (now U.S. Pat. No. 9,559,324 issued Jan. 31, 2017) which is a continuation of U.S. application Ser. No. 13/961,293, filed on Aug. 7, 2013 (now U.S. Pat. No. 9,142,710 issued Sep. 22, 2015), which are all incorporated herein by reference.

BACKGROUND OF THE INVENTION

1. Field of the Invention

The present invention relates to a light-emitting element, a display device, a light-emitting device, an electronic device, and a lighting device each of which includes an organic compound as a light-emitting substance.

2. Description of the Related Art

In recent years, research and development have been extensively conducted on light-emitting elements using electroluminescence (EL). In a basic structure of such a light-emitting element, a layer containing a light-emitting substance (an EL layer) is interposed between a pair of electrodes. By applying voltage to this element, light emission from the light-emitting substance can be obtained.

Since such a light-emitting element is of self-light-emitting type, the light-emitting element has advantages over a liquid crystal display in that visibility of pixels is high, a backlight is not required, and so on and is therefore thought to be suitable as flat panel display elements. In addition, it is also a great advantage that a display including such a light-emitting element can be manufactured as a thin and lightweight display. Furthermore, very high speed response is also one of the features of such an element.

Since a light-emitting layer of such a light-emitting element can be formed in the form of a film, planar light emission can be achieved. Therefore, large-area elements can be easily formed. This feature is difficult to obtain with point light sources typified by incandescent lamps and LEDs or linear light sources typified by fluorescent lamps. Thus, light-emitting elements also have great potential as planar light sources applicable to lighting devices and the like.

In the case of an organic EL element in which an EL layer containing an organic compound as the light-emitting substance is provided between a pair of electrodes, application of a voltage between the pair of electrodes causes injection of electrons from the cathode and holes from the anode into the EL layer having a light-emitting property, and thus a current flows. By recombination of the injected electrons and holes, the organic compound having a light-emitting property is excited and provides light emission from the excited state.

The excited state of an organic compound can be a singlet excited state or a triplet excited state, and light emission from the singlet excited state (S*) is referred to as fluorescence, and light emission from the triplet excited state (T*) is referred to as phosphorescence. The statistical generation ratio of the excited states in the light-emitting element is considered to be S*:T*=1:3.

In a compound that emits light from the singlet excited state (hereinafter, referred to as a fluorescent compound), at room temperature, generally light emission from the triplet excited state (phosphorescence) is not observed while only light emission from the singlet excited state (fluorescence) is observed. Therefore, the internal quantum efficiency (the ratio of generated photons to injected carriers) of a light-emitting element using a fluorescent compound is assumed to have a theoretical limit of 25% based on the ratio of S* to T* which is 1:3.

In contrast, in a compound that emits light from the triplet excited state (hereinafter, referred to as a phosphorescent compound), light emission from the triplet excited state (phosphorescence) is observed. Further, in a phosphorescent compound, since intersystem crossing (i.e., transfer from a singlet excited state to a triplet excited state) easily occurs, the internal quantum efficiency can be increased to 100% in theory. That is, higher emission efficiency can be achieved than using a fluorescent compound. For this reason, light-emitting elements using phosphorescent compounds are now under active development in order to obtain highly efficient light-emitting elements.

A white light-emitting element disclosed in Patent Document 1 includes a light-emitting region containing a plurality of kinds of light-emitting dopants which emit phosphorescence.

REFERENCE

Patent Document

[Patent Document 1] Japanese Translation of PCT International Application No. 2004-522276

SUMMARY OF THE INVENTION

Although an internal quantum efficiency of 100% in a phosphorescent compound is theoretically possible, such high efficiency can be hardly achieved without optimization of an element structure or a combination with another material. Especially in a light-emitting element which includes a plurality of kinds of phosphorescent compounds having different bands (different emission colors) as light-emitting dopants, it is difficult to obtain highly efficient light emission without not only considering energy transfer but also optimizing the efficiency of the energy transfer. In fact, in Patent Document 1, even when all the light-emitting dopants of a light-emitting element are phosphorescent compounds, the external quantum efficiency is approximately 3% to 4%. It is thus presumed that even when light extraction efficiency is taken into account, the internal quantum efficiency is 20% or lower, which is low for a phosphorescent light-emitting element.

In a multicolor light-emitting element using dopants exhibiting different emission colors, beside improvement of emission efficiency, it is also necessary to attain a good balance between light emissions by the dopants which exhibit different emission colors. It is not easy to keep a balance between light emissions by the dopants and to achieve high emission efficiency at the same time.

In view of the above, an object of one embodiment of the present invention is to provide a light-emitting element which uses a plurality of kinds of light-emitting dopants emitting light in a balanced manner and has high emission efficiency. Another object of one embodiment of the present invention is to provide a light-emitting device, a display device, an electronic device, and a lighting device each having reduced power consumption by using the above light-emitting element.

It is only necessary that at least one of the above-described objects be achieved in the present invention.

According to the present invention, a light-emitting element which includes a plurality of light-emitting layers including different phosphorescent materials is provided. The light-emitting layer of the plurality of light-emitting layers which includes a light-emitting material emitting light with a long wavelength includes two kinds of carrier-transport compounds having properties of transporting carriers with different polarities. Further, the light-emitting layer of the plurality of light-emitting layers which includes a light-emitting material emitting light with a short wavelength includes a host material, and the triplet excitation energy of the host material is higher than the triplet excitation energy of at least one of the carrier-transport compounds. By such a combination of a host material and a carrier-transport compound with which energy can be transferred efficiently between hosts, a light-emitting element of one embodiment of the present invention can be provided.

That is, one embodiment of the present invention is a light-emitting element including: a first light-emitting layer including a first phosphorescent compound and a first host material, between an anode and a cathode; and a second light-emitting layer including a second phosphorescent compound, a first electron-transport compound, and a first hole-transport compound, between the anode and the cathode. An emission wavelength of the second phosphorescent compound is longer than an emission wavelength of the first phosphorescent compound. A triplet excitation energy of the first host material is higher than or equal to a triplet excitation energy of the first electron-transport compound or the first hole-transport compound. The first light-emitting layer and the second light-emitting layer are in contact with each other.

Another embodiment of the present invention is the light-emitting element in which the first electron-transport compound and the first hole-transport compound form an exciplex.

Another embodiment of the present invention is the light-emitting element in which the first host material is an electron-transport compound, and in which the first light-emitting layer is closer to the cathode than the second light-emitting layer.

Another embodiment of the present invention is the light-emitting element in which the first host material is a hole-transport compound, and in which the first light-emitting layer is closer to the anode than the second light-emitting layer.

Another embodiment of the present invention is the light-emitting element in which the first light-emitting layer further includes a second host material, in which the second host material is a hole-transport compound, and in which a triplet excitation energy of the second host material is higher than or equal to the triplet excitation energy of the first electron-transport compound or the first hole-transport compound.

Another embodiment of the present invention is the light-emitting element in which the first light-emitting layer further includes a second host material, in which the second host material is an electron-transport compound, and in which a triplet excitation energy of the second host material is higher than or equal to the triplet excitation energy of the first electron-transport compound or the first hole-transport compound.

Another embodiment of the present invention is the light-emitting element in which the first host material and the second host material form an exciplex.

Another embodiment of the present invention is a light-emitting element including: a first light-emitting layer including a first phosphorescent compound and a first host material, between an anode and a cathode; a second light-emitting layer including a second phosphorescent compound, a first electron-transport compound, and a first hole-transport compound, between the anode and the cathode; and a third light-emitting layer including a third phosphorescent compound, a second electron-transport compound, and a second hole-transport compound, between the anode and the cathode. An emission wavelength of the second phosphorescent compound is longer than an emission wavelength of the first phosphorescent compound. An emission wavelength of the third phosphorescent compound is longer than the emission wavelength of the second phosphorescent compound. A triplet excitation energy of the first host material is higher than or equal to a triplet excitation energy of the first electron-transport compound or the first hole-transport compound. The second light-emitting layer is in contact with the first light-emitting layer, and the third light-emitting layer is in contact with the second light-emitting layer.

Another embodiment of the present invention is a light-emitting element including: a first light-emitting layer including a first phosphorescent compound and a first host material, between an anode and a cathode; a second light-emitting layer including a second phosphorescent compound, a first electron-transport compound, and a first hole-transport compound, between the anode and the cathode; and a third light-emitting layer including a third phosphorescent compound, a second electron-transport compound, and a second hole-transport compound, between the anode and the cathode. An emission wavelength of the second phosphorescent compound is longer than an emission wavelength of the first phosphorescent compound. An emission wavelength of the third phosphorescent compound is longer than the emission wavelength of the second phosphorescent compound. A triplet excitation energy of the first host material is higher than or equal to a triplet excitation energy of the first electron-transport compound or the first hole-transport compound. The triplet excitation energies of the first electron-transport compound and the first hole-transport compound are higher than a triplet excitation energy of the second electron-transport compound or the second hole-transport compound. The second light-emitting layer is in contact with the first light-emitting layer, and the third light-emitting layer is in contact with the second light-emitting layer.

Another embodiment of the present invention is the light-emitting element in which the first electron-transport compound and the first hole-transport compound form an exciplex, and in which the second electron-transport compound and the second hole-transport compound form an exciplex.

Another embodiment of the present invention is the light-emitting element in which the first host material is an electron-transport compound, and in which the first light-emitting layer is closer to the cathode than the second light-emitting layer.

Another embodiment of the present invention is the light-emitting element in which the first host material is a hole-transport compound, and in which the first light-emitting layer is closer to the anode than the second light-emitting layer.

Another embodiment of the present invention is the light-emitting element in which the first light-emitting layer further includes a second host material, in which the second host material is a hole-transport compound, and in which a triplet excitation energy of the second host material is higher than or equal to the triplet excitation energy of the first electron-transport compound or the first hole-transport compound.

Another embodiment of the present invention is the light-emitting element in which the first light-emitting layer further includes a second host material, in which the second host material is an electron-transport compound, and in which a triplet excitation energy of the second host material is higher than or equal to the triplet excitation energy of the first electron-transport compound or the first hole-transport compound.

Another embodiment of the present invention is the light-emitting element in which the first host material and the second host material form an exciplex.

Another embodiment of the present invention is the light-emitting element in which the first electron-transport compound and the second electron-transport compound are the same material.

Another embodiment of the present invention is the light-emitting element in which the first hole-transport compound and the second hole-transport compound are the same material.

Another embodiment of the present invention is the light-emitting element in which the first electron-transport compound and the second electron-transport compound are the same material, and in which the first hole-transport compound and the second hole-transport compound are the same material.

Another embodiment of the present invention is the light-emitting element in which a thickness of the second light-emitting layer is greater than or equal to 2 nm and less than or equal to 20 nm.

Another embodiment of the present invention is the light-emitting element in which the thickness of the second light-emitting layer is greater than or equal to 5 nm and less than or equal to 10 nm.

Another embodiment of the present invention is a light-emitting device, a light-emitting display device, an electronic device, and a lighting device each including the light-emitting element.

Note that the light-emitting device in this specification includes, in its category, an image display device with a light-emitting element. Further, the category of the light-emitting device in this specification includes a module in which a light-emitting device is provided with a connector such as an anisotropic conductive film or a TCP (tape carrier package); a module in which the end of the TCP is provided with a printed wiring board; and a module in which an IC (integrated circuit) is directly mounted on a light-emitting device by a COG (chip on glass) method. Furthermore, the category includes light-emitting devices that are used in lighting equipment or the like.

One embodiment of the present invention can provide a light-emitting element having high emission efficiency. By using the light-emitting element, another embodiment of the present invention can provide any of a light-emitting device, a light-emitting display device, an electronic device, and a lighting device each having reduced power consumption.

BRIEF DESCRIPTION OF THE DRAWINGS

FIGS. 8A, 8B1, 8B2, 8C, and 8D illustrate electronic devices.

DETAILED DESCRIPTION OF THE INVENTION

Figure 1A:
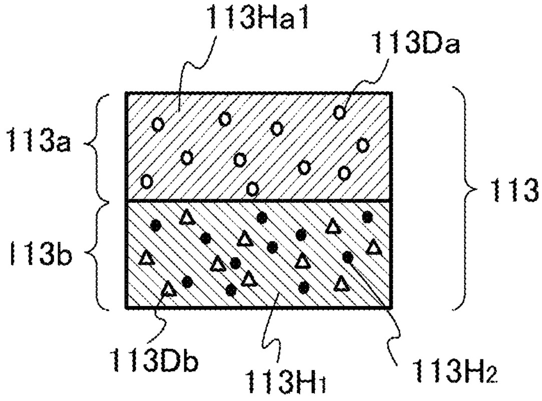
FIGS. 1A, 1B, 1C, 1D, and 1E are schematic diagrams of light-emitting elements.

Hereinafter, embodiments and examples of the present invention will be described in detail with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments and examples.

Embodiment 1

First, the operation principle of a light-emitting element of one embodiment of the present invention will be described. The point of the present invention is that a first phosphorescent compound and a second phosphorescent compound emitting light whose wavelength is longer than that of light emitted from the first phosphorescent compound are used and both of the first and second phosphorescent compounds are made to emit light efficiently, whereby a multicolor light-emitting element with high efficiency is obtained.

As a general method for obtaining a multicolor light-emitting element including a phosphorescent compound, a method can be given in which a plurality of kinds of phosphorescent compounds having different emission colors are dispersed in some host material in an appropriate ratio. However, in such a method, the phosphorescent compound which emits light with the longest wavelength readily emits light, so that it is extremely difficult to design and control an element structure (especially the concentrations of the phosphorescent compounds in the host material) for obtaining polychromatic light.

As another technique for obtaining a multicolor light-emitting element, what is called a tandem structure, in which light-emitting elements having different emission colors are stacked in series, can be given. For example, a blue light-emitting element, a green light-emitting element, and a red light-emitting element are stacked in series and made to emit light at the same time, whereby polychromatic light (in this case, white light) can be easily obtained. The element structure can be relatively easily designed and controlled because the blue light-emitting element, the green light-emitting element, and the red light-emitting element can be independently optimized. However, the stacking of three elements is accompanied by an increase in the number of layers and makes the fabrication complicated. In addition, when a problem occurs in electrical contact at connection portions between the elements (what is called intermediate layers), an increase in drive voltage, i.e., power loss might be caused.

In contrast, in a light-emitting element of one embodiment of the present invention, a first light-emitting layer and a second light-emitting layer are stacked between a pair of electrodes. The first light-emitting layer includes a first phosphorescent compound and a first host material. The second light-emitting layer includes a second phosphorescent compound emitting light whose wavelength is longer than that of the first phosphorescent compound, a first electron-transport compound, and a first hole-transport compound. Here, the triplet excitation energy of the first host material is higher than that of the first electron-transport compound or the first hole-transport compound, and the first light-emitting layer and the second light-emitting layer are provided in contact with each other unlike in a tandem structure.

Figure 1B:
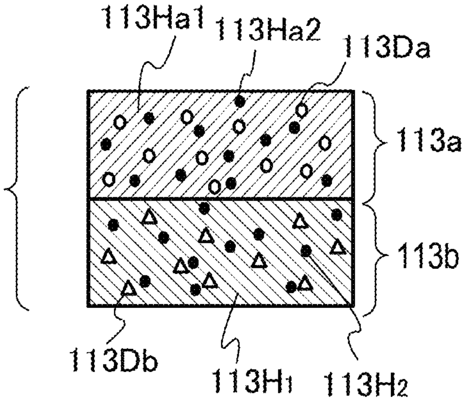
Figure 1C:
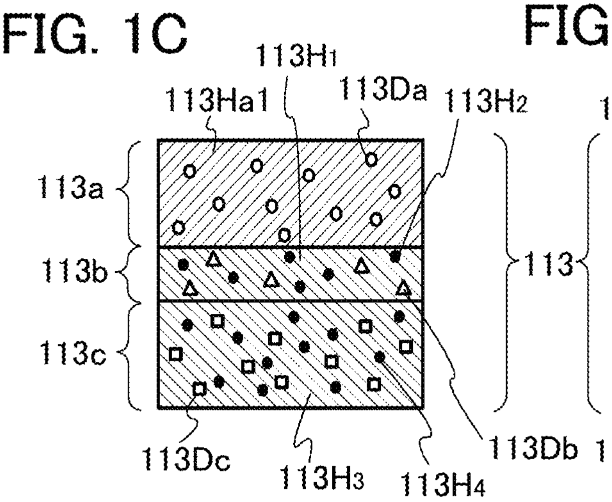
Figure 1D:
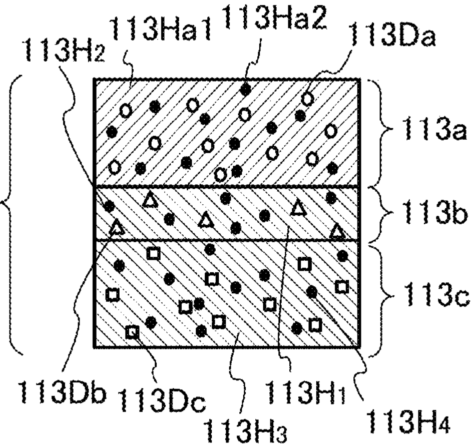
Figure 1E:
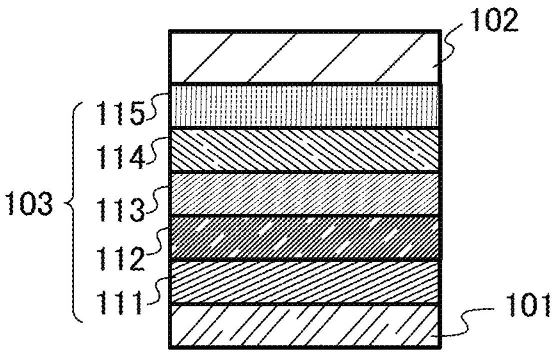

FIG. 1E schematically illustrates the element structure of the light-emitting element of one embodiment of the present invention. In FIG. 1E, a first electrode 101, a second electrode 102, and an EL layer 103 are illustrated. The EL layer 103 includes at least a light-emitting layer 113 and other layers may be provided as appropriate. In the structure illustrated in FIG. 1E, a hole-injection layer 111, a hole-transport layer 112, an electron-transport layer 114, and an electron-injection layer 115 are assumed to be provided. Note that it is assumed that the first electrode 101 functions as an anode and the second electrode 102 functions as a cathode.

FIGS. 1A and 1B are each an enlarged view of the light-emitting layer 113 in the light-emitting element. In each of FIGS. 1A and 1B, a first light-emitting layer 113*a*, a second light-emitting layer 113*b*, the light-emitting layer 113 which is a combination of the two layers, a first phosphorescent compound 113Da, a second phosphorescent compound 113Db, a first host material 113Ha1, a first carrier-transport compound 113H1, and a second carrier-transport compound 113H2 are illustrated. FIG. 1B is a schematic diagram illustrating the case where the first light-emitting layer 113*a* further includes a second host material 113Ha2. Note that the first host material 113Ha1 and the first carrier-transport compound 113H1 may be the same or different from each other; and the second host material 113Ha2 and the second carrier-transport compound 113H2 may be the same or different from each other. The first light-emitting layer 113*a* may be on the anode side and the second light-emitting layer 113*b* may be on the cathode side, or the first light-emitting layer 113*a* may be on the cathode side and the second light-emitting layer 113*b* may be on the anode side. Note that one of the first host material 113Ha1 and the second host material 113Ha2 is an electron-transport compound, and the other of them is a hole-transport compound. Similarly, one of the first carrier-transport compound 113H1 and the second carrier-transport compound 113H2 is an electron-transport compound, and the other of them is a hole-transport compound.

The position of a recombination region in the light-emitting layer can be adjusted with the mixture ratio of the first host material 113Ha1 to the second host material 113Ha2, the first carrier-transport compound 113H1, and the second carrier-transport compound 113H2 which are included in the light-emitting layers. As described above, one of the first host material 113Ha1 and the second host material 113Ha2 is an electron-transport compound, and the other of them is a hole-transport compound; and one of the first carrier-transport compound 113H1 and the second carrier-transport compound 113H2 is an electron-transport compound, and the other of them is a hole-transport compound. For such a reason, changing the mixture ratio thereof can adjust the carrier-transport property of each light-emitting layer, and accordingly can easily control the position of the recombination region.

Note that light emission from the first phosphorescent compound 113Da is difficult to obtain in the case where an exciton is directly generated in the second light-emitting layer 113*b*; therefore, the carrier recombination region is preferably in the first light-emitting layer 113*a* or in the vicinity of the interface between the first light-emitting layer 113*a* and the second light-emitting layer 113*b*.

In order that the carrier recombination region is in the vicinity of the interface between the first light-emitting layer 113*a* and the second light-emitting layer 113*b*, the first light-emitting layer 113*a* is made to have a hole-transport property in the case where the first light-emitting layer 113*a* is on the anode side, or is made to have an electron-transport property in the case where the first light-emitting layer 113*a* is on the cathode side. Further, the second light-emitting layer 113*b* is made to have an opposite carrier-transport property to that of the first light-emitting layer 113*a*; thus, the recombination region can be made in the vicinity of the interface between the first light-emitting layer 113*a* and the second light-emitting layer 113*b*. In order that the carrier recombination region is in the first light-emitting layer 113*a*, the bipolar property of the first light-emitting layer 113*a* is improved with the above structure as a base.

In the case of the structure illustrated in FIG. 1A, the first host material 113Ha1 is made to have a hole-transport property in the case where the first light-emitting layer 113*a* is on the anode side, or is made to have an electron-transport property in the case where the first light-emitting layer 113*a* is on the cathode side; the second light-emitting layer 113*b* is made to have an opposite carrier-transport property to that of the first light-emitting layer 113*a* by changing the mixture ratio of the first carrier-transport compound 113H1 to the second carrier-transport compound 113H2.

In the case of a combination of the second light-emitting layer 113*b* and the first light-emitting layer 113*a* illustrated in FIG. 1C, the carrier-transport properties of the first light-emitting layer 113*a* and the second light-emitting layer 113*b* can be adjusted by changing the mixture ratio of the electron-transport compound to the hole-transport compound in each of the light-emitting layers.

Note that when the recombination region is in the first light-emitting layer 113*a* or at the interface between the first light-emitting layer and the second light-emitting layer, the intensity of light emission from the second phosphorescent compound 113Db is lower than that of light emission from the second phosphorescent compound 113Da in some cases. In view of this, in one embodiment of the present invention, a combination of materials is selected such that the triplet excitation energy of the first host material 113Ha1 is higher than that of the first carrier-transport compound 113H1 and/or that of the second carrier-transport compound 113H2 in the case of the structure illustrated in FIG. 1A. The triplet excitation energy due to recombination of carriers partly moves from the triplet excitation level of the first host material 113Ha1 to that of the first carrier-transport compound 113H1 and/or that of the second carrier-transport compound 113H2; in this manner, the second phosphorescent compound 113Db can emit light.

In the case where the first light-emitting layer 113*a* further includes the second host material 113Ha2 as illustrated in FIG. 1B, a combination of materials is selected such that the triplet excitation energy of the second host material 113Ha2 is higher than that of the first carrier-transport compound 113H1 and/or that of the second carrier-transport compound 113H2. The triplet excitation energy due to recombination of carriers partly moves from the triplet excitation level of the second host material 113Ha2 to that of the first carrier-transport compound 113H1 and/or that of the second carrier-transport compound 113H2; in this manner, the second phosphorescent compound 113Db can emit light.

In this manner, the transfer of triplet excitation energy which accounts for 75% of the excitation energy generated by recombination of carriers is taken into consideration; thus, light emission from the second phosphorescent compound 113Db can be obtained with desired intensity.

In the case where the singlet excitation energy of the first host material 113Ha1 or the second host material 113Ha2 is higher than the single excitation energies of the first carrier-transport compound 113H1 and the second carrier-transport compound 113H2, energy transfer occurs due to Dexter mechanism. Here, when the first host material 113Ha1 or the second host material 113Ha2 is a fluorescent light-emitting material, energy transfer occurs also owing to Förster mechanism.

Here, energy transfer to the phosphorescent compound for obtaining a light-emitting element having higher emission efficiency will be described. In the following description, a substance providing a phosphorescent compound with energy is referred to as a host material.

Carrier recombination occurs in both the host material and the phosphorescent compound; thus, efficient energy transfer from the host material to the phosphorescent compound is needed to increase emission efficiency. As mechanisms of the energy transfer from the host material to the phosphorescent compound, two mechanisms have been proposed: one is Dexter mechanism, and the other is Förster mechanism.

The efficiency of energy transfer from a host molecule to a guest molecule (energy transfer efficiency $\Phi_{ET}$) is expressed by the following formula. In the formula, $k_r$ denotes the rate constant of a light-emission process (fluorescence in energy transfer from a singlet excited state, and phosphorescence in energy transfer from a triplet excited state), $k_n$ denotes the rate constant of a non-light-emission process (thermal deactivation or intersystem crossing), and $\tau$ denotes the measured lifetime of an excited state.

$$\Phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad \text{[Formula 1]}$$

First, according to the above formula, it is understood that the energy transfer efficiency $\Phi_{ET}$ can be increased by significantly increasing the rate constant $k_{h^* \to g}$ of energy transfer as compared with another competing rate constant $k_r + k_n (=1/\tau)$. Then, in order to increase the rate constant $k_{h^* \to g}$ of energy transfer, in Förster mechanism and Dexter mechanism, it is preferable that an emission spectrum of a host molecule (a fluorescent spectrum in energy transfer from a singlet excited state, and a phosphorescent spectrum in energy transfer from a triplet excited state) largely overlap with an absorption spectrum of a guest molecule (the phosphorescent compound in the second light-emitting layer).

Here, the absorption band on the longest wavelength side (lowest energy side) in the absorption spectrum of the phosphorescent compound is of importance in considering the overlap between the emission spectrum of the host molecule and the absorption spectrum of the phosphorescent compound.

In an absorption spectrum of the phosphorescent compound, an absorption band that is considered to contribute to light emission most greatly is at an absorption wavelength corresponding to direct transition from a ground state to a triplet excitation state and a vicinity of the absorption wavelength, which is on the longest wavelength side. From these considerations, it is preferable that the emission spectrum (a fluorescent spectrum and a phosphorescent spectrum) of the host material overlap with the absorption band on the longest wavelength side in the absorption spectrum of the phosphorescent compound.

For example, most organometallic complexes, especially light-emitting iridium complexes, have a broad absorption band at around 500 nm to 600 nm as the absorption band on the longest wavelength side. This absorption band is mainly based on a triplet MLCT (metal to ligand charge transfer) transition. Note that it is considered that the absorption band also includes absorptions based on a triplet π-π* transition and a singlet MLCT transition, and that these absorptions overlap with each other to form a broad absorption band on the longest wavelength side in the absorption spectrum. Therefore, when an organometallic complex (especially iridium complex) is used as the guest material, it is preferable to make the broad absorption band on the longest wavelength side largely overlap with the emission spectrum of the host material as described above.

Here, first, energy transfer from a host material in a triplet excited state will be considered. From the above-described discussion, it is preferable that, in energy transfer from a triplet excited state, the phosphorescent spectrum of the host material and the absorption band on the longest wavelength side of the phosphorescent compound largely overlap with each other.

However, a question here is energy transfer from the host molecule in the singlet excited state. In order to efficiently perform not only energy transfer from the triplet excited state but also energy transfer from the singlet excited state, it is clear from the above-described discussion that the host material needs to be designed such that not only its phosphorescent spectrum but also its fluorescent spectrum overlaps with the absorption band on the longest wavelength side of the guest material. In other words, unless the host material is designed so as to have its fluorescent spectrum in a position similar to that of its phosphorescent spectrum, it is not possible to achieve efficient energy transfer from the host material in both the singlet excited state and the triplet excited state.

However, in general, the singlet excitation level differs greatly from the triplet excitation level (singlet excitation level>triplet excitation level); therefore, the fluorescence wavelength also differs greatly from the phosphorescence wavelength (fluorescence wavelength<phosphorescence wavelength). For example, 4,4'-di(N-carbazolyl) biphenyl (abbreviation: CBP), which is commonly used in a light-emitting element including a phosphorescent compound, has a phosphorescent spectrum at around 500 nm and has a fluorescent spectrum at around 400 nm, which are largely different by about 100 nm. This example also shows that it is extremely difficult to design a host material so as to have its fluorescent spectrum in a position similar to that of its phosphorescent spectrum.

The singlet excitation energy level of one substance is higher than the triplet excitation energy level thereof, and thus the triplet excitation level of a host material whose fluorescence spectrum corresponds to a wavelength close to an absorption spectrum of a guest material on the longest wavelength side is lower than the triplet excitation level of the guest material.

Here, an exciplex formed from two kinds of materials is described. Fluorescence from the exciplex is derived from the energy difference between the higher HOMO level of one of the two kinds of materials and the lower LUMO level of the other material; thus, the fluorescence spectrum of the exciplex is on the longer wavelength side than that of either one of the two kinds of materials. For such a reason, energy transfer from a single excited state can be maximized while the triplet excitation levels of the two kinds of compounds forming the exciplex are kept higher than the triplet excitation level of the guest material.

In addition, the exciplex is in a state where the triplet excitation level and the singlet excitation level are close to each other; therefore, the fluorescence spectrum and the phosphorescence spectrum exist at substantially the same position. Accordingly, both the fluorescence spectrum and the phosphorescence spectrum of the exciplex can overlap largely with an absorption corresponding to transition of the guest molecule from the singlet ground state to the triplet excited state (a broad absorption band of the guest molecule existing on the longest wavelength side in the absorption spectrum), and thus a light-emitting element having high energy transfer efficiency can be obtained.

In this manner, as a combination of the first carrier-transport compound 113H1 and the second carrier-transport compound 113H2 in the second light-emitting layer, the one with which an exciplex is formed is preferable. Further, when the absorption band of the second phosphorescent compound 113Db on the lowest energy side and the emission spectrum of the exciplex overlap with each other, the emission efficiency of the light-emitting element can be higher. It is preferable that the difference in equivalent energy value between a peak wavelength in the absorption band of the second phosphorescent compound 113Db on the lowest energy side and a peak wavelength of the emission spectrum of the exciplex be 0.2 eV or less in order that the spectra largely overlap with each other.

In the case of the structure illustrated in FIG. 1B, as a combination of the first host material 113Ha1 and the second host material 113Ha2, the one with which an exciplex is formed is preferable. Further, when the absorption band of the first phosphorescent compound on the lowest energy side and the emission spectrum of the exciplex overlap with each other, the emission efficiency of the light-emitting element can be higher. It is preferable that the difference in equivalent energy value between a peak wavelength in the absorption band of the first phosphorescent compound 113Da on the lowest energy side and a peak wavelength of the emission spectrum of the exciplex be 0.2 eV or less in order that the spectra largely overlap with each other.

Light emission from the exciplex is, as described above, derived from the energy difference between the higher HOMO level of one of the two kinds of materials forming the exciplex and the lower LUMO level of the other material. For such a reason, with the use of the exciplex as a host, a change in the combination of materials can change the emission spectrum; thus, the emission spectrum can be easily adjusted to overlap with the absorption of the phosphorescent compound on the long wavelength side.

Further, the first host material 113Ha1 and the second host material 113Ha2 preferably have higher triplet excitation energy than the first phosphorescent compound 113Da in order that light emission from the first phosphorescent compound 113Da is not quenched. Furthermore, the first carrier-transport compound 113H1 and the second carrier-transport compound 113H2 preferably have higher triplet excitation energy than the second phosphorescent compound 113Db in order that light emission from the second phosphorescent compound 113Db is not quenched.

A light-emitting element having the above structure can have high emission efficiency. Further, light emission from phosphorescent compounds in the light-emitting element can be provided in a balanced manner.

The following compounds are examples of an electron-transport compound and a hole-transport compound that can be used for the first host material 113Ha1, the second host material 113Ha2, the first carrier-transport compound 113H1, and the second carrier-transport compound 113H2. Note that one of the first host material 113Ha1 and the second host material 113Ha2 is an electron-transport compound, and the other of them is a hole-transport compound. Similarly, one of the first carrier-transport compound 113H1 and the second carrier-transport compound 113H2 is an electron-transport compound, and the other of them is a hole-transport compound. As combinations thereof, the ones with which exciplexes are formed are preferable.

The following are examples of the electron-transport compound: a metal complex such as bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); a heterocyclic compound having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); and a heterocyclic compound having a pyridine skeleton such as 3,5-bis[3-(9H-carbazol-9-yl)phenyl]pyridine (abbreviation: 35DCzPPy) or 1,3,5-tri[(3-pyridyl)phen-3-yl]benzene (abbreviation: TmPyPB). In particular, a π-electron deficient heteroaromatic compound is preferable. Among the above materials, a heterocyclic compound having a diazine skeleton and a heterocyclic compound having a pyridine skeleton have high reliability and are thus preferable. Specifically, a heterocyclic compound having a diazine (pyrimidine or pyrazine) skeleton has a high electron-transport property to contribute to a reduction in drive voltage.

The following are examples of the hole-transport compound: a compound having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4'"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). In particular, a π-electron rich heteroaromatic compound is preferable. Among the above materials, a compound having an aromatic amine skeleton and a compound having a carbazole skeleton are preferable because these compounds are highly reliable and have high hole-transport properties to contribute to a reduction in drive voltage.

Alight-emitting element having the above structure has high emission efficiency. Further, light emission from a plurality of light-emitting substances in the light-emitting element can be obtained. The light-emitting element does not have a tandem structure, and thus its manufacturing process is not complicated and the amount of power loss due to an intermediate layer is small. In addition, the light-emitting element has a high utility value as a white light-emitting element.

As illustrated in FIGS. 1C and 1D, the light-emitting layer 113 may have a three-layer structure of the first light-emitting layer 113*a*, the second light-emitting layer 113*b*, and a third light-emitting layer 113*c*. In this case, the relation between the first light-emitting layer 113*a* and the second light-emitting layer 113*b* is as described above.

The third light-emitting layer 113*c* includes a third phosphorescent compound 113Dc, a third carrier-transport compound $113H_3$, and a fourth carrier-transport compound $113H_4$. The emission wavelength of the third phosphorescent compound 113Dc is longer than that of the second phosphorescent compound 113Db. One of the third carrier-transport compound $113H_3$ and the fourth carrier-transport compound $113H_4$ is an electron-transport compound, and the other of them is a hole-transport compound. As examples of compounds that can be used as the third carrier-transport compound $113H_3$ and the fourth carrier-transport compound $113H_4$, the above compounds that can be used as the first host material 113Ha1, the second host material 113Ha2, the first carrier-transport compound $113H_1$, and the second carrier-transport compound $113H_2$ can be given.

Similarly to the first carrier-transport compound $113H_1$ and the second carrier-transport compound $113H_2$, or the first host material 113Ha1 and the second host material

113Ha2, the third carrier-transport compound 113$H_3$ and the fourth carrier-transport compound 113$H_4$ preferably form an exciplex. Further, the emission spectrum of the exciplex and the absorption band of the third phosphorescent compound 113Dc on the longest wavelength side preferably overlap with each other in order that energy transfer from the exciplex to the third phosphorescent compound 113Dc is optimized. It is preferable that the difference in equivalent energy value between a peak wavelength in the absorption band of the third phosphorescent compound 113Dc on the lowest energy side and a peak wavelength of the emission spectrum of the exciplex be 0.2 eV or less in order that the spectra largely overlap with each other. Further, the third carrier-transport compound 113$H_3$ and the fourth carrier-transport compound 113$H_4$ preferably have higher triplet excitation energy than the third phosphorescent compound 113Dc in order that light emission from the third phosphorescent compound 113Dc is not quenched.

The third light-emitting layer 113*c* emits light in such a manner that recombination energy generated in the recombination region in the first light-emitting layer 113*a* or in the vicinity of the interface between the first light-emitting layer 113*a* and the second light-emitting layer 113*b* is transferred to the third light-emitting layer 113*c* through the second light-emitting layer 113*b*. Therefore, the triplet excitation energies of the first carrier-transport compound 113$H_1$ and the second carrier-transport compound 113$H_2$ are preferably higher than the triplet excitation energy of one of the third carrier-transport compound 113$H_3$ and the fourth carrier-transport compound 113$H_4$.

The third light-emitting layer 113*c* preferably has the same carrier-transport property as the second light-emitting layer 113*b* in order that a recombination region is in the first light-emitting layer 113*a* or in the vicinity of the interface between the first light-emitting layer 113*a* and the second light-emitting layer 113*b*. Further, one of or both the electron-transport compound and the hole-transport compound in the third carrier-transport compound 113$H_3$ and the fourth carrier-transport compound 113$H_4$ may be the same as one of or both the electron-transport compound and the hole-transport compound in the first carrier-transport compound 113$H_1$ and the second carrier-transport compound 113$H_2$. In this case, the materials are used in common between different layers, which is advantageous in cost.

In the light-emitting element in FIG. 1E including the light-emitting layer 113 illustrated in FIG. 1C or 1D, the first light-emitting layer 113*a* may be formed on the anode side or cathode side.

In the case where the first light-emitting layer 113*a* is formed on the anode side, the first light-emitting layer 113*a* is preferably a layer having a hole-transport property and the second light-emitting layer 113*b* and the third light-emitting layer 113*c* are preferably layers each having an electron-transport property. In the first light-emitting layer, the first host material 113Ha1 may have a hole-transport property in the case of the structure illustrated in FIG. 1C. The carrier-transport property of the first light-emitting layer 113*a* can be adjusted by changing the mixture ratio of the first host material 113Ha1 to the second host material 113Ha2 (that is, the electron-transport compound to the hole-transport compound) in the case of the structure illustrated in FIG. 1D. In a similar manner, the second light-emitting layer 113*b* and the third light-emitting layer 113*c* can have desired carrier-transport properties by changing the mixture ratio of the first carrier-transport compound 113$H_1$ to the second carrier-transport compound 113$H_2$, the third carrier-transport compound 113$H_3$, and the fourth carrier-transport compound 113$H_4$.

In the case where the first light-emitting layer 113*a* is formed on the cathode side, the first light-emitting layer 113*a* is preferably a layer having an electron-transport property and the second light-emitting layer 113*b* and the third light-emitting layer 113*c* are preferably layers each having a hole-transport property. In the first light-emitting layer 113*a*, the first host material 113Ha1 may have an electron-transport property in the case of the structure illustrated in FIG. 1C. The carrier-transport property of the first light-emitting layer 113*a* can be adjusted by changing the mixture ratio of the first host material 113Ha1 to the second host material 113Ha2 (that is, the electron-transport compound to the hole-transport compound) in the case of the structure illustrated in FIG. 1D. In a similar manner, the second light-emitting layer 113*b* and the third light-emitting layer 113*c* can have desired carrier-transport properties by changing the mixture ratio of the first carrier-transport compound 113$H_1$ to the second carrier-transport compound 113$H_2$, the third carrier-transport compound 113$H_3$, and the fourth carrier-transport compound 113$H_4$.

Energy is transferred through the second light-emitting layer 113*b*, and thus is not transferred to the third light-emitting layer 113*c* when the thickness of the second light-emitting layer 113*b* is too large; in this case, light emission from the third phosphorescent compound 113Dc cannot be obtained. Therefore, in order that light emission from the third light-emitting layer 113*c* is obtained, the thickness of the second light-emitting layer 113*b* is preferably greater than or equal to 2 nm and less than or equal to 20 nm, more preferably greater than or equal to 5 nm and less than or equal to 10 nm.

In the light-emitting element of this embodiment including the light-emitting layer 113 illustrated in FIG. 1C or 1D, a compound exhibiting blue light emission, a compound exhibiting green light emission, and a compound exhibiting red light emission are used as the first phosphorescent compound 113Da, the second phosphorescent compound 113Db, and the third phosphorescent compound 113Dc, respectively; thus, favorable white light emission (e.g., white light emission that meets the standards defined by Japanese Industrial Standards (JIS)) can be obtained. Such white light emission has an excellent color rendering property. Such a white light-emitting element is significantly suitable for lighting.

A light-emitting element having the above structure includes a plurality of light-emitting substances and has high emission efficiency. Further, light emission from the plurality of light-emitting substances in the light-emitting element can be provided in a balanced manner.

Embodiment 2

In this embodiment, a detailed example of the structure of the light-emitting element described in Embodiment 1 will be described below with reference to FIG. 1E.

A light-emitting element in this embodiment includes, between a pair of electrodes, an EL layer including a plurality of layers. In this embodiment, the light-emitting element includes the first electrode 101, the second electrode 102, and the EL layer 103 which is provided between the first electrode 101 and the second electrode 102. The following description in this embodiment is made on the assumption that the first electrode 101 functions as an anode and the second electrode 102 functions as a cathode. In other words, when a voltage is applied between the first electrode 101 and the second electrode 102 so that the potential of the first electrode 101 is higher than that of the second electrode 102, light emission can be obtained.

Since the first electrode 101 functions as the anode, the first electrode 101 is preferably formed using any of metals, alloys, conductive compounds with a high work function (specifically, a work function of 4.0 eV or more), mixtures thereof, and the like. Specifically, for example, indium oxide-tin oxide (ITO: indium tin oxide), indium oxide-tin oxide containing silicon or silicon oxide, indium oxide-zinc oxide, indium oxide containing tungsten oxide and zinc oxide (IWZO), and the like can be given. Films of these conductive metal oxides are usually formed by a sputtering method but may be formed by application of a sol-gel method or the like. In an example of the formation method, indium oxide-zinc oxide is deposited by a sputtering method using a target obtained by adding 1 wt % to 20 wt % of zinc oxide to indium oxide. Further, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Besides, gold (Au), platinum (Pt), nickel (Ni), tungsten (W), chromium (Cr), molybdenum (Mo), iron (Fe), cobalt (Co), copper (Cu), palladium (Pd), nitrides of metal materials (e.g., titanium nitride), and the like can be given. Graphene can also be used. Note that when a composite material described later is used for a layer which is in contact with the first electrode 101 in the EL layer 103, an electrode material can be selected regardless of its work function.

There is no particular limitation on the stacked-layer structure of the EL layer 103 as long as the light-emitting layer 113 has the structure described in Embodiment 1. For example, the EL layer 103 can be formed by combining a hole-injection layer, a hole-transport layer, the light-emitting layer, an electron-transport layer, an electron-injection layer, a carrier-blocking layer, and the like as appropriate. In this embodiment, the EL layer 103 has a structure in which the hole-injection layer 111, the hole-transport layer 112, the light-emitting layer 113, the electron-transport layer 114, and the electron-injection layer 115 are stacked in this order over the first electrode 101. Specific examples of materials used for each layer are given below.

The hole-injection layer 111 is a layer containing a substance having a high hole-injection property. Molybdenum oxide, vanadium oxide, ruthenium oxide, tungsten oxide, manganese oxide, or the like can be used. Alternatively, the hole-injection layer 111 can be formed using a phthalocyanine-based compound such as phthalocyanine (abbreviation: $H_2Pc$) or copper phthalocyanine (abbreviation: CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD), a high molecular compound such as poly(ethylenedioxythiophene)/poly(styrenesulfonic acid) (abbreviation: PEDOT/PSS), or the like.

Alternatively, a composite material in which a substance having a hole-transport property contains a substance having an acceptor property can be used for the hole-injection layer 111. Note that the use of such a substance having a hole-transport property which contains a substance having an acceptor property enables selection of a material used to form an electrode regardless of its work function. In other words, besides a material having a high work function, a material having a low work function can also be used for the first electrode 101. As the substance having an acceptor property, 7,7,8,8-tetracyano-2,3,5,6-tetrafluoroquinodimethane (abbreviation: $F_4$-TCNQ), chloranil, and the like can be given. In addition, transition metal oxides can be given. Oxides of the metals that belong to Groups 4 to 8 of the periodic table can be given. Specifically, vanadium oxide, niobium oxide, tantalum oxide, chromium oxide, molybdenum oxide, tungsten oxide, manganese oxide, and rhenium oxide are preferable in that their electron-accepting property is high. Among these oxides, molybdenum oxide is particularly preferable in that it is stable in the air, has a low hygroscopic property, and is easy to handle.

As the substance having a hole-transport property which is used for the composite material, any of a variety of organic compounds such as aromatic amine compounds, carbazole derivatives, aromatic hydrocarbons, and high molecular compounds (e.g., oligomers, dendrimers, or polymers) can be used. Note that the organic compound used for the composite material is preferably an organic compound having a high hole-transport property. Specifically, a substance having a hole mobility of $10^{-6}$ $cm^2/Vs$ or more is preferably used. Organic compounds that can be used as the substance having a hole-transport property in the composite material are specifically given below.

Examples of the aromatic amine compounds are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivatives that can be used for the composite material are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivatives that can be used for the composite material are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbons that can be used for the composite material are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, or the like can also be used. The aromatic hydrocarbon which has a hole mobility of $1\times10^{-6}$ $cm^2/Vs$ or more and which has 14 to 42 carbon atoms is particularly preferable.

Note that the aromatic hydrocarbons that can be used for the composite material may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

A polymeric compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: poly-TPD) can also be used.

By providing a hole-injection layer, a high hole-injection property can be achieved to allow a light-emitting element to be driven at a low voltage.

The hole-transport layer 112 is a layer that contains a substance having a hole-transport property. Examples of the substance having a hole-transport property are aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4' -diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), and the like. The substances mentioned here have high hole-transport properties and are mainly ones that have a hole mobility of $10^{-6}$ $cm^2/Vs$ or more. An organic compound given as an example of the substance having a hole-transport property in the composite material described above can also be used for the hole-transport layer 112. A polymeric compound such as poly(N-vinylcarbazole) (abbreviation: PVK) or poly(4-vinyltriphenylamine) (abbreviation: PVTPA) can also be used. Note that the layer that contains a substance having a hole-transport property is not limited to a single layer, and may be a stack of two or more layers including any of the above substances.

The light-emitting layer 113 has the structure described in Embodiment 1. Therefore, the light-emitting element of this embodiment has high emission efficiency, and light emission from a plurality of phosphorescent compounds in the light-emitting element can be provided in a balanced manner. Embodiment 1 is to be referred to for the main structure of the light-emitting layer 113.

There is no particular limitation on materials that can be used as the first to third phosphorescent compounds 113Da to 113Dc in the light-emitting layer 113 as long as they have the relation described in Embodiment 1. The following can be given as examples of the first to third phosphorescent compounds 113Da to 113Dc.

The following are the specific examples: an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: $Ir(mpptz\text{-}dmp)_3$), tris(5-methyl-3,4-diphenyl-4H-1,2,4-triazolato)iridium(III) (abbreviation: $Ir(Mptz)_3$), or tris[4-(3-biphenyl)-5-isopropyl-3-phenyl-4H-1,2,4-triazolato]iridium(III) (abbreviation: $Ir(iPrptz\text{-}3b)_3$); an organometallic iridium complex having a 1H-triazole skeleton, such as tris[3-methyl-1-(2-methylphenyl)-5-phenyl-1H-1,2,4-triazolato]iridium(III) (abbreviation: $Ir(Mptz1\text{-}mp)_3$) or tris(1-methyl-5-phenyl-3-propyl-1H-1,2,4-triazolato)iridium(III) (abbreviation: $Ir(Prptz1\text{-}Me)_3$); an organometallic iridium complex having an imidazole skeleton, such as fac-tris[1-(2,6-diisopropylphenyl)-2-phenyl-1H-imidazole]iridium(III) (abbreviation: $Ir(iPrpmi)_3$), or tris[3-(2,6-dimethylphenyl)-7-methylimidazo[1,2-f]phenanthridinato]iridium(III) (abbreviation: $Ir(dmpimpt\text{-}Me)_3$); and an organometallic iridium complex in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis[2-(3',5'-bistrifluoromethylphenyl)pyridinato-N,$C^{2'}$]iridium(III)picolinate (abbreviation: $Ir(CF_3ppy)_2(pic)$), or bis[2-(4',6'-difluorophenyl)pyridinato-N,$C^{2'}$]iridium(III) acetylacetonate (abbreviation: FIracac). These are compounds emitting blue phosphorescence and have an emission peak at 440 nm to 520 nm. Among the above compounds, an organometallic iridium complex having a polyazole skeleton such as a 4H-triazole skeleton, a 1H-triazole skeleton, or an imidazole skeleton has a high hole-trapping property. Therefore, it is preferable that any of these compounds be used as the first phosphorescent compound in the light-emitting element of one embodiment of the present invention, the first light-emitting layer be provided closer to the cathode than the second light-emitting layer, and the second light-emitting layer have a hole-transport property (specifically, the second host material be a hole-transport material), in which case a recombination region of carriers can be easily controlled to be in the first light-emitting layer. Note that an organometallic iridium complex having a 4H-triazole skeleton has excellent reliability and emission efficiency and thus is especially preferable.

The following are the specific examples: an organometallic iridium complex having a pyrimidine skeleton, such as tris(4-methyl-6-phenylpyrimidinato)iridium(III) (abbreviation: $Ir(mppm)_3$), tris(4-t-butyl-6-phenylpyrimidinato)iridium(III) (abbreviation: $Ir(tBuppm)_3$), (acetylacetonato)bis(6-methyl-4-phenylpyrimidinato)iridium(III) (abbreviation: $Ir(mppm)_2(acac)$), (acetylacetonato)bis(6-tert-butyl-4-phenylpyrimidinato)iridium(III) (abbreviation: $Ir(tBuppm)_2(acac)$), (acetylacetonato)bis[6-(2-norbornyl)-4-phenylpyrimidinato]iridium(III) (abbreviation: $Ir(nbppm)_2(acac)$), (acetylacetonato)bis[5-methyl-6-(2-methylphenyl)-4-phenylpyrimidinato]iridium(III) (abbreviation: $Ir(mpmppm)_2(acac)$), or (acetylacetonato)bis(4,6-diphenylpyrimidinato)iridium(III) (abbreviation: $Ir(dppm)_2(acac)$); an organometallic iridium complex having a pyrazine skeleton, such as (acetylacetonato)bis(3,5-dimethyl-2-phenylpyrazinato)iridium(III) (abbreviation: $Ir(mppr\text{-}Me)_2(acac)$) or (acetylacetonato)bis(5-isopropyl-3-methyl-2-phenylpyrazinato)iridium(III) (abbreviation: $Ir(mppr\text{-}iPr)_2(acac)$); an organometallic iridium complex having a pyridine skeleton, such as tris(2-phenylpyridinato-N,$C^{2'}$)iridium(III) (abbreviation: $Ir(ppy)_3$), bis(2-phenylpyridinato-N,$C^{2'}$)iridium(III)acetylacetonate (abbreviation: $Ir(ppy)_2acac$), bis(benzo[h]quinolinato)iridium(III)acetylacetonate (abbreviation: $Ir(bzq)_2(acac)$), tris(benzo[h]quinolinato)iridium(III) (abbreviation: $Ir(bzq)_3$), tris(2-phenylquinolinato-N,$C^{2'}$)iridium(III) (abbreviation: $Ir(pq)_3$), or bis(2-phenylquinolinato-N,$C^{2'}$)iridium(III)acetylacetonate (abbreviation: $Ir(pq)_2(acac)$); and a rare earth metal complex such as tris(acetylacetonato)(monophenanthroline)terbium(III) (abbreviation: $Tb(acac)_3(Phen)$). These are mainly compounds emitting green phosphorescence and have an emission peak at 500 nm to 600 nm. Among the above compounds, an organometallic iridium complex having a diazine skeleton such as a pyrimidine skeleton or a pyrazine skeleton has a low hole-trapping property and a high electron-trapping property. Therefore, it is preferable that any of these compounds be used as the first phosphorescent compound in the light-emitting element of one embodiment of the present invention, the first light-emitting layer be provided closer to the anode than the second light-emitting layer, and the second light-emitting layer have an electron-transport property (specifically, the second host material be an electron-transport material), in which case a recombination region of carriers can be easily controlled to be in the first light-emitting layer. Note that an organometallic iridium complex having a pyrimidine skeleton has distinctively high reliability and emission efficiency and thus is especially preferable.

Still other examples are an organometallic iridium complex having a pyrimidine skeleton such as (diisobutyrylmethanato)bis[4,6-bis(3-methylphenyl)pyrimidinato]iridium(III) (abbreviation: $Ir(5mdppm)_2(dibm)$), bis[4,6-bis(3-methylphenyl)pyrimidinato](dipivaloylmethanato)iridium(III) (abbreviation: $Ir(5mdppm)_2(dpm)$), or bis[4,6-di(naphthalen-1-yl)pyrimidinato](dipivaloylmethanato)iridium(III) (abbreviation: $Ir(d1npm)_2(dpm)$); an organometallic iridium complex having a pyrazine skeleton such as (acetylacetonato)bis(2,3,5-triphenylpyrazinato)iridium(III) (abbreviation: $Ir(tppr)_2(acac)$), bis(2,3,5-triphenylpyrazinato)(dipivaloylmethanato)iridium(III) (abbreviation: $Ir(tppr)_2(dpm)$), or (acetylacetonato)bis[2,3-bis(4-fluorophenyl)quinoxalinato]iridium(III) (abbreviation: $Ir(Fdpq)_2(acac)$); an organometallic iridium complex having a pyridine skeleton such as tris(1-phenylisoquinolinato-N,$C^{2'}$)iridium(III) (abbreviation: $Ir(piq)_3$) or bis(1-phenylisoquinolinato-N,$C^{2'}$)iridium(III) acetylacetonate (abbreviation: $Ir(piq)_2(acac)$); a platinum complex such as 2,3,7,8,12,13,17,18-octaethyl-21H,23H-porphyrin platinum(II) (abbreviation: PtOEP); and a rare earth metal complex such as tris(1,3-diphenyl-1,3-propanedionato)(monophenanthroline)europium(III) (abbreviation: $Eu(DBM)_3(Phen)$) or tris[1-(2-thenoyl)-3,3,3-trifluoroacetonato](monophenanthroline)europium(III) (abbreviation: $Eu(TTA)_3(Phen)$). These are compounds emitting red phosphorescence and have an emission peak at 600 nm to 700 nm. Among the above compounds, an organometallic iridium complex having a diazine skeleton such as a pyrimidine skeleton or a pyrazine skeleton has a low hole-trapping property and a high electron-trapping property. Therefore, it is preferable that an organometallic iridium complex having a diazine skeleton be used as the second phosphorescent compound, the first light-emitting layer be provided closer to the cathode than the second light-emitting layer, and the second light-emitting layer have a hole-transport property (specifically, the second host material be a hole-transport material), in which case a recombination region of carriers can be easily controlled to be in the first light-emitting layer. Note that an organometallic iridium complex having a pyrimidine skeleton has distinctively high reliability and emission efficiency and thus is especially preferable. Further, because an organometallic iridium complex having a pyrazine skeleton can provide red light emission with favorable chromaticity, the use of the organometallic iridium complex in a white light-emitting element improves a color rendering property of the white light-emitting element.

It is also possible to select the first to third phosphorescent compounds 113Da to 113Dc from known phosphorescent materials in addition to the above phosphorescent compounds.

Note that the phosphorescent compounds (the first to third phosphorescent compounds 113Da to 113Dc) may be replaced with a material exhibiting thermally activated delayed fluorescence, i.e., a thermally activated delayed fluorescence (TADF) material. Here, the term "delayed fluorescence" refers to light emission having a spectrum similar to normal fluorescence and an extremely long lifetime. The lifetime is $10^{-6}$ seconds or longer, preferably $10^{-3}$ seconds or longer. Specific examples of the thermally activated delayed fluorescence material include a fullerene, a derivative thereof, an acridine derivative such as proflavine, and eosin. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2OEP$). Alternatively, a heterocyclic compound including a π-electron rich heteroaromatic ring and a π-electron deficient heteroaromatic ring can be used, such as 2-(biphenyl-4-yl)-4,6-bis(12-phenylindolo[2,3-a]carbazol-11-yl)-1,3,5-triazine (PIC-TRZ). Note that a material in which the π-electron rich heteroaromatic ring is directly bonded to the π-electron deficient heteroaromatic ring is particularly preferably used because both the donor property of the π-electron rich heteroaromatic ring and the acceptor property of the 7r-electron deficient heteroaromatic ring are increased and the energy difference between the $S_1$ level and the $T_1$ level becomes small.

Materials that can be used for the first host material 113Ha1, the second host material 113Ha2, the first carrier-transport compound 113$H_1$, the second carrier-transport compound 113$H_2$, the third carrier-transport compound 113$H_3$, and the fourth carrier-transport compound 113$H_4$ are described in Embodiment 1; thus, the description thereof is not given here.

For formation of the light-emitting layer 113, co-evaporation by a vacuum evaporation method can be used, or alternatively an inkjet method, a spin coating method, a dip coating method, or the like using a mixed solution can be used.

The electron-transport layer 114 is a layer containing a substance having an electron-transport property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: $Almq_3$), bis(10-hydroxybenzo[h]quinolinato)beryllium (abbreviation: $BeBq_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-hydroxyphenyl)benzoxazolato]zinc (abbreviation: $Zn(BOX)_2$) or bis[2-(2-hydroxyphenyl)benzothiazolato]zinc (abbreviation: $Zn(BTZ)_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here have high electron-transport properties and are mainly ones that have an electron mobility of $10^{-6}$ $cm^2/Vs$ or more. Note that any of the above-described host materials having electron-transport properties may be used for the electron-transport layer 114.

The electron-transport layer 114 is not limited to a single layer, and may be a stack of two or more layers containing any of the above substances.

Between the electron-transport layer and the light-emitting layer, a layer that controls transport of electron carriers may be provided. This is a layer formed by addition of a small amount of a substance having a high electron-trapping property to the aforementioned material having a high electron-transport property, and the layer is capable of adjusting carrier balance by retarding transport of electron carriers. Such a structure is very effective in preventing a problem (such as a reduction in element lifetime) caused when electrons pass through the light-emitting layer.

In addition, the electron-injection layer 115 may be provided in contact with the second electrode 102 between the electron-transport layer 114 and the second electrode 102. For the electron-injection layer 115, an alkali metal, an alkaline earth metal, or a compound thereof, such as lithium fluoride (LiF), cesium fluoride (CsF), or calcium fluoride ($CaF_2$), can be used. For example, a layer that is formed using a substance having an electron-transport property and contains an alkali metal, an alkaline earth metal, or a compound thereof can be used. Note that a layer that is formed using a substance having an electron-transport property and contains an alkali metal or an alkaline earth metal is preferably used as the electron-injection layer 115, in which case electron injection from the second electrode 102 is efficiently performed.

For the second electrode 102, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and AlLi), rare earth metals such as europium (Eu) and ytterbium (Yb), alloys thereof, and the like. However, when the electron-injection layer is provided between the second electrode 102 and the electron-transport layer, for the second electrode 102, any of a variety of conductive materials such as Al, Ag, indium oxide-tin oxide, or indium oxide-tin oxide containing silicon or silicon oxide can be used regardless of the work function. Films of these conductive materials can be formed by a sputtering method, an inkjet method, a spin coating method, or the like.

Any of a variety of methods can be used to form the EL layer 103 regardless whether it is a dry process or a wet process. For example, a vacuum evaporation method, an inkjet method, a spin coating method, or the like may be used. Different formation methods may be used for the electrodes or the layers.

In addition, the electrode may be formed by a wet method using a sol-gel method, or by a wet method using paste of a metal material. Alternatively, the electrode may be formed by a dry method such as a sputtering method or a vacuum evaporation method.

In the light-emitting element having the above-described structure, current flows due to a potential difference between the first electrode 101 and the second electrode 102, and holes and electrons recombine in the light-emitting layer 113 which contains a substance having a high light-emitting property, so that light is emitted. That is, a light-emitting region is formed in the light-emitting layer 113.

Light emission is extracted out through one of or both the first electrode 101 and the second electrode 102. Therefore, one of or both the first electrode 101 and the second electrode 102 are light-transmitting electrodes. In the case where only the first electrode 101 is a light-transmitting electrode, light emission is extracted through the first electrode 101. In the case where only the second electrode 102 is a light-transmitting electrode, light emission is extracted through the second electrode 102. In the case where both the first electrode 101 and the second electrode 102 are light-transmitting electrodes, light emission is extracted through the first electrode 101 and the second electrode 102.

The structure of the layers provided between the first electrode 101 and the second electrode 102 is not limited to the above-described structure. Preferably, a light-emitting region where holes and electrons recombine is positioned away from the first electrode 101 and the second electrode 102 so that quenching due to the proximity of the light-emitting region and a metal used for electrodes and carrier-injection layers can be prevented.

Further, in order that transfer of energy from an exciton generated in the light-emitting layer can be suppressed, preferably, the hole-transport layer and the electron-transport layer which are in contact with the light-emitting layer 113, particularly a carrier-transport layer in contact with a side closer to the light-emitting region in the light-emitting layer 113, are formed using a substance having higher triplet excitation energy than the substance in the light-emitting layer.

A light-emitting element in this embodiment is preferably fabricated over a substrate of glass, plastic, or the like. As the way of stacking layers over the substrate, layers may be sequentially stacked from the first electrode 101 side or sequentially stacked from the second electrode 102 side. In a light-emitting device, although one light-emitting element may be formed over one substrate, a plurality of light-emitting elements may be formed over one substrate. With a plurality of light-emitting elements as described above formed over one substrate, a lighting device in which elements are separated or a passive matrix light-emitting device can be manufactured. A light-emitting element may be formed over an electrode electrically connected to a thin film transistor (TFT), for example, which is formed over a substrate of glass, plastic, or the like, so that an active matrix light-emitting device in which the TFT controls the drive of the light-emitting element can be manufactured. Note that there is no particular limitation on the structure of the TFT, which may be a staggered TFT or an inverted staggered TFT. In addition, crystallinity of a semiconductor used for the TFT is not particularly limited either; an amorphous semiconductor or a crystalline semiconductor may be used. In addition, a driver circuit formed in a TFT substrate may be formed with an n-type TFT and a p-type TFT, or with either an n-type TFT or a p-type TFT.

Note that this embodiment can be combined with any of the other embodiments as appropriate.

Embodiment 3

In this embodiment, an embodiment of a light-emitting element with a structure in which a plurality of light-emitting units are stacked (hereinafter, also referred to as "stacked-type element") will be described with reference to FIG. 2. This light-emitting element is a light-emitting element including a plurality of light-emitting units between a first electrode and a second electrode. One light-emitting unit has the same structure as the EL layer 103 illustrated in FIG. 1E. In other words, the light-emitting element illustrated in FIG. 1E includes one light-emitting unit while the light-emitting element in this embodiment includes a plurality of light-emitting units.

Figure 2:
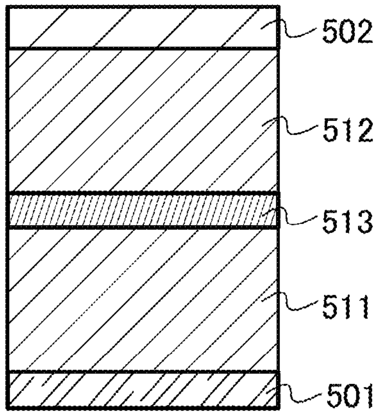
FIG. 2 is a schematic diagram of a light-emitting element.

In FIG. 2, a first light-emitting unit 511 and a second light-emitting unit 512 are stacked between a first electrode 501 and a second electrode 502, and a charge-generation layer 513 is provided between the first light-emitting unit 511 and the second light-emitting unit 512. The first electrode 501 and the second electrode 502 correspond, respectively, to the first electrode 101 and the second electrode 102 in FIG. 1E, and the materials given in the description with reference to FIG. 1E can be used. Further, the first light-emitting unit 511 and the second light-emitting unit 512 may have the same structure or different structures.

The charge-generation layer 513 contains a composite material of an organic compound and a metal oxide. As this composite material of an organic compound and a metal oxide, the composite material that can be used for the hole-injection layer 111 illustrated in FIG. 1E can be used. As the organic compound, a variety of compounds such as an aromatic amine compound, a carbazole compound, an aromatic hydrocarbon, and a high molecular compound (such as an oligomer, a dendrimer, or a polymer) can be used. An organic compound having a hole mobility of $1\times10^{-6}$ $cm^2/Vs$ or higher is preferably used. However, any other substance may be used as long as the substance has a hole-transport property higher than an electron-transport property. The composite material of an organic compound and a metal oxide has a high carrier-injection property and a high carrier-transport property; thus, low-voltage driving and low-current driving can be achieved. Note that when a surface of a light-emitting unit on the anode side is in contact with a charge generation layer, the charge generation layer can also serve as a hole-transport layer of the light-emitting unit; thus, a hole-transport layer does not need to be formed in the light-emitting unit.

The charge-generation layer 513 may have a stacked-layer structure of a layer containing the composite material of an organic compound and a metal oxide and a layer containing another material. For example, the charge-generation layer 513 may have a stacked-layer structure of a layer containing the composite material of an organic compound and a metal oxide and a layer containing a compound of a substance selected from electron-donating substances and a compound having a high electron-transport property. Moreover, the charge-generation layer 513 may have a stacked-layer structure of a layer containing the composite material of an organic compound and a metal oxide and a transparent conductive film.

The charge-generation layer 513 provided between the first light-emitting unit 511 and the second light-emitting unit 512 may have any structure as far as electrons can be injected to a light-emitting unit on one side and holes can be injected to a light-emitting unit on the other side when a voltage is applied between the first electrode 501 and the second electrode 502. For example, in FIG. 2, any layer can be used as the charge generation layer 513 as far as the layer injects electrons into the first light-emitting unit 511 and holes into the second light-emitting unit 512 when a voltage is applied such that the potential of the first electrode is higher than that of the second electrode.

Although the light-emitting element having two light-emitting units is illustrated in FIG. 2, one embodiment of the present invention can be similarly applied to a light-emitting element in which three or more light-emitting units are stacked. With a plurality of light-emitting units partitioned by the charge-generation layer between a pair of electrodes as in the light-emitting element of this embodiment, it is possible to provide a light-emitting element that can emit light with high luminance with the current density kept low and has a long lifetime. Moreover, a light-emitting device having low driving voltage and lower power consumption can be achieved.

Further, when emission colors of the light-emitting units are made different, light emission having a desired color can be obtained from the light-emitting element as a whole. For example, in the light-emitting element having two light-emitting units, when the first light-emitting unit emits light of red and green and the second light-emitting unit emits light of blue, it is possible to obtain a light-emitting element from which white light is emitted from the whole light-emitting element.

When the above-described structure of the light-emitting layer 113 is applied to at least one of the plurality of units, the number of manufacturing steps of the unit can be reduced; thus, a multicolor light-emitting element which is advantageous for practical application can be provided.

The above-described structure can be combined with any of the structures in this embodiment and the other embodiments.

Embodiment 4

In this embodiment, a light-emitting device manufactured using the light-emitting element described in any of Embodiments 1 to 3 will be described.

Figure 3A:
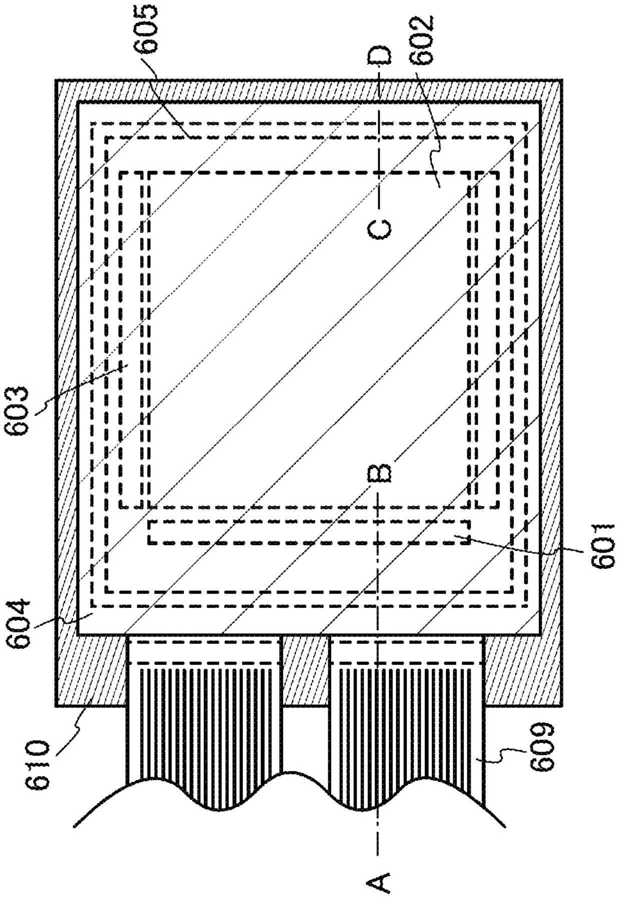
FIGS. 3A and 3B are schematic diagrams of an active matrix light-emitting device.
Figure 3B:
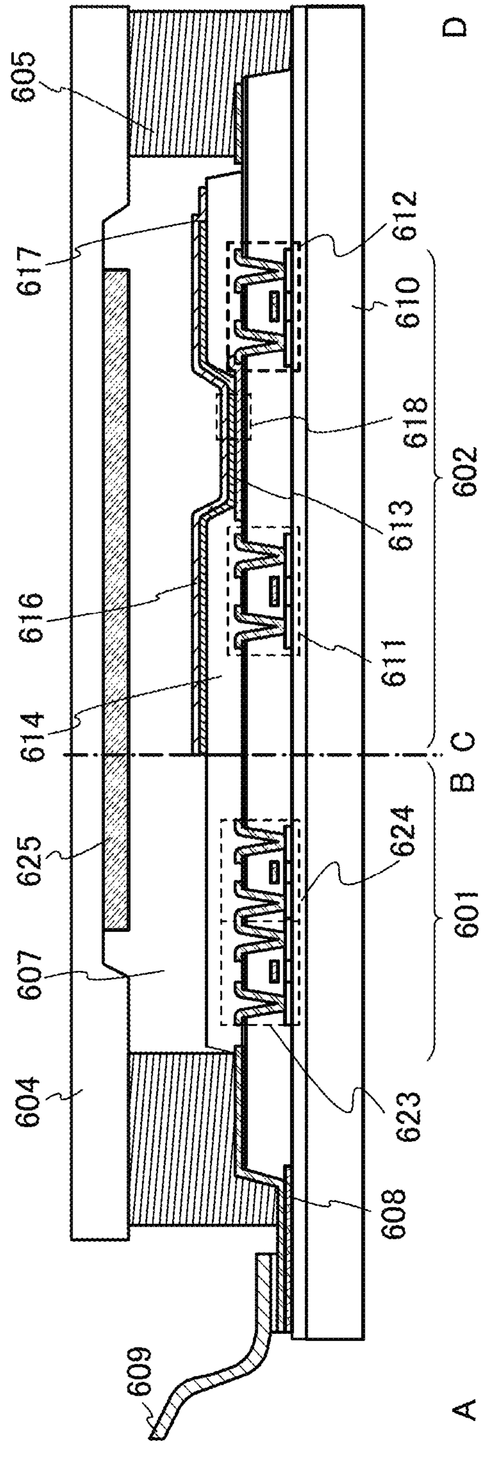

In this embodiment, a light-emitting device manufactured using the light-emitting element described in any of Embodiments 1 to 3 will be described with reference to FIGS. 3A and 3B. Note that FIG. 3A is a top view of the light-emitting device and FIG. 3B is a cross-sectional view taken along the lines A-B and C-D in FIG. 3A. This light-emitting device includes a driver circuit portion (source line driver circuit) 601, a pixel portion 602, and a driver circuit portion (gate line driver circuit) 603, which are to control light emission of a light-emitting element and illustrated with dotted lines. Reference numeral 604 denotes a sealing substrate; 605, a sealing material; and 607, a space surrounded by the sealing material 605.

Reference numeral 608 denotes a wiring for transmitting signals to be input to the source line driver circuit 601 and the gate line driver circuit 603 and receiving signals such as a video signal, a clock signal, a start signal, and a reset signal from an FPC (flexible printed circuit) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure is described with reference to FIG. 3B. The driver circuit portion and the pixel portion are formed over an element substrate 610; FIG. 3B shows the source line driver circuit 601, which is a driver circuit portion, and one of the pixels in the pixel portion 602.

As the source line driver circuit 601, a CMOS circuit in which an n-channel TFT 623 and a p-channel TFT 624 are combined is formed. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching TFT 611, a current controlling TFT 612, and a first electrode 613 electrically connected to a drain of the current controlling TFT 612. Note that to cover an end portion of the first electrode 613, an insulator 614 is formed, for which a positive photosensitive acrylic resin film is used here.

In order to improve coverage, the insulator 614 is formed to have a curved surface with curvature at its upper or lower end portion. For example, in the case where positive photosensitive acrylic is used for a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has the structure described in any of Embodiments 1 to 3. Further, for another material included in the EL layer 616, any of low molecular-weight compounds and polymeric compounds (including oligomers and dendrimers) may be used.

As a material used for the second electrode 617, which is formed over the EL layer 616 and functions as a cathode, a material having a low work function (e.g., Al, Mg, Li, Ca, or an alloy or a compound thereof, such as MgAg, MgIn, or Al—Li) is preferably used. In the case where light generated in the EL layer 616 passes through the second electrode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the light-emitting element is formed with the first electrode 613, the EL layer 616, and the second electrode 617. The light-emitting element has the structure described in any of Embodiments 1 to 3. In the light-emitting device of this embodiment, the pixel portion, which includes a plurality of light-emitting elements, may include both the light-emitting element described in any of Embodiments 1 to 3 and a light-emitting element having a different structure.

The sealing substrate 604 is attached to the element substrate 610 with the sealing material 605, so that the light-emitting element 618 is provided in the space 607 surrounded by the element substrate 610, the sealing substrate 604, and the sealing material 605. The space 607 may be filled with filler, or may be filled with an inert gas (such as nitrogen or argon), or the sealing material 605. It is preferable that the sealing substrate be provided with a recessed portion and the drying agent 625 be provided in the recessed portion, in which case deterioration due to influence of moisture can be suppressed.

An epoxy-based resin or glass frit is preferably used for the sealing material 605. It is preferable that such a material do not transmit moisture or oxygen as much as possible. As the sealing substrate 604, a glass substrate, a quartz substrate, or a plastic substrate formed of fiberglass reinforced plastic (FRP), polyvinyl fluoride (PVF), polyester, acrylic, or the like can be used.

As described above, the light-emitting device which uses the light-emitting element described in any of Embodiments 1 to 3 can be obtained.

The light-emitting device in this embodiment is fabricated using the light-emitting element described in any of Embodiments 1 to 3 and thus can have favorable characteristics. Specifically, since the light-emitting element described in any of Embodiments 1 to 3 has high emission efficiency, the light-emitting device can have reduced power consumption. In addition, since the light-emitting element can be driven at low voltage, the light-emitting device can be driven at low voltage.

Figure 4A:
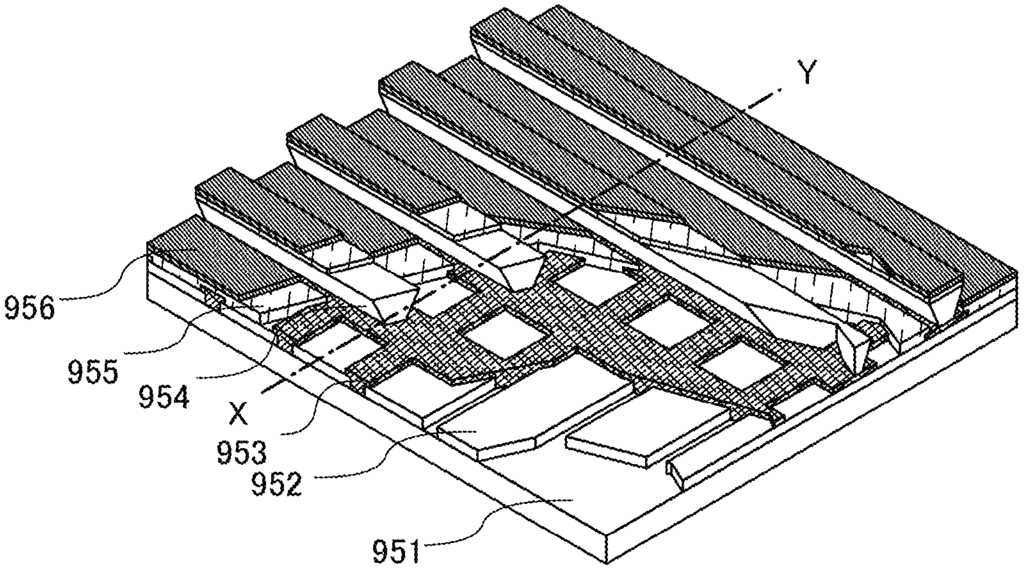
FIGS. 4A and 4B are schematic diagrams of a passive matrix light-emitting device.
Figure 4B:
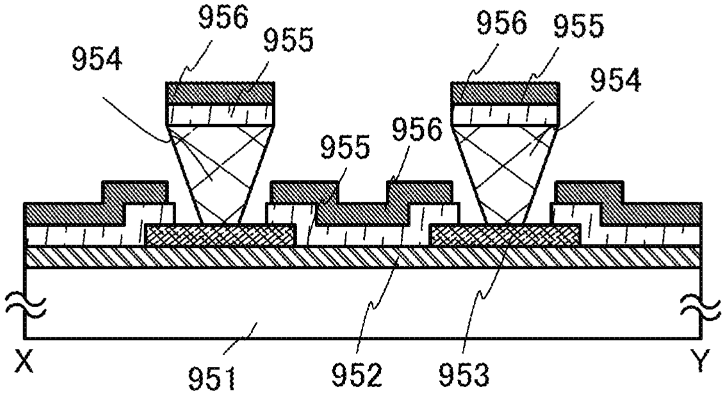

Although an active matrix light-emitting device is described above in this embodiment, application to a passive matrix light-emitting device may be carried out. FIGS. 4A and 4B illustrate a passive matrix light-emitting device manufactured using the present invention. FIG. 4A is a perspective view of the light-emitting device, and FIG. 4B is a cross-sectional view taken along the line X-Y in FIG. 4A. In FIGS. 4A and 4B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side which is in the same direction as a plane direction of the insulating layer 953 and in contact with the insulating layer 953) is shorter than the upper side (a side which is in the same direction as the plane direction of the insulating layer 953 and not in contact with the insulating layer 953). The partition layer 954 thus provided can prevent defects in the light-emitting element due to static electricity or the like. The passive matrix light-emitting device can also be driven with low power consumption by including the light-emitting element in any of Embodiments 1 to 3 which can be driven at low voltage. The passive matrix light-emitting device can also be driven with low power consumption by including the light-emitting element in any of Embodiments 1 to 3. Further, the passive matrix light-emitting device can have high reliability by including the light-emitting element in any of Embodiments 1 to 3.

Figure 5A:
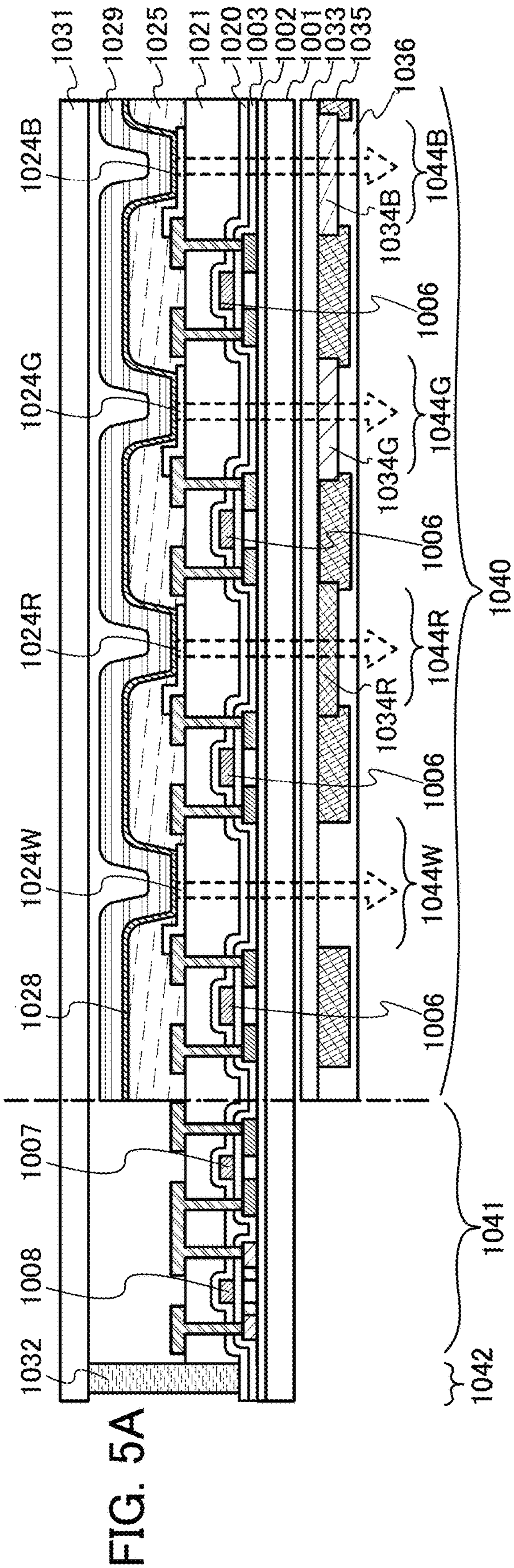
FIGS. 5A and 5B are each a schematic diagram of an active matrix light-emitting device.
Figure 5B:
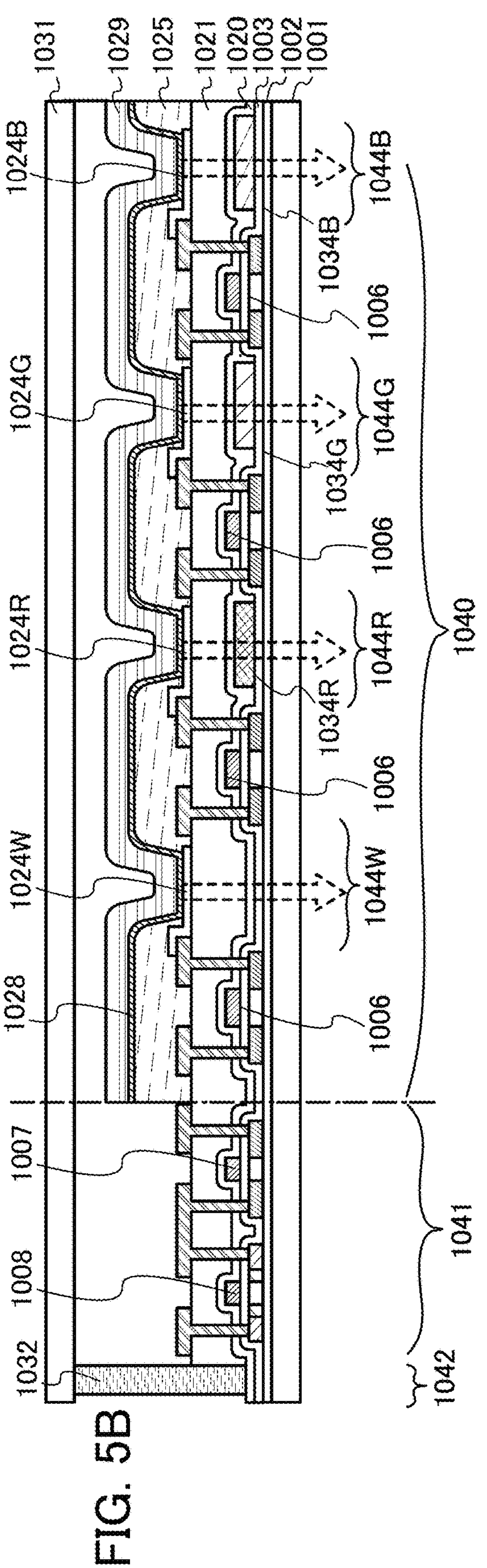

For performing full color display, a coloring layer or a color conversion layer may be provided in a light path through which light from the light-emitting element passes to the outside of the light-emitting device. An example of a light-emitting device in which full color display is achieved with the use of a coloring layer and the like is illustrated in FIGS. 5A and 5B. In FIG. 5A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition 1025, an EL layer 1028, a second electrode 1029 of the light-emitting elements, a sealing substrate 1031, a sealant 1032, and the like are illustrated. Further, coloring layers (a red coloring layer 1034R, a green coloring layer 1034G, and a blue coloring layer 1034B) are provided on a transparent base material 1033. Further, a black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In this embodiment, light emitted from part of the light-emitting layer does not pass through the coloring layers, while light emitted from the other part of the light-emitting layer passes through the coloring layers. Since light which does not pass through the coloring layers is white and light which passes through any one of the coloring layers is red, blue, or green, an image can be displayed using pixels of the four colors.

Figure 6:
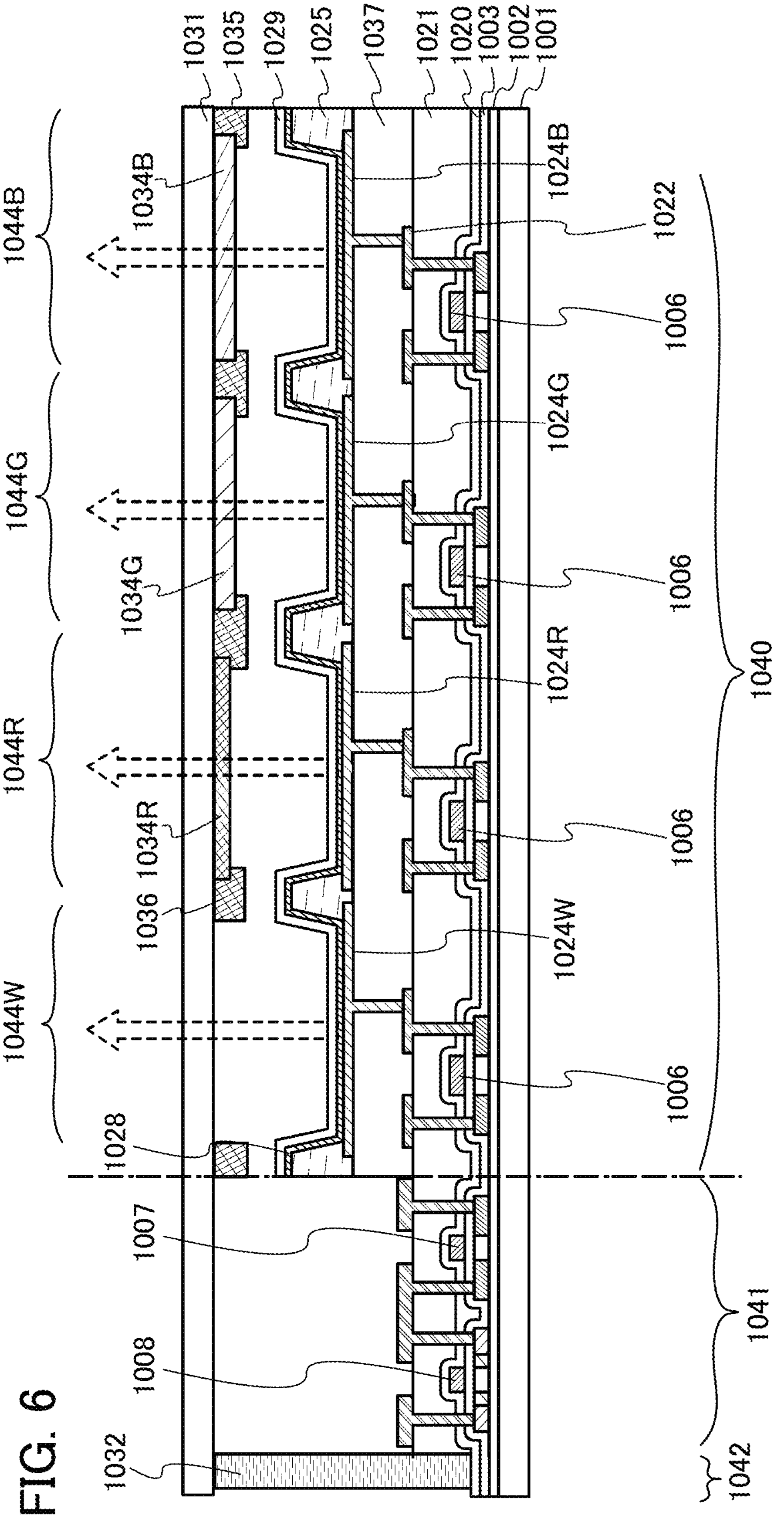
FIG. 6 is a schematic diagram of an active matrix light-emitting device.

The above-described light-emitting device is a light-emitting device having a structure in which light is extracted from the substrate 1001 side where the TFTs are formed (a bottom emission structure), but may be a light-emitting device having a structure in which light is extracted from the sealing substrate 1031 side (a top emission structure). FIG. 6 is a cross-sectional view of a light-emitting device having a top emission structure. In this case, a substrate which does not transmit light can be used as the substrate 1001. The process up to the step of forming of a connection electrode which connects the TFT and the anode of the light-emitting element is performed in a manner similar to that of the light-emitting device having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any other known material.

The first electrodes 1024W, 1024R, 1024G, and 1024B of the light-emitting elements each serve as an anode here, but may serve as a cathode. Further, in the case of a light-emitting device having a top emission structure as illustrated in FIG. 6, the first electrodes are preferably reflective electrodes. The EL layer 1028 is formed to have a structure similar to the structure described in any of Embodiments 1 to 3, with which white light emission can be obtained. As the structure with which white light emission can be obtained, in the case where two EL layers are used, a structure with which blue light is obtained from a light-emitting layer in one of the EL layers and orange light is obtained from a light-emitting layer of the other of the EL layers; a structure in which blue light is obtained from a light-emitting layer of one of the EL layers and red light and green light are obtained from a light-emitting layer of the other of the EL layers; and the like can be given. Further, in the case where three EL layers are used, red light, green light, and blue light are obtained from respective light-emitting layers, so that a light-emitting element which emits white light can be obtained. Needless to say, the structure with which white light emission is obtained is not limited thereto as long as the structure described in any of Embodiments 1 to 3 is used.

The coloring layers are each provided in a light path through which light from the light-emitting element passes to the outside of the light-emitting device. In the case of the light-emitting device having a bottom emission structure as illustrated in FIG. 5A, the coloring layers 1034R, 1034G, and 1034B can be provided on the transparent base material 1033 and then fixed to the substrate 1001. The coloring layers may be provided between the gate insulating film 1003 and the first interlayer insulating film 1020 as illustrated in FIG. 5B. In the case of a top emission structure as illustrated in FIG. 6, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (the black matrix) 1035 which is positioned between pixels. The coloring layers (the red coloring layer 1034R, the green coloring layer 1034G, and the blue coloring layer 1034B) and the black layer (the black matrix) may be covered with the overcoat layer 1036. Note that a light-transmitting substrate is used as the sealing substrate 1031.

When voltage is applied between the pair of electrodes of the thus obtained organic light-emitting element, a white light-emitting region 1044W can be obtained. In addition, by using the coloring layers, a red light-emitting region 1044R, a blue light-emitting region 1044B, and a green light-emitting region 1044G can be obtained. The light-emitting device in this embodiment includes the light-emitting element described in any of Embodiments 1 to 3; thus, a light-emitting device with low power consumption can be obtained.

Although an example in which full color display is performed using four colors of red, green, blue, and white is shown here, there is no particular limitation and full color display using three colors of red, green, and blue may be performed.

This embodiment can be freely combined with any of the other embodiments.

Embodiment 5

Figure 7A:
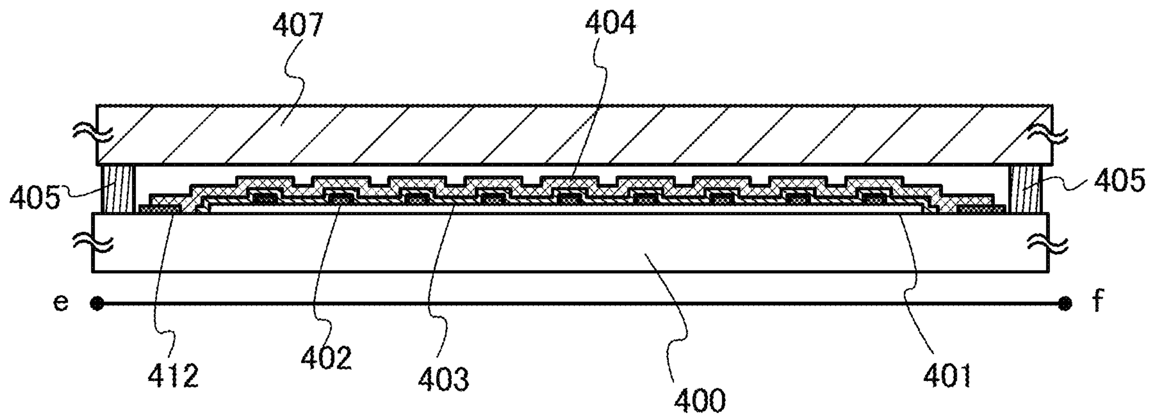
FIGS. 7A and 7B are schematic diagrams of a lighting device.
Figure 7B:
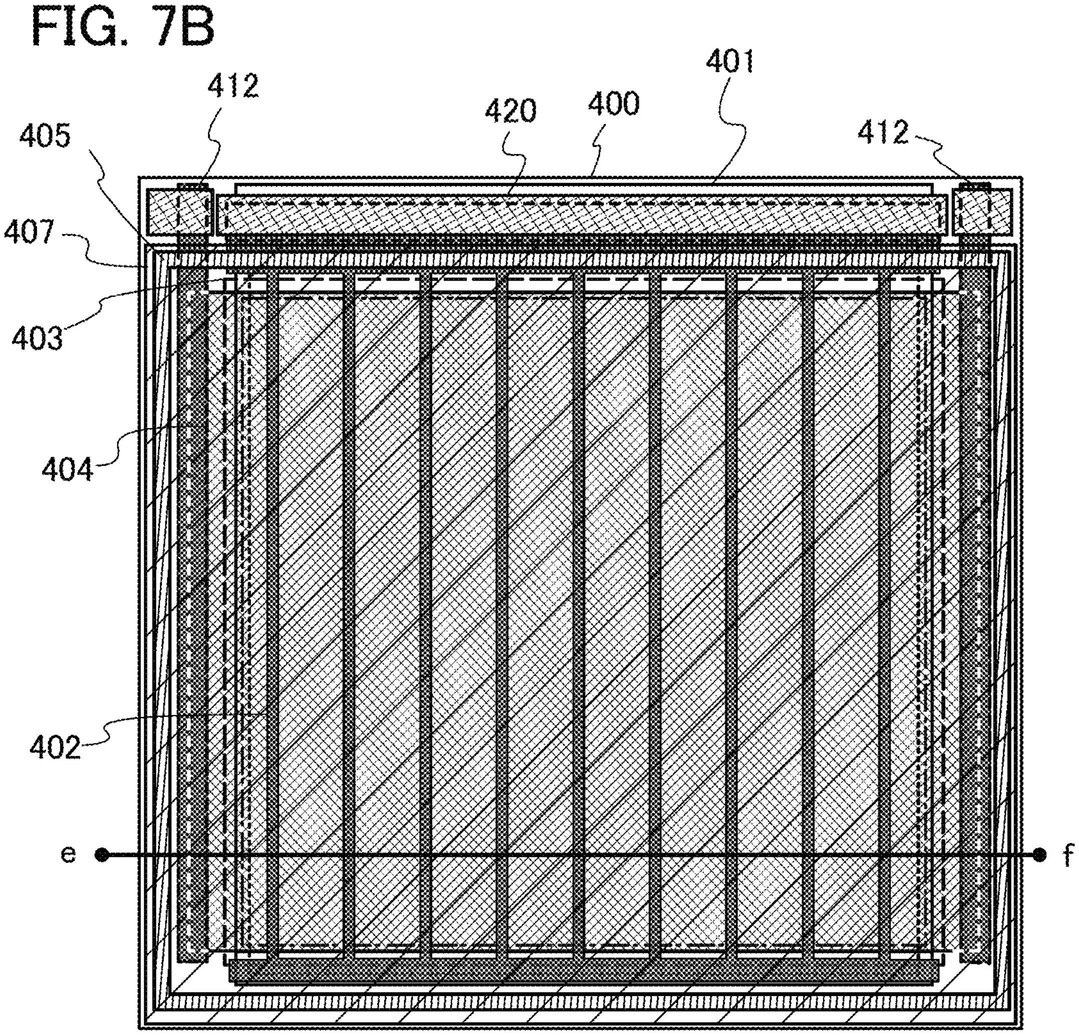

In this embodiment, an example in which the light-emitting element described in any of Embodiments 1 to 3 is used for a lighting device will be described with reference to FIGS. 7A and 7B. FIG. 7B is atop view of the lighting device, and FIG. 7A is a cross-sectional view taken along the line e-f in FIG. 7B.

In the lighting device in this embodiment, a first electrode 401 is formed over a substrate 400 which is a support and has a light-transmitting property. The first electrode 401 corresponds to the first electrode 101 in Embodiments 1 to 3.

An auxiliary electrode 402 is provided over the first electrode 401. Since light emission is extracted through the first electrode 401 side in the example given in this embodiment, the first electrode 401 is formed using a material having a light-transmitting property. The auxiliary electrode 402 is provided in order to compensate for the low conductivity of the material having a light-transmitting property, and has a function of suppressing luminance unevenness in a light emission surface due to voltage drop caused by the high resistance of the first electrode 401. The auxiliary electrode 402 is formed using a material having at least higher conductivity than the material of the first electrode 401, and is preferably formed using a material having high conductivity such as aluminum. Note that surfaces of the auxiliary electrode 402 other than a portion thereof in contact with the first electrode 401 are preferably covered with an insulating layer. This is for suppressing light emission over the upper portion of the auxiliary electrode 402, which cannot be extracted, and for suppressing a reduction in power efficiency. Note that a pad 412 for applying a voltage to a second electrode 404 may be formed at the same time as the auxiliary electrode 402.

An EL layer 403 is formed over the first electrode 401 and the auxiliary electrode 402. The EL layer 403 has the structure described in any of Embodiments 1 to 3. Refer to the descriptions for the structure. Note that the EL layer 403 is preferably formed to be slightly larger than the first electrode 401 when seen from above, in which case the EL layer 403 can also serve as an insulating layer that suppresses a short circuit between the first electrode 401 and the second electrode 404.

The second electrode 404 is formed to cover the EL layer 403. The second electrode 404 corresponds to the second electrode 102 in Embodiments 1 to 3 and has a similar structure. In this embodiment, it is preferable that the second electrode 404 be formed using a material having high reflectance because light emission is extracted through the first electrode 401 side. In this embodiment, the second electrode 404 is connected to the pad 412, whereby voltage is applied.

As described above, the lighting device described in this embodiment includes a light-emitting element including the first electrode 401, the EL layer 403, and the second electrode 404 (and the auxiliary electrode 402). Since the light-emitting element is a light-emitting element with high emission efficiency, the lighting device in this embodiment can be a lighting device having low power consumption. Furthermore, since the light-emitting element has high reliability, the lighting device in this embodiment can be a lighting device having high reliability.

The light-emitting element having the above structure is fixed to a sealing substrate 407 with sealing materials 405 and sealing is performed, whereby the lighting device is completed. It is possible to use only one of the sealing materials 405. The inner sealing material 405 can be mixed with a desiccant which enables moisture to be adsorbed, increasing reliability.

When parts of the pad 412, the first electrode 401, and the auxiliary electrode 402 are extended to the outside of the sealing materials 405 and 406, the extended parts can serve as external input terminals. An IC chip 420 mounted with a converter or the like may be provided over the external input terminals.

As described above, since the lighting device described in this embodiment includes the light-emitting element described in any of Embodiments 1 to 3 as an EL element, the lighting device can be a lighting device having low power consumption. Further, the lighting device can be a lighting device which can be driven at low voltage. Furthermore, the lighting device can be a lighting device having high reliability.

Embodiment 6

In this embodiment, examples of electronic devices each including the light-emitting element described in any of Embodiments 1 to 3 will be described. The light-emitting element described in any of Embodiments 1 to 3 has high emission efficiency and reduced power consumption. As a result, the electronic devices described in this embodiment can each include a light-emitting portion having reduced power consumption. In addition, the electronic devices can be driven at low voltage since the light-emitting element described in any of Embodiments 1 to 3 can be driven at low voltage.

Examples of the electronic device to which the above light-emitting element is applied include television devices (also referred to as TV or television receivers), monitors for computers and the like, cameras such as digital cameras and digital video cameras, digital photo frames, mobile phones (also referred to as cell phones or mobile phone devices), portable game machines, portable information terminals, audio playback devices, large game machines such as pachinko machines, and the like. Specific examples of these electronic devices are described below.

Figure 8A:
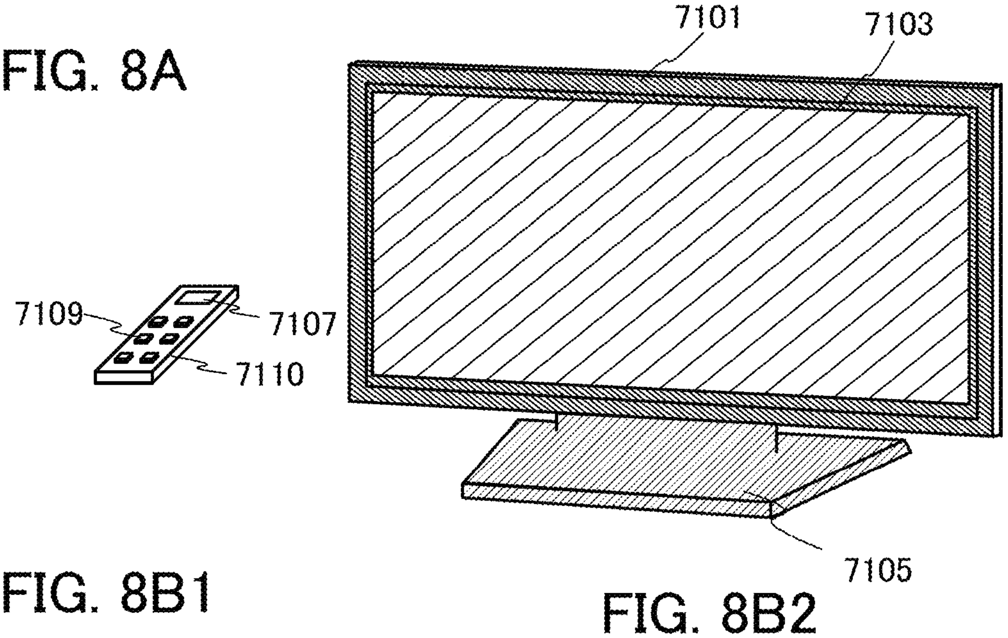
Figure 8A:
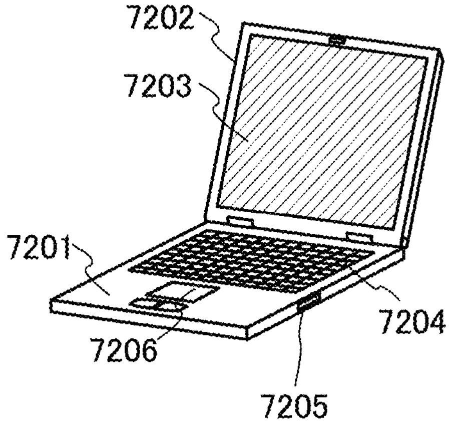
Figure 8A:
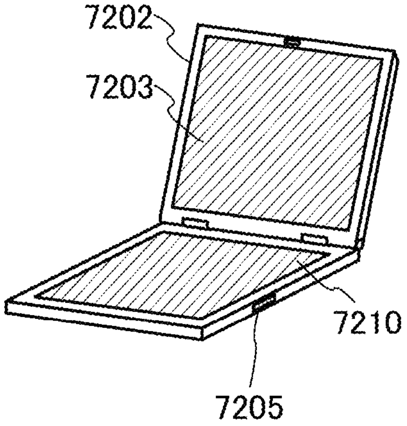

FIG. 8A illustrates an example of a television device. In the television device, a display portion 7103 is incorporated in a housing 7101. Here, the housing 7101 is supported by a stand 7105. Images can be displayed on the display portion 7103, and in the display portion 7103, the light-emitting elements described in any of Embodiments 1 to 3 are arranged in a matrix. The light-emitting elements can have high emission efficiency. Further, the light-emitting elements can be driven at low voltage. Furthermore, the light-emitting elements can have a long lifetime. Therefore, the television device including the display portion 7103 which is formed using the light-emitting elements can exhibit reduced power consumption. Further, the television device can be driven at low voltage. Furthermore, the television device can have high reliability.

Operation of the television device can be performed with an operation switch of the housing 7101 or a separate remote controller 7110. With operation keys 7109 of the remote controller 7110, channels and volume can be controlled and images displayed on the display portion 7103 can be controlled. The remote controller 7110 may be provided with a display portion 7107 for displaying data output from the remote controller 7110.

Note that the television device is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

FIG. 8B1 illustrates a computer, which includes a main body 7201, a housing 7202, a display portion 7203, a keyboard 7204, an external connection port 7205, a pointing device 7206, and the like. Note that this computer is manufactured by arranging light-emitting elements similar to those described in any of Embodiments 1 to 3 in a matrix in the display portion 7203. The computer illustrated in FIG. 8B1 may have a structure illustrated in FIG. 8B2. The computer illustrated in FIG. 8B2 is provided with a second display portion 7210 instead of the keyboard 7204 and the pointing device 7206. The second display portion 7210 has a touch screen, and input can be performed by operation of images, which are displayed on the second display portion 7210, with a finger or a dedicated pen. The second display portion 7210 can also display images other than the display for input. The display portion 7203 may also have a touch screen. Connecting the two screens with a hinge can prevent troubles; for example, the screens can be prevented from being cracked or broken while the computer is being stored or carried. Note that this computer is manufactured by arranging the light-emitting elements described in any of Embodiments 1 to 3 in a matrix in the display portion 7203. The light-emitting elements can have high emission efficiency. Therefore, this computer having the display portion 7203 which is formed using the light-emitting elements can have reduced power consumption.

Figure 8C:
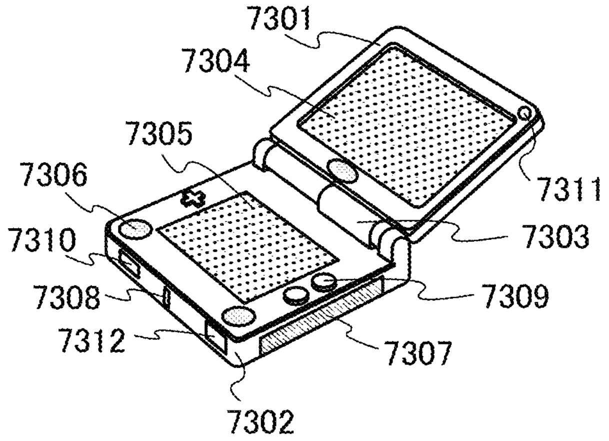

FIG. 8C illustrates a portable game machine having two housings, a housing 7301 and a housing 7302, which are connected with a joint portion 7303 so that the portable game machine can be opened or folded. The housing 7301 incorporates a display portion 7304 including the light-emitting elements described in any of Embodiments 1 to 3 and arranged in a matrix, and the housing 7302 incorporates a display portion 7305. In addition, the portable game machine illustrated in FIG. 8C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the display portion which includes the light-emitting elements described in any of Embodiments 1 to 3 and arranged in a matrix is used as at least either the display portion 7304 or the display portion 7305, or both, and the structure can include other accessories as appropriate. The portable game machine illustrated in FIG. 8C has a function of reading out a program or data stored in a storage medium to display it on the display portion, and a function of sharing information with another portable game machine by wireless communication. Note that functions of the portable game machine illustrated in FIG. 8C are not limited to them, and the portable game machine can have various functions. Since the light-emitting elements used in the display portion 7304 have high emission efficiency, the portable game machine including the above-described display portion 7304 can have reduced power consumption. Since each of the light-emitting elements used in the display portion 7304 can be driven at low voltage, the portable game machine can also be driven at low voltage. Furthermore, since the light-emitting elements used in the display portion 7304 each have a long lifetime, the portable game machine can have high reliability.

Figure 8D:
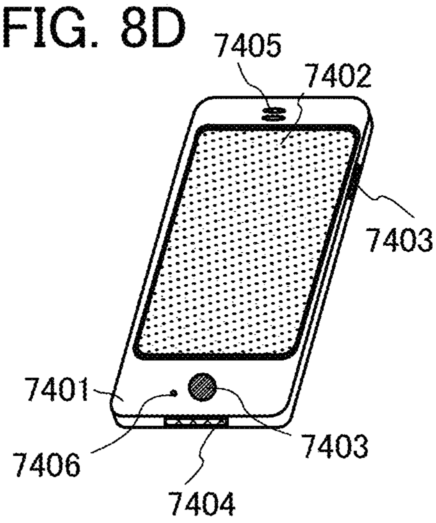

FIG. 8D illustrates an example of a mobile phone. The mobile phone is provided with a display portion 7402 incorporated in a housing 7401, operation buttons 7403, an external connection port 7404, a speaker 7405, a microphone 7406, and the like. Note that the mobile phone has the display portion 7402 including the light-emitting elements described in any of Embodiments 1 to 3 and arranged in a matrix. The light-emitting elements can have high emission efficiency. Further, the light-emitting elements can be driven at low voltage. Furthermore, the light-emitting elements can have a long lifetime. Therefore, the mobile phone including the display portion 7402 which is formed using the light-emitting elements can have reduced power consumption. Further, the mobile phone can be driven at low voltage. Furthermore, the mobile phone can have high reliability.

When the display portion 7402 of the mobile phone illustrated in FIG. 8D is touched with a finger or the like, data can be input into the mobile phone. In this case, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting information such as characters. The third mode is a display-and-input mode in which two modes of the display mode and the input mode are combined.

For example, in the case of making a call or creating an e-mail, a character input mode mainly for inputting characters is selected for the display portion 7402 so that characters displayed on a screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone, display on the screen of the display portion 7402 can be automatically changed by determining the orientation of the mobile phone (whether the mobile phone is placed horizontally or vertically for a landscape mode or a portrait mode).

The screen modes are switched by touch on the display portion 7402 or operation with the operation buttons 7403 of the housing 7401. The screen modes can be switched depending on the kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by the display portion 7402 while in touch with the palm or the finger, whereby personal authentication can be performed. Further, by providing a backlight or a sensing light source which emits a near-infrared light in the display portion, an image of a finger vein, a palm vein, or the like can be taken.

Note that the structure described in this embodiment can be combined with any of the structures described in Embodiments 1 to 5 as appropriate.

As described above, the application range of the light-emitting device having the light-emitting element described in any of Embodiments 1 to 3 is wide so that this light-emitting device can be applied to electronic devices in a variety of fields. By using the light-emitting element described in any of Embodiments 1 to 3, an electronic device having reduced power consumption can be obtained.

Figure 9:
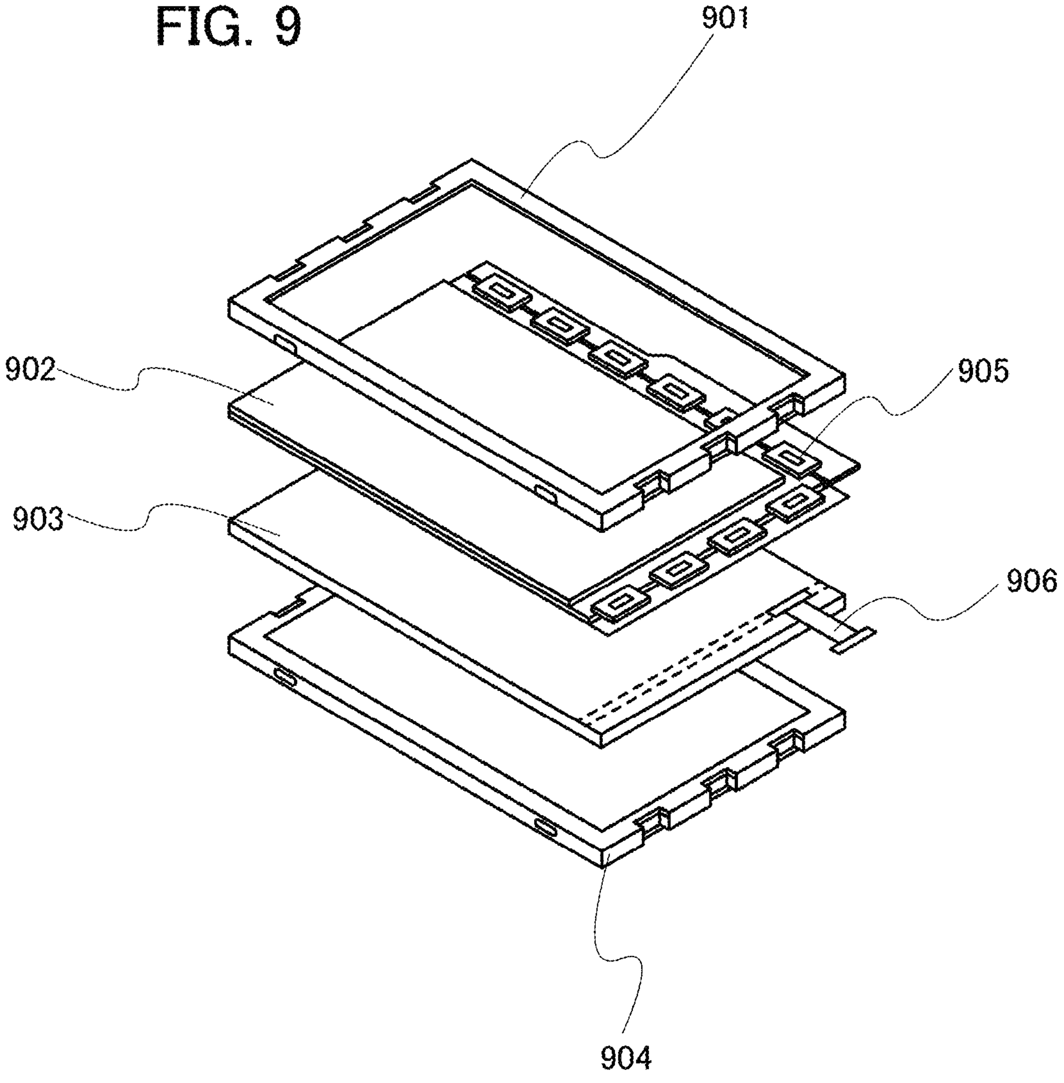
FIG. 9 illustrates an electronic device.

FIG. 9 illustrates an example of a liquid crystal display device using the light-emitting element described in any of Embodiments 1 to 3 for a backlight. The liquid crystal display device illustrated in FIG. 9 includes a housing 901, a liquid crystal layer 902, a backlight unit 903, and a housing 904. The liquid crystal layer 902 is connected to a driver IC 905. The light-emitting element described in any of Embodiments 1 to 3 is used in the backlight unit 903, to which current is supplied through a terminal 906.

The light-emitting element described in any of Embodiments 1 to 3 is used for the backlight of the liquid crystal display device; thus, the backlight can have reduced power consumption. In addition, the use of the light-emitting element described in any of Embodiments 1 to 3 enables manufacture of a planar-emission lighting device and further a larger-area planar-emission lighting device; therefore, the backlight can be a larger-area backlight, and the liquid crystal display device can also be a larger-area device. Furthermore, the light-emitting device using the light-emitting element described in any of Embodiments 1 to 3 can be thinner than a conventional one; accordingly, the display device can also be thinner.

Figure 10:
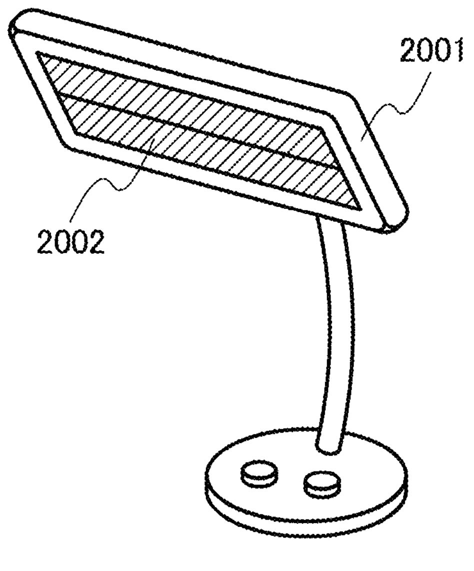
FIG. 10 illustrates a lighting device.

FIG. 10 illustrates an example in which the light-emitting element described in any of Embodiments 1 to 3 is used for a table lamp which is a lighting device. The table lamp illustrated in FIG. 10 includes a housing 2001 and a light source 2002, and the light-emitting element described in any of Embodiments 1 to 3 is used for the light source 2002.

Figure 11:
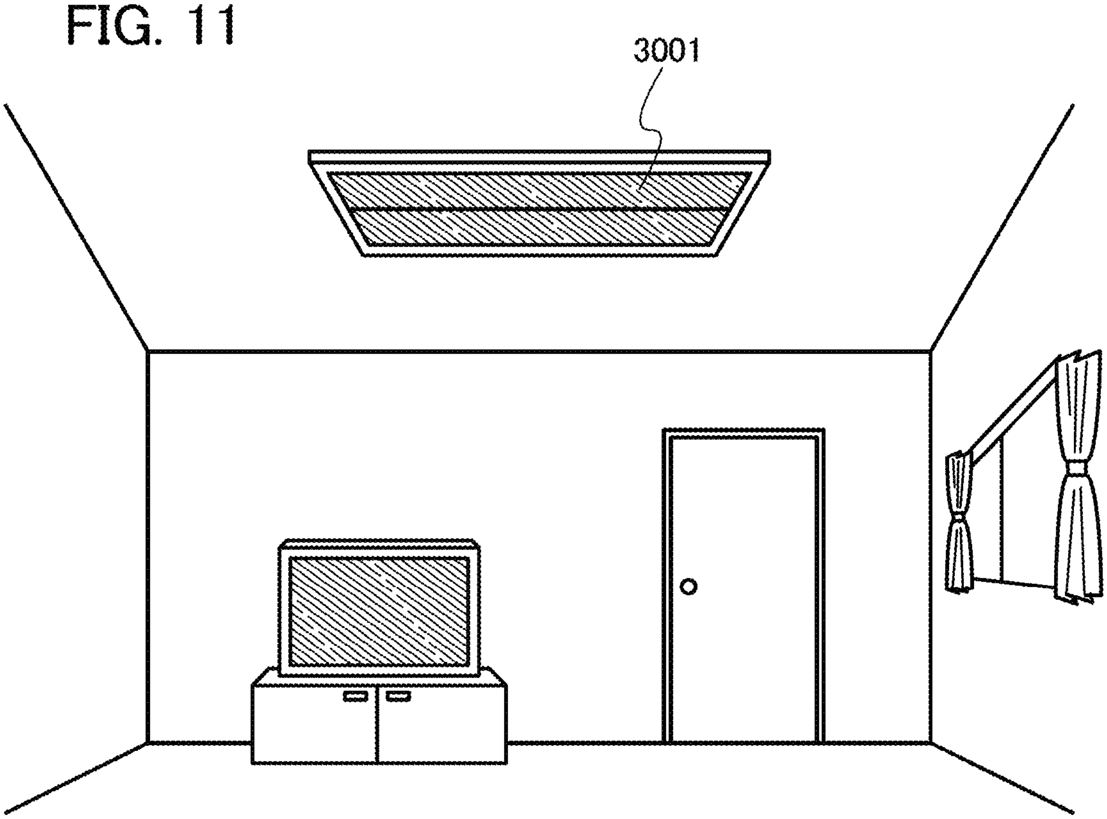
FIG. 11 illustrates a lighting device.

FIG. 11 illustrates an example in which the light-emitting element described in any of Embodiments 1 to 3 is used for an indoor lighting device 3001. Since the light-emitting element described in any of Embodiments 1 to 3 has reduced power consumption, a lighting device that has reduced power consumption can be obtained. Further, since the light-emitting element described in any of Embodiments 1 to 3 can have a large area, the light-emitting element can be used for a large-area lighting device. Furthermore, since the light-emitting element described in any of Embodiments 1 to 3 is thin, the light-emitting element can be used for a lighting device having a reduced thickness.

Figure 12:
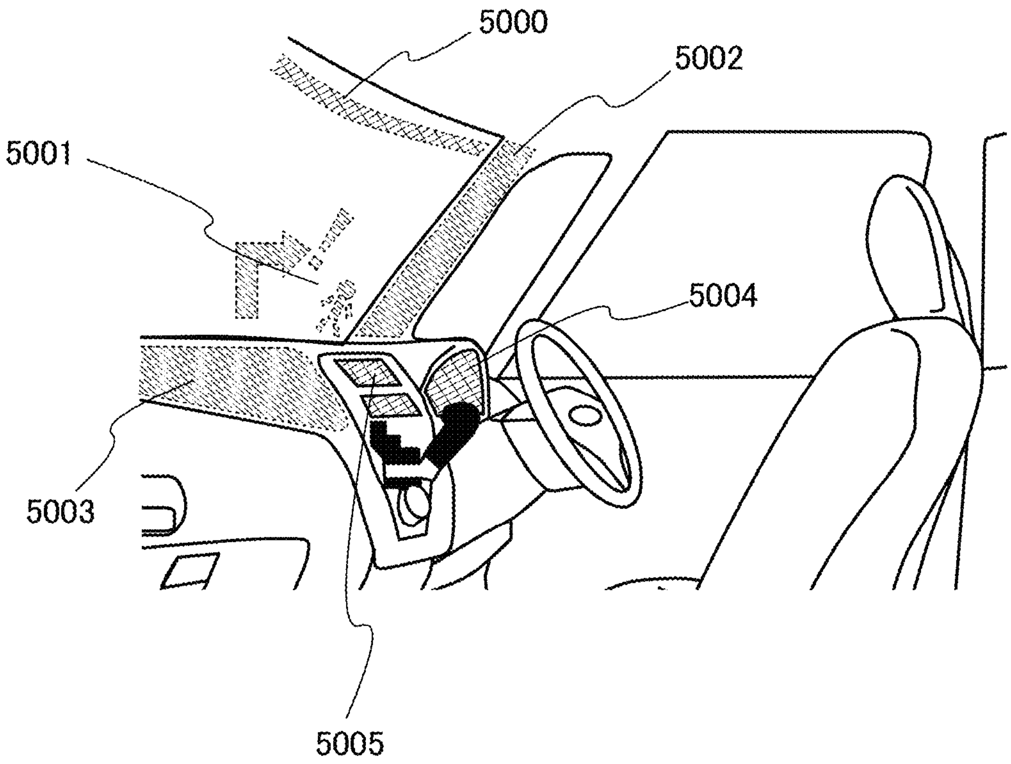
FIG. 12 illustrates in-vehicle display devices and lighting devices.

The light-emitting element described in any of Embodiments 1 to 3 can also be used for an automobile windshield or an automobile dashboard. FIG. 12 illustrates one mode in which the light-emitting elements described in any of Embodiments 1 to 3 are used for an automobile windshield and an automobile dashboard. Displays regions 5000 to 5005 each include the light-emitting element described in any of Embodiments 1 to 3.

The display regions 5000 and the display region 5001 are provided in the automobile windshield in which the light-emitting elements described in any of Embodiments 1 to 3 are incorporated. The light-emitting element described in any of Embodiments 1 to 3 can be formed into what is called a see-through display device, through which the opposite side can be seen, by including a first electrode and a second electrode formed of electrodes having light-transmitting properties. Such see-through display devices can be provided even in the automobile windshield, without hindering the vision. Note that in the case where a transistor for driving or the like is provided, a transistor having a light-transmitting property, such as an organic transistor using an organic semiconductor material or a transistor using an oxide semiconductor, is preferably used.

The display region 5002 is provided in a pillar portion in which the light-emitting elements described in any of Embodiments 1 to 3 are incorporated. The display region 5002 can compensate for the view hindered by the pillar portion by showing an image taken by an imaging unit provided in the car body. Similarly, the display region 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see makes it possible for the driver to confirm safety easily and comfortably.

The display region 5004 and the display region 5005 can provide a variety of kinds of information such as navigation data, a speedometer, a tachometer, a mileage, a fuel meter, a gearshift indicator, and air-condition setting. The content or layout of the display can be changed freely by a user as appropriate. Note that such information can also be shown by the display regions 5000 to 5003. The display regions 5000 to 5005 can also be used as lighting devices.

The light-emitting element described in any of Embodiments 1 to 3 can have high emission efficiency and low power consumption. Therefore, load on a battery is small even when a number of large screens such as the display regions 5000 to 5005 are provided, which provides comfortable use. For that reason, the light-emitting device and the lighting device each of which includes the light-emitting element described in any of Embodiments 1 to 3 can be suitably used as an in-vehicle light-emitting device and an in-vehicle lighting device.

Figure 13A:
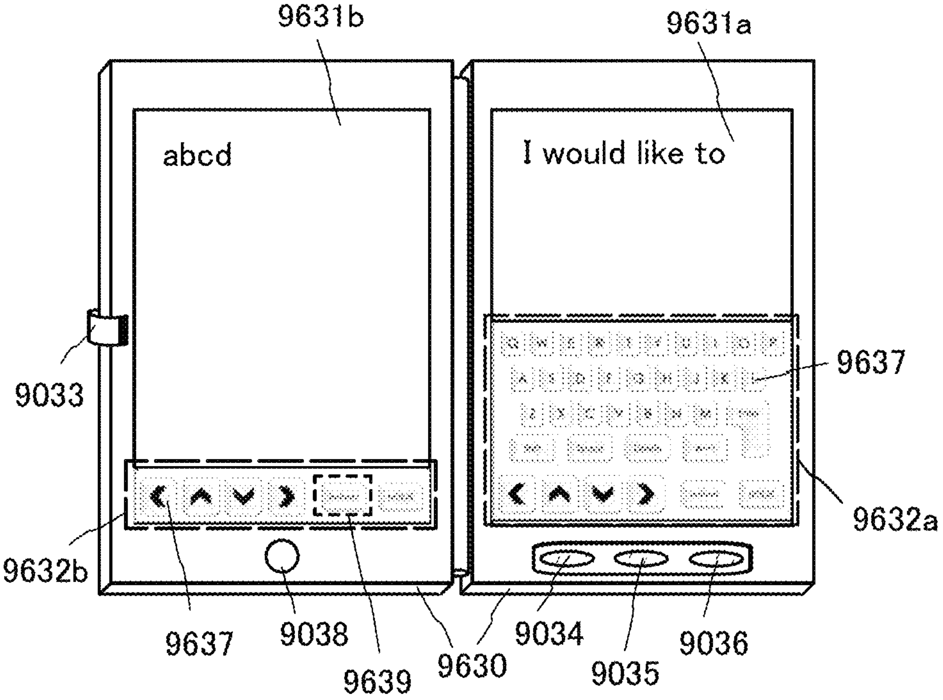
FIGS. 13A to 13C illustrate an electronic device.
Figure 13B:
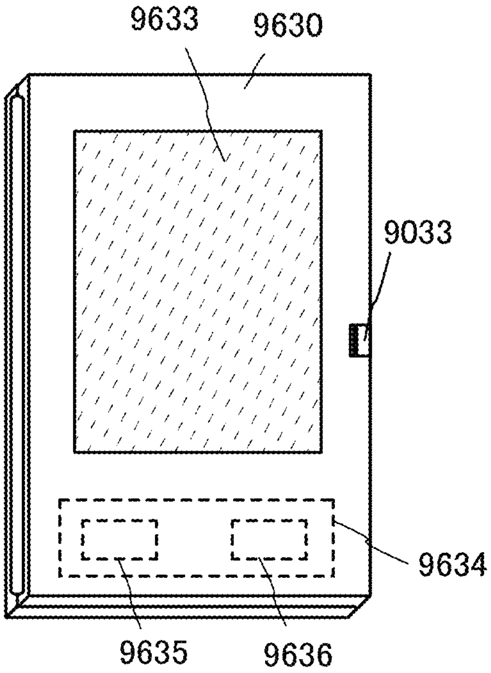

FIGS. 13A and 13B illustrate an example of a foldable tablet terminal. FIG. 13A illustrates the tablet terminal which is unfolded. The tablet terminal includes a housing 9630, a display portion 9631*a*, a display portion 9631*b*, a display mode switch 9034, a power switch 9035, a power-saving mode switch 9036, a clasp 9033, and an operation switch 9038. Note that in the tablet terminal, one of or both the display portion 9631*a* and the display portion 9631*b* is/are formed using a light-emitting device which includes the light-emitting element described in any of Embodiments 1 to 3.

Part of the display portion 9631*a* can be a touchscreen region 9632*a* and data can be input when a displayed operation key 9637 is touched. Although half of the display portion 9631*a* has only a display function and the other half has a touchscreen function, one embodiment of the present invention is not limited to the structure. The whole display portion 9631*a* may have a touchscreen function. For example, a keyboard can be displayed on the entire region of the display portion 9631*a* so that the display portion 9631*a* is used as a touchscreen, and the display portion 9631*b* can be used as a display screen.

Like the display portion 9631*a*, part of the display portion 9631*b* can be a touchscreen region 9632*b*. When a switching button 9639 for showing/hiding a keyboard on the touchscreen is touched with a finger, a stylus, or the like, the keyboard can be displayed on the display portion 9631*b*.

Touch input can be performed in the touchscreen region 9632*a* and the touchscreen region 9632*b* at the same time.

The display mode switch 9034 can switch the display between portrait mode, landscape mode, and the like, and between monochrome display and color display, for example. With the switch 9036 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although FIG. 13A illustrates an example in which the display portion 9631*a* and the display portion 9631*b* have the same display area, one embodiment of the present invention is not limited to the example. The display portion 9631*a* and the display portion 9631*b* may have different display areas and different display quality. For example, higher definition images may be displayed on one of the display portions 9631*a* and 9631*b*.

FIG. 13B illustrates the tablet terminal which is folded. The tablet terminal in this embodiment includes the housing 9630, a solar cell 9633, a charge and discharge control circuit 9634, a battery 9635, and a DC-to-DC converter 9636. Note that FIG. 13B illustrates an example in which the charge and discharge control circuit 9634 includes the battery 9635 and the DC-to-DC converter 9636.

Since the tablet terminal is foldable, the housing 9630 can be closed when the tablet terminal is not in use. As a result, the display portion 9631*a* and the display portion 9631*b* can be protected, thereby providing a tablet terminal with high endurance and high reliability for long-term use.

The tablet terminal illustrated in FIGS. 13A and 13B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touchscreen, the display portion, a video signal processing portion, or the like. Note that the solar cell 9633 is preferably provided on one or two surfaces of the housing 9630, in which case the battery 9635 can be charged efficiently.

Figure 13C:
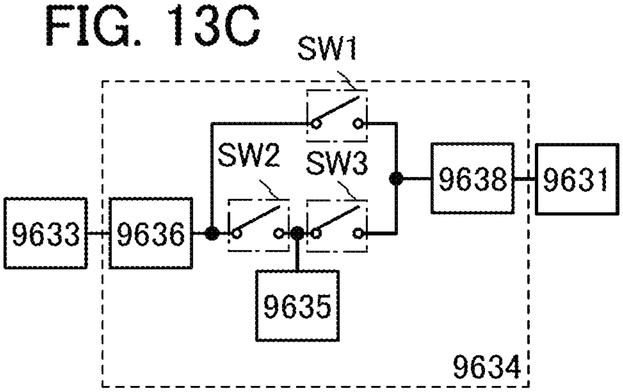

The structure and operation of the charge and discharge control circuit 9634 illustrated in FIG. 13B will be described with reference to a block diagram of FIG. 13C. FIG. 13C illustrates the solar cell 9633, the battery 9635, the DC-to-DC converter 9636, a converter 9638, switches SW1 to SW3, and a display portion 9631. The battery 9635, the DC-to-DC converter 9636, the converter 9638, and the switches SW1 to SW3 correspond to the charge and discharge control circuit 9634 illustrated in FIG. 13B.

First, description is made on an example of the operation in the case where power is generated by the solar cell 9633 with the use of external light. The voltage of the power generated by the solar cell is raised or lowered by the DC-to-DC converter 9636 so as to be voltage for charging the battery 9635. Then, when power from the solar cell 9633 is used for the operation of the display portion 9631, the switch SW1 is turned on and the voltage of the power is raised or lowered by the converter 9638 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation means, the power generation means is not particularly limited, and the battery 9635 may be charged by another power generation means such as a piezoelectric element or a thermoelectric conversion element (Peltier element). The battery 9635 may be charged by a non-contact power transmission module capable of performing charging by transmitting and receiving power wirelessly (without contact), or any of the other charge means used in combination, and the power generation means is not necessarily provided.

One embodiment of the present invention is not limited to the tablet terminal having the shape illustrated in FIGS. 13A to 13C as long as the display portion 9631*a* or 9631*b* is included.

Example 1

In this example, a method for fabricating a light-emitting element which corresponds to one embodiment of the present invention described in any of Embodiments 1 to 3 and the characteristics thereof will be described. Structural formulae of organic compounds used in this example are shown below.

(i)

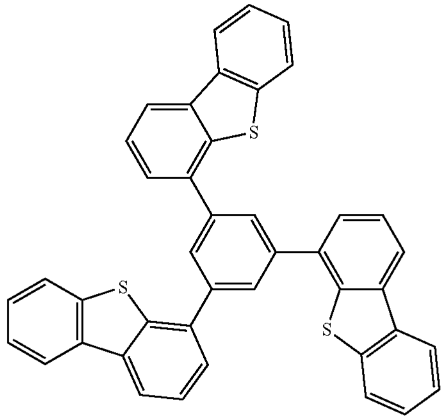

DBT3P-II (ii)

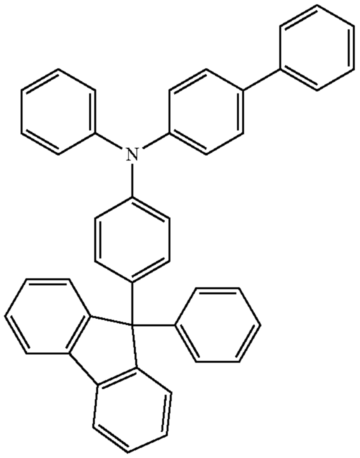

BPAFLP (iii)

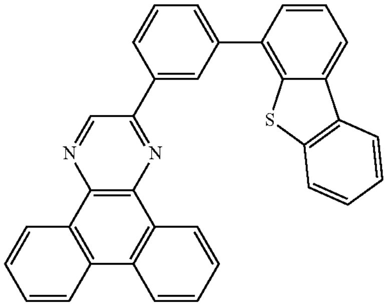

2mDBTPDBq-II

-continued (iv)

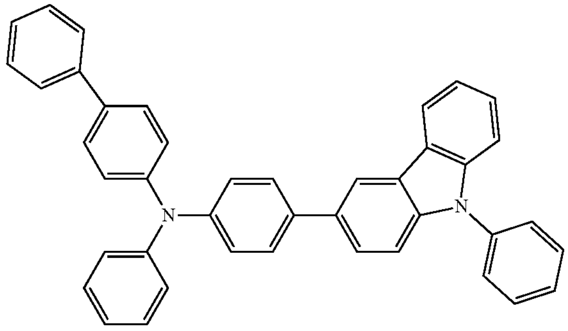

PCBA1BP (v)

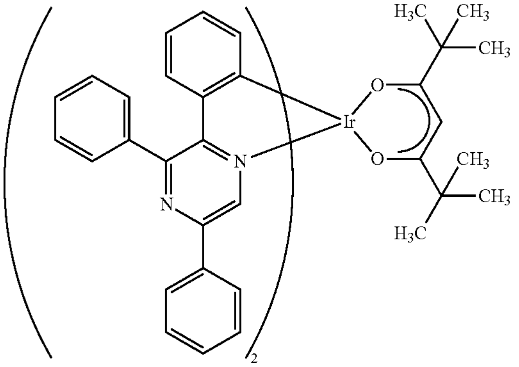

[Ir(tppr)$_2$(dpm)]

(vi)

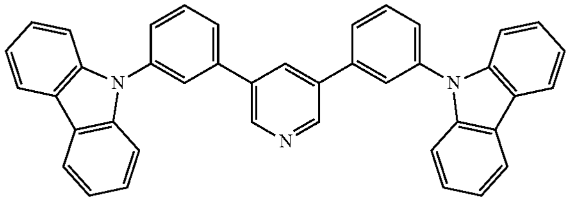

35DCzPPy (vii)

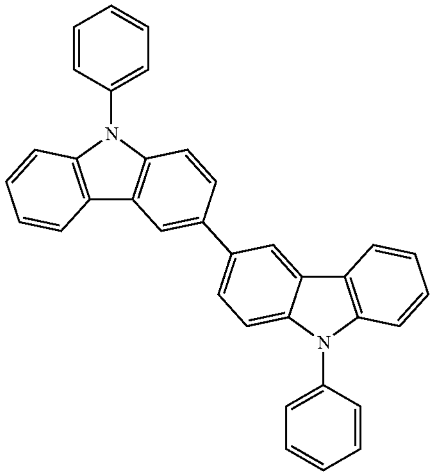

PCCP

-continued (viii)

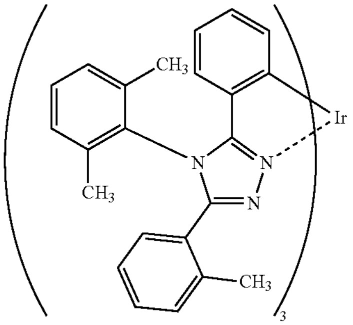

[Ir(mpptz-dmp)$_3$]

(ix)

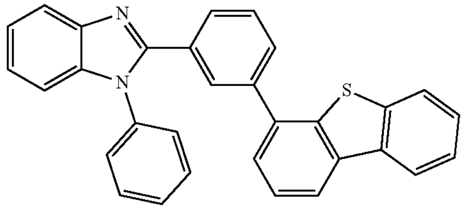

mDBTBIm-II (x)

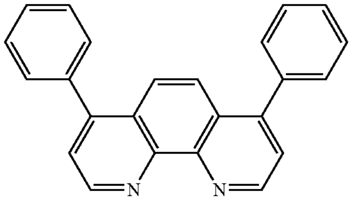

BPhen

Next, a method for fabricating the light-emitting element in this example will be described below.

First, a film of indium oxide-tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 functions as an anode of the light-emitting element.

Next, as pretreatment for forming the light-emitting element over the substrate, UV-ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, over the first electrode 101, 4,4',4"-(benzene-1,3,5-triyl)tri(dibenzothiophene) (abbreviation: DBT3P-II) represented by Structural Formula (i) and molybdenum(VI) oxide were deposited by co-evaporation, so that the hole-injection layer 111 was formed. The thickness of the hole-injection layer 111 was set to 40 nm, and the weight ratio of DBT3P-II to molybdenum oxide was adjusted to 4:2. Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) which is represented by Structural Formula (ii) was formed to a thickness of 20 nm over the hole-injection layer 111 to form the hole-transport layer 112.

Over the hole-transport layer 112, 2-[3-(dibenzothiophen-4-yl)phenyl]dibenzo[f,h]quinoxaline (abbreviation: 2mDBTPDBq-II) represented by Structural Formula (iii), 4-phenyl-4'-(9-phenyl-9H-carbazol-3-yl)triphenylamine (abbreviation: PCBA1BP) represented by Structural Formula (iv), and (2,3,5-triphenylpyrazinato) (dipivaloylmethanato)iridium(III) (abbreviation: $[Ir(tppr)_2(dpm)]$) represented by Structural Formula (v) were deposited by co-evaporation to a thickness of 20 nm with a weight ratio of 2mDBTPDBq-II to PCBA1BP and $[Ir(tppr)_2(dpm)]$ being 0.5:0.5:0.05, so that the second light-emitting layer 113*b* was formed; after that, 3,5-bis[3-(9H-carbazol-9-yl)phenyl] pyridine (abbreviation: 35DCzPPy) represented by Structural Formula (vi), 3,3'-bis(9-phenyl-9H-carbazole) (abbreviation: PCCP) represented by Structural Formula (vii), and tris{2-[5-(2-methylphenyl)-4-(2,6-dimethylphenyl)-4H-1,2,4-triazol-3-yl-κN2]phenyl-κC}iridium(III) (abbreviation: $[Ir(mpptz-dmp)_3]$) represented by Structural Formula (viii) (the compound (1)) were deposited by co-evaporation to a thickness of 30 nm with a weight ratio of 35DCzPPy to PCCP and $[Ir(mpptz-dmp)_3]$ being 0.5:0.5:0.06, so that the first light-emitting layer 113 a was formed.

Then, the electron-transport layer 114 was formed over the light-emitting layer 113 in such a way that a 10-nm-thick film of 2-[3-(dibenzothiophen-4-yl)phenyl]-1-phenyl-1H-benzimidazole (abbreviation: mDBTBIm-II) represented by Structural formula (ix) was formed and a 20-nm-thick film of bathophenanthroline (abbreviation: BPhen) represented by Structural Formula (x) was formed.

After the formation of the electron-transport layer 114, lithium fluoride (LiF) was deposited by evaporation to a thickness of 1 nm, so that the electron-injection layer 115 was formed.

Lastly, aluminum was deposited by evaporation to a thickness of 200 nm to form the second electrode 102 functioning as a cathode. Thus, a light-emitting element 1 in this example was fabricated.

Note that in all the above evaporation steps, evaporation was performed by a resistance-heating method.

Table 1 shows an element structure of the light-emitting element 1 obtained in the above manner.

TABLE 1

| | First electrode | Hole-injection layer | Hole-transport layer | Light-emitting layer | | Electron-transport layer | | Electron-injection layer | Second electrode |
|---|---|---|---|---|---|---|---|---|---|
| Light-emitting element 1 | ITSO (110 nm) | DBT3P-II:MoOx (4:2 40 nm) | BPAFLP (20 nm) | * | ** | mDBTBIm-II (10 nm) | Bphen (20 nm) | LiF (1 nm) | Al (200 nm) |

* 2mDBTPDBq-II:PCBA1BP:$[Ir(tppr)_2(dpm)]$ (0.5:0.5:0.05 20 nm)
** 35DCzPPy:PCCP:$[Ir(mpptz-dmp)_3]$ (0.5:0.5:0.06 30 nm)

The light-emitting element 1 was sealed using a glass substrate in a glove box containing a nitrogen atmosphere so as not to be exposed to the air (specifically, a sealing material was applied onto an outer edge of the element and heat treatment was performed at 80° C. for 1 hour at the time of sealing).

Element characteristics of the light-emitting element were measured. Note that the measurements were carried out at room temperature (in an atmosphere kept at 25° C.).

Figure 14:
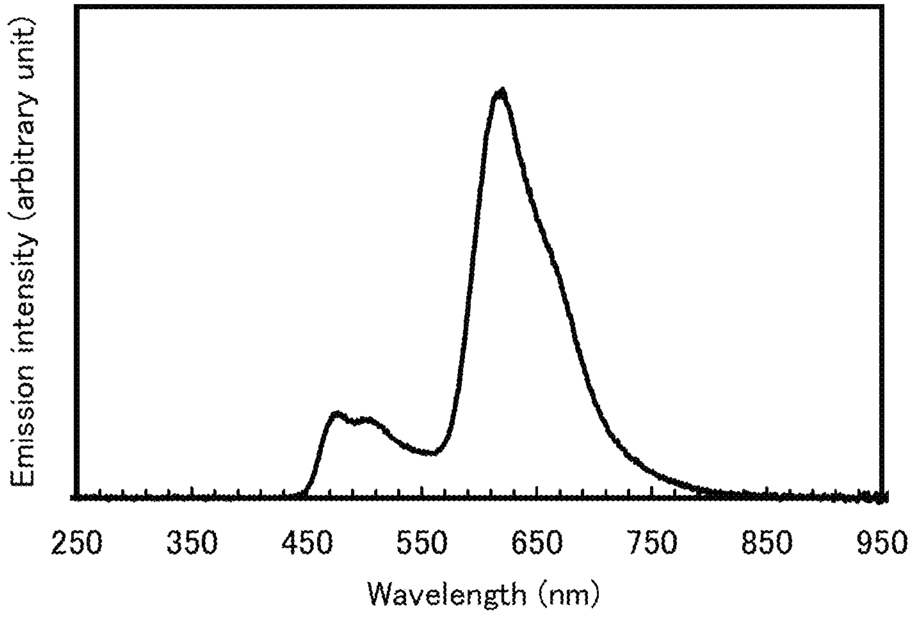
FIG. 14 shows an emission spectrum of a light-emitting element 1.

FIG. 14 shows an emission spectrum of the light-emitting element 1 which was obtained when a current of 0.1 mA was made to flow in the light-emitting element 1. FIG. 14 indicates that the light-emitting element 1 shows an emission spectrum including light with a wavelength in the blue wavelength range which originates from $[Ir(mpptz-dmp)_3]$ and light with a wavelength in the red wavelength range which originates from $[Ir(tppr)_2(dpm)]$.

Figure 15:
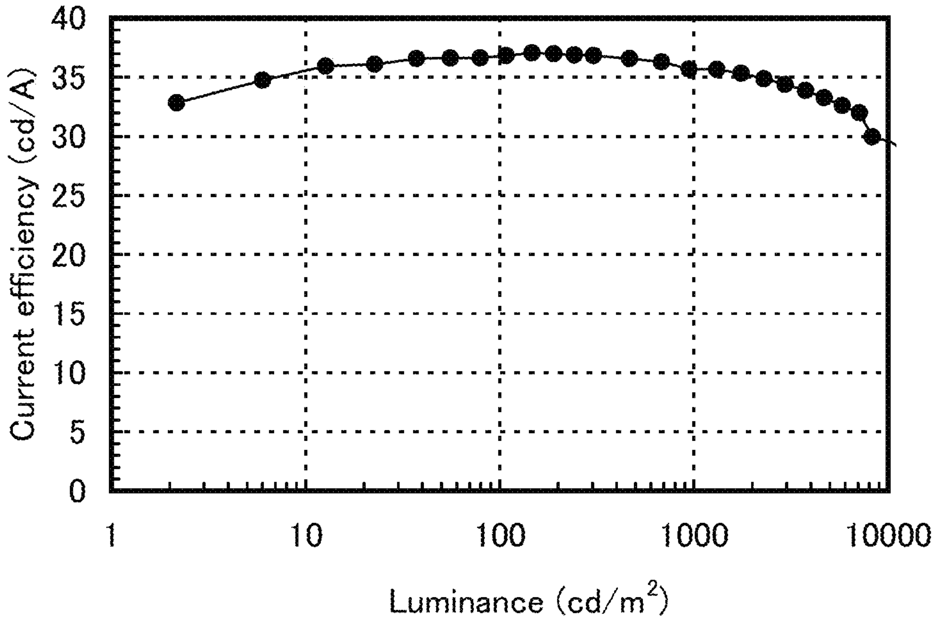
FIG. 15 shows luminance-current efficiency characteristics of the light-emitting element 1.
Figure 16:
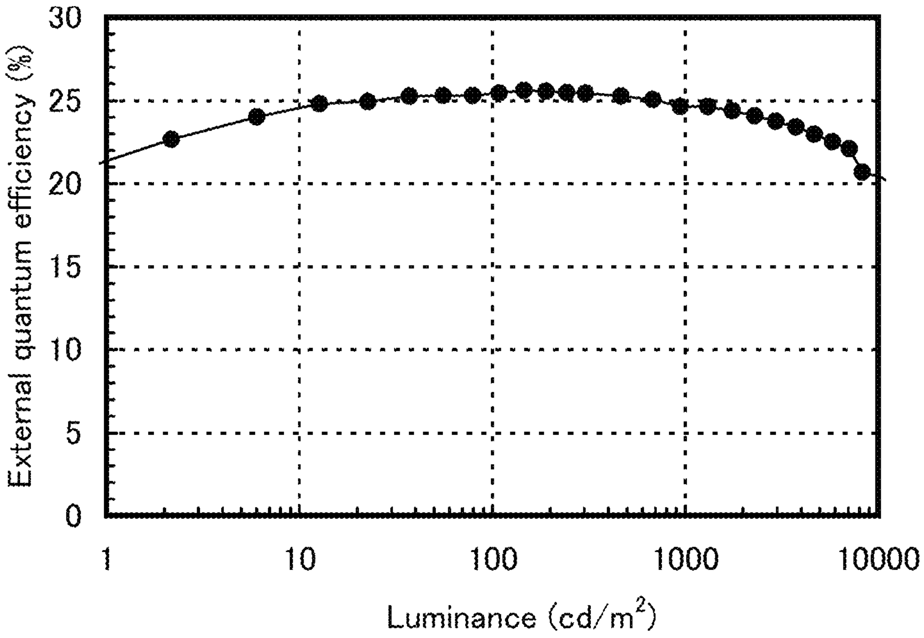
FIG. 16 shows luminance-external quantum efficiency characteristics of the light-emitting element 1.
Figure 17:
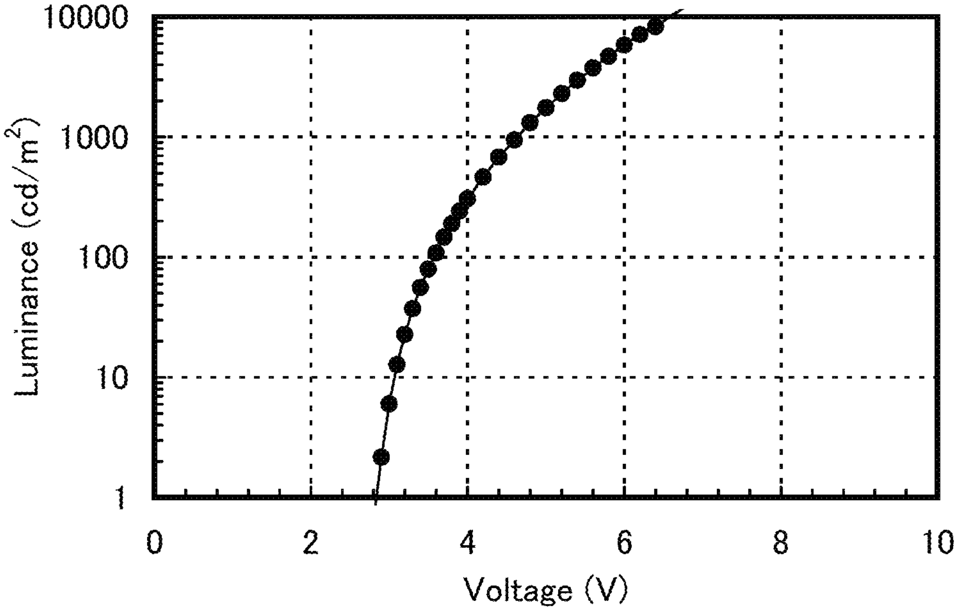
FIG. 17 shows voltage-luminance characteristics of the light-emitting element 1.
Figure 18:
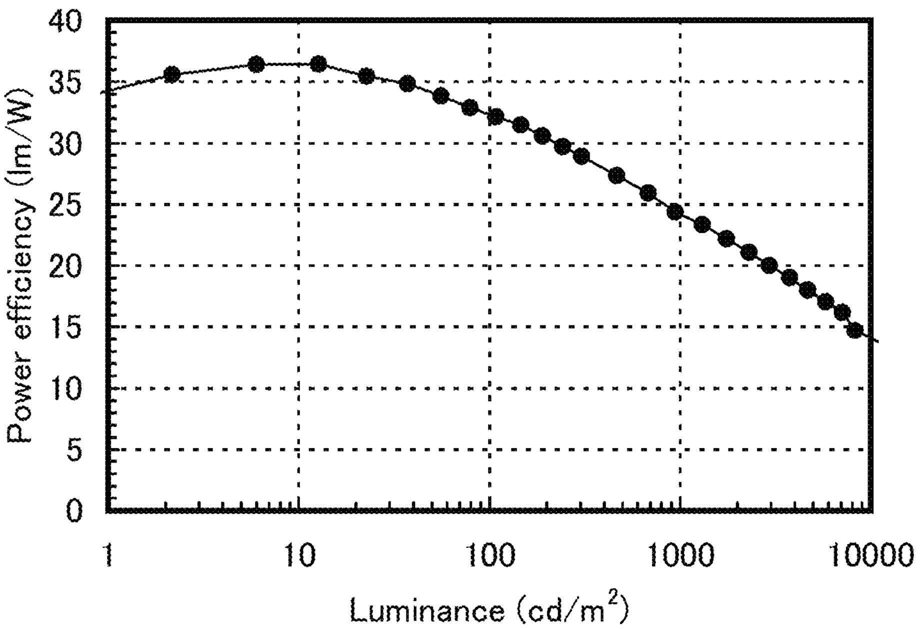
FIG. 18 shows luminance-power efficiency characteristics of the light-emitting element 1.

FIG. 15 shows luminance-current efficiency characteristics of the light-emitting element 1; FIG. 16 shows luminance-external quantum efficiency characteristics thereof, FIG. 17 shows voltage-luminance characteristics thereof; and FIG. 18 shows luminance-power efficiency characteristics thereof. Table 2 shows main characteristics of the light-emitting element 1 at around 1000 cd/$m^2$.

TABLE 2

| | Voltage (V) | Current (mA) | Current density (mA/$cm^2$) | Chromaticity (x, y) | Current efficiency (cd/A) | Power efficiency (lm/W) | External quantum efficiency (%) |
|---|---|---|---|---|---|---|---|
| Light-emitting element 1 | 4.6 | 0.11 | 2.6 | (0.53, 0.36) | 36 | 24 | 25 |

From the above, the light-emitting element 1 turned out to have excellent element characteristics. In particular, as can be seen from FIG. 15 and FIG. 16, the light-emitting element 1 has extremely high emission efficiency and has a high external quantum efficiency of 25% at around a practical luminance (1000 cd/$m^2$). Further, FIG. 17 shows that the light-emitting element 1 has favorable voltage-luminance characteristics, and is driven at a low voltage. Thus, as is clear from FIG. 18, the light-emitting element 1 has favorable power efficiency.

The above shows that the light-emitting element 1 corresponding to one embodiment of the present invention has excellent element characteristics and provides lights from two kinds of emission center substances in a good balance.

Example 2

In this example, a method for fabricating a light-emitting element which corresponds to one embodiment of the present invention described in Embodiments 1 to 3 and the characteristics thereof will be described. Structural formulae of organic compounds used in this example are shown below. In this example, a light-emitting element 2 and a light-emitting element 3 in each of which the light-emitting layer 113 includes the first light-emitting layer 113*a*, the second light-emitting layer 113*b*, and the third light-emitting layer 113*c* were fabricated.

(i)

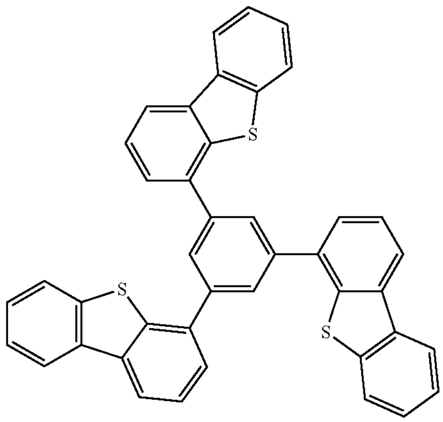

DBT3P-II (ii)

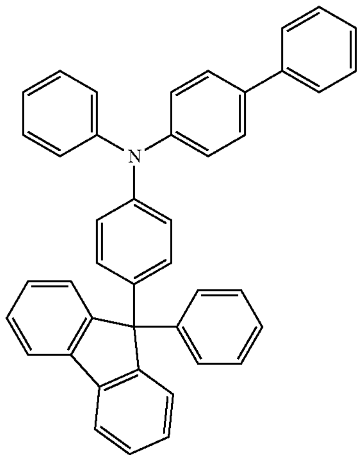

BPAFLP

-continued (iii)

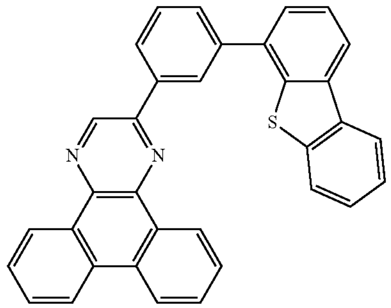

2mDBTPDBq-II (iv)

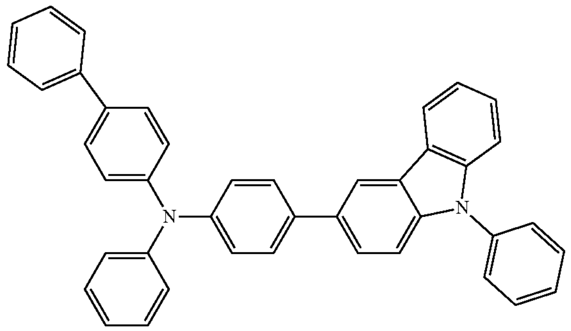

PCBA1BP (v)

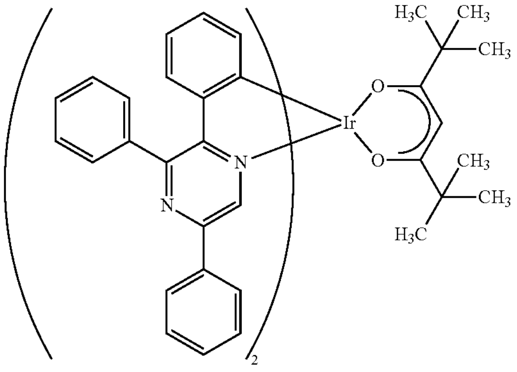

[Ir(tppr)2(dpm)]

(xi)

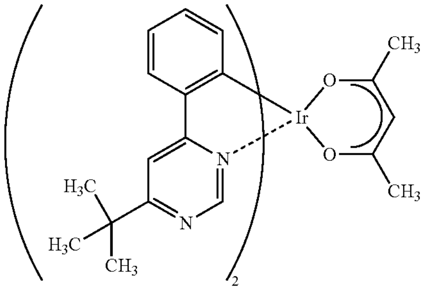

[Ir(tBuppm)2(acac)]

-continued (vi)

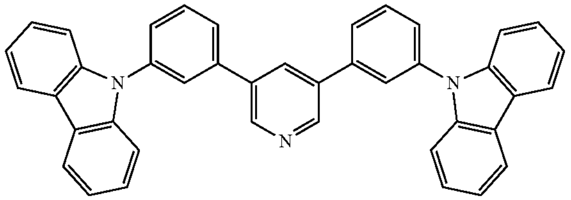

35DCzPPy (vii)

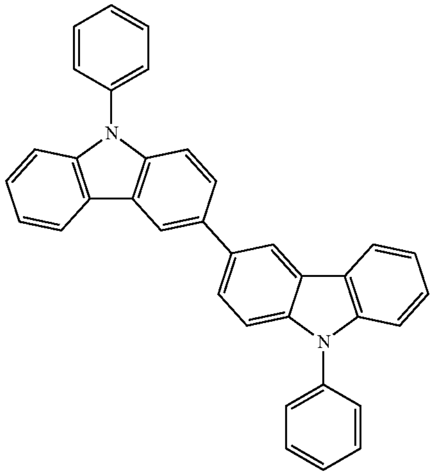

PCCP (viii)

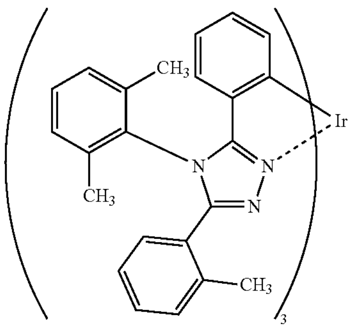

[Ir(mpptz-dmp)3]

(ix)

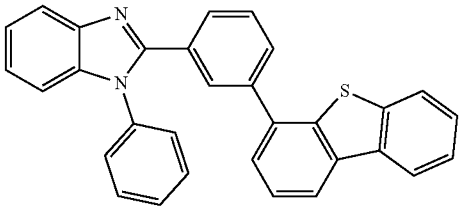

mDBTBIm-II (x)

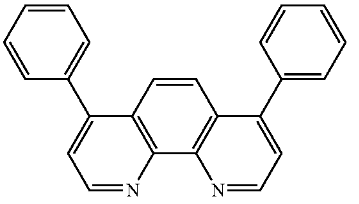

BPhen

Next, a method for fabricating the light-emitting element 2 in this example will be described below.

First, a film of indium oxide-tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 functions as an anode of the light-emitting element.

Next, as pretreatment for forming the light-emitting element over the substrate, UV-ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, over the first electrode 101, DBT3P-II and molybdenum(VI) oxide were deposited by co-evaporation by an evaporation method using resistance heating, so that the hole-injection layer 111 was formed. The thickness of the hole-injection layer 111 was set to 40 nm, and the weight ratio of DBT3P-II to molybdenum oxide was adjusted to 4:2. Note that the co-evaporation method refers to an evaporation method in which evaporation is carried out from a plurality of evaporation sources at the same time in one treatment chamber.

Next, a film of BPAFLP was formed to a thickness of 20 nm over the hole-injection layer 111 to form the hole-transport layer 112.

Over the hole-transport layer 112, 2mDBTPDBq-II, PCBA1BP, and [Ir(tppr)$_2$(dpm)] were deposited by co-evaporation to a thickness of 10 nm with a weight ratio of 2mDBTPDBq-II to PCBA1BP and [Ir(tppr)$_2$(dpm)] being 0.5:0.5:0.05, so that the third light-emitting layer 113*c* was formed; then, 2mDBTPDBq-II, PCBA1BP, and (acetylacetonato)bis(6-tert-butyl-4-phenylpyrimidinato)iridium(III) (abbreviation: [Ir(tBuppm)$_2$(acac)]) represented by Structural Formula (xi) were deposited by co-evaporation to a thickness of 5 nm with a weight ratio of 2mDBTPDBq-II to PCBA1BP and [Ir(tBuppm)$_2$(acac)] being 0.5:0.5:0.05, so that the second light-emitting layer 113*b* was formed; after that, 35DCzPPy, PCCP, and [Ir(mpptz-dmp)$_3$] were deposited by co-evaporation to a thickness of 30 nm with a weight ratio of 35DCzPPy to PCCP and [Ir(mpptz-dmp)$_3$] being 0.5:0.5:0.06, so that the first light-emitting layer 113 a was formed.

Then, the electron-transport layer 114 was formed over the light-emitting layer 113 in such a way that a 10-nm-thick film of mDBTBIm-II was formed and a 20-nm-thick film of BPhen was formed.

After the formation of the electron-transport layer 114, lithium fluoride (LiF) was deposited by evaporation to a thickness of 1 nm, so that the electron-injection layer 115 was formed.

Lastly, aluminum was deposited by evaporation to a thickness of 200 nm to form the second electrode 102 functioning as a cathode. Thus, the light-emitting element 2 in this example was fabricated.

Note that in all the above evaporation steps, evaporation was performed by a resistance-heating method.

Next, a method for fabricating the light-emitting element 3 will be described. The light-emitting element 3 was fabricated in such a manner that the thickness of the second light-emitting layer 113*b* in the light-emitting element 2 was changed from 5 nm to 10 nm. The other structures are the same as those of the light-emitting element 2.

Table 3 shows element structures of the light-emitting element 2 and the light-emitting element 3 obtained in the above manner.

TABLE 3

| | First electrode | Hole-injection layer | Hole-transport layer | Light-emitting layer | | | Electron-transport layer | | Electron-injection layer | Second electrode |
|---|---|---|---|---|---|---|---|---|---|---|
| Light-emitting element 2 | ITSO (110 nm) | DBT3P-II:MoOx (4:2 40 nm) | BPAFLP (20 nm) | * | ** | *** | mDBTBIm-II (10 nm) | Bphen (20 nm) | LiF (1 nm) | Al (200 nm) |
| Light-emitting element 3 | ITSO (110 nm) | DBT3P-II:MoOx (4:2 40 nm) | BPAFLP (20 nm) | * | **** | *** | mDBTBIm-II (10 nm) | Bphen (20 nm) | LiF (1 nm) | Al (200 nm) |

* 2mDBTPDBq-II:PCBA1BP:[Ir(tppr)$_2$(dpm)] (0.5:0.5:0.05 10 nm)
** 2mDBTPDBq-II:PCBA1BP:[Ir(tBuppm)$_2$(acac)] (0.5:0.5:0.05 5 nm)
*** 35DCzPPy:PCCP:[Ir(mpptz-dmp)$_3$] (0.5:0.5:0.06 30 nm)
**** 2mDBTPDBq-II:PCBA1BP:[Ir(tBuppm)$_2$(acac)] (0.5:0.5:0.05 10 nm)

The light-emitting element 2 and the light-emitting element 3 were sealed using a glass substrate in a glove box containing a nitrogen atmosphere so as not to be exposed to the air (specifically, a sealing material was applied onto an outer edge of the element and heat treatment was performed at 80° C. for 1 hour at the time of sealing).

Element characteristics of the light-emitting elements were measured. Note that the measurements were carried out at room temperature (in an atmosphere kept at 25° C.).

Figure 19:
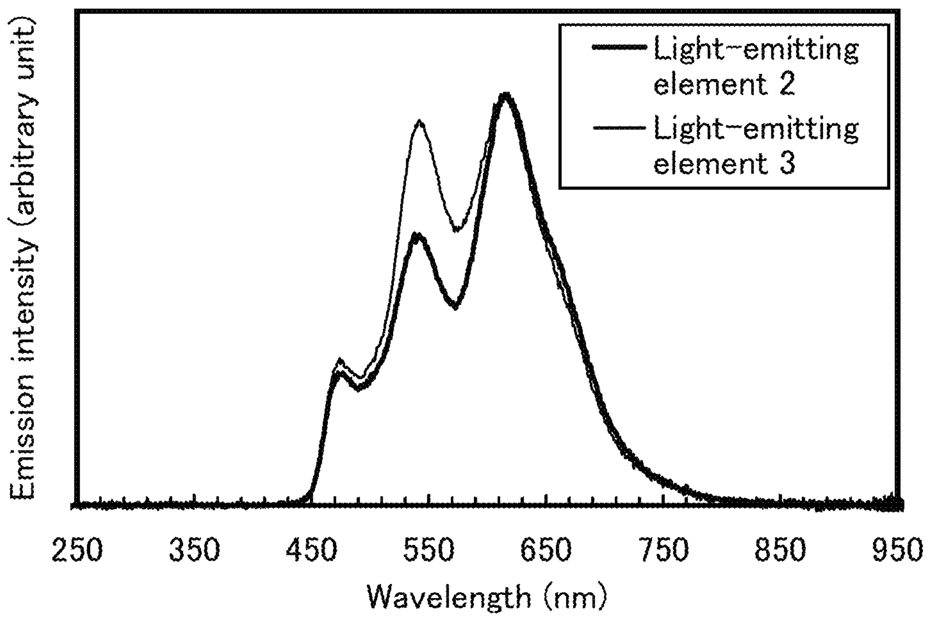
FIG. 19 shows emission spectra of a light-emitting element 2 and a light-emitting element 3.

FIG. 19 shows emission spectra of the light-emitting element 2 and the light-emitting element 3 which were obtained when a current of 0.1 mA was made to flow in the light-emitting element 2 and the light-emitting element 3. FIG. 19 indicates that the light-emitting element 2 and the light-emitting element 3 show emission spectra each including light with a wavelength in the blue wavelength range which originates from [Ir(mpptz-dmp)$_3$], light with a wavelength in the green wavelength range which originates from [Ir(tBuppm)$_2$(acac)], and light with a wavelength in the red wavelength range which originates from [Ir(tppr)$_2$(dpm)]. In particular, the light-emitting element 2 emits light that meets the standards defined by JIS.

Figure 20:
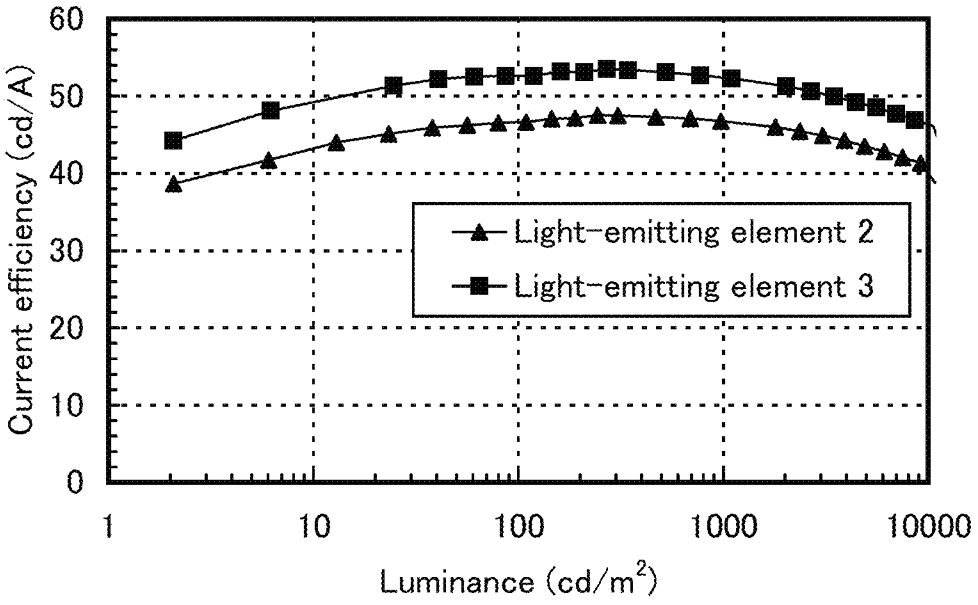
FIG. 20 shows luminance-current efficiency characteristics of the light-emitting element 2 and the light-emitting element 3.
Figure 21:
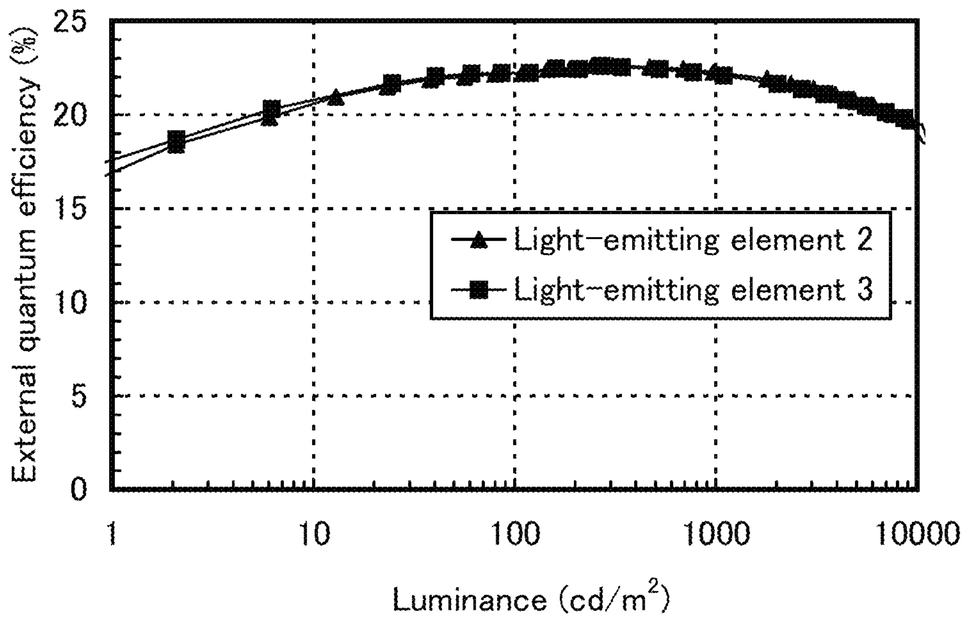
FIG. 21 shows luminance-external quantum efficiency characteristics of the light-emitting element 2 and the light-emitting element 3.
Figure 22:
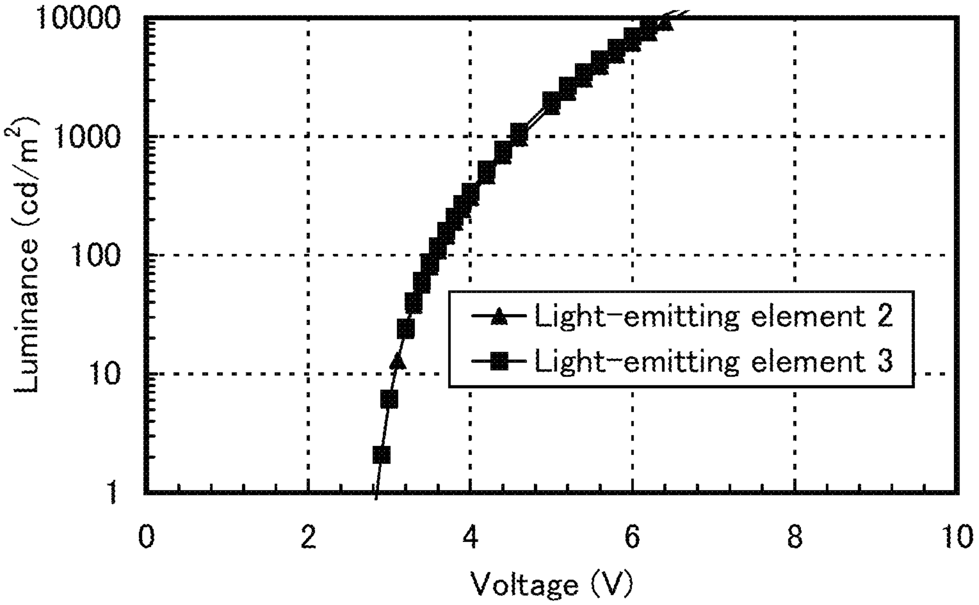
FIG. 22 shows voltage-luminance characteristics of the light-emitting element 2 and the light-emitting element 3.
Figure 23:
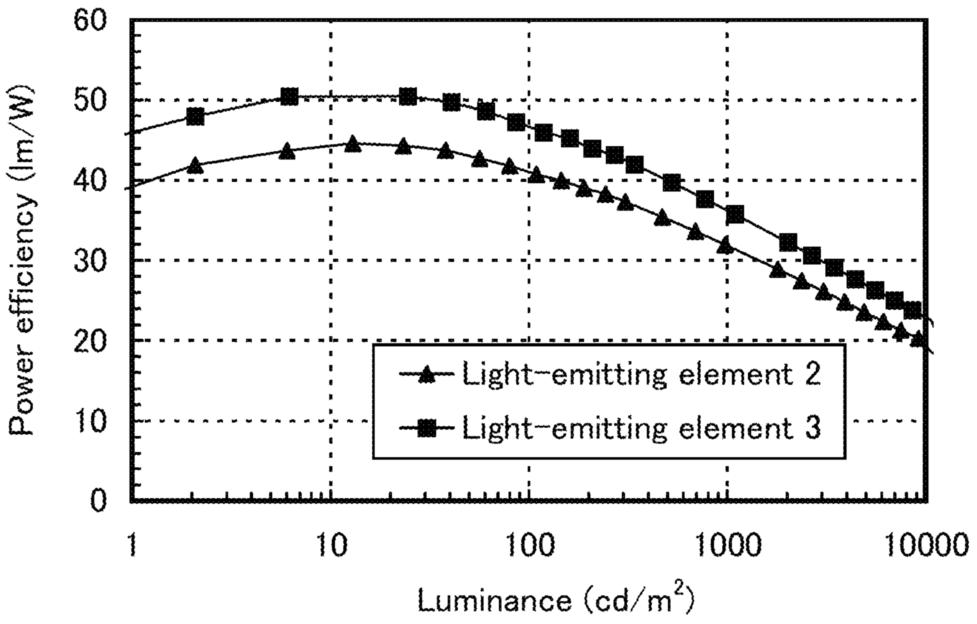
FIG. 23 shows luminance-power efficiency characteristics of the light-emitting element 2 and the light-emitting element 3.

FIG. 20 shows luminance-current efficiency characteristics of the light-emitting element 2 and the light-emitting element 3; FIG. 21 shows luminance-external quantum efficiency characteristics thereof, FIG. 22 shows voltage-luminance characteristics thereof, and FIG. 23 shows luminance-power efficiency characteristics thereof. Table 4 shows main characteristics of the light-emitting element 2 and the light-emitting element 3 at around 1000 cd/m$^2$.

TABLE 4

| | Voltage (V) | Current (mA) | Current density (mA/cm$^2$) | Chromaticity (x, y) | Current efficiency (cd/A) | Power efficiency (lm/W) | External quantum efficiency (%) |
|---|---|---|---|---|---|---|---|
| Light-emitting element 2 | 4.6 | 0.083 | 2.1 | (0.46, 0.44) | 47 | 32 | 22 |
| Light-emitting element 3 | 4.6 | 0.084 | 2.1 | (0.44, 0.46) | 52 | 36 | 22 |

From the above, the light-emitting element 2 and the light-emitting element 3 turned out to have excellent element characteristics. In particular, as can be seen from FIG. 20 and FIG. 21, the light-emitting element 2 and the light-emitting element 3 each have extremely high emission efficiency and have a high external quantum efficiency exceeding 20% at around a practical luminance (1000 cd/m$^2$). Further, FIG. 22 shows that the light-emitting element 2 and the light-emitting element 3 have favorable voltage-luminance characteristics, and are driven at a low voltage. Thus, as is clear from FIG. 23, the light-emitting element 2 and the light-emitting element 3 have favorable power efficiency.

The above shows that the light-emitting element 2 and the light-emitting element 3 each corresponding to one embodiment of the present invention have favorable element characteristics and provide lights from three kinds of emission center substances in a good balance.

Example 3

In this example, a method for fabricating a light-emitting element which corresponds to one embodiment of the present invention described in any of Embodiments 1 to 3 and the characteristics thereof will be described. Structural formulae of organic compounds used in this example are shown below. In this example, a light-emitting element 4 in which the light-emitting layer 113 includes the first light-emitting layer 113*a*, the second light-emitting layer 113*b*, and the third light-emitting layer 113*c* was fabricated.

-continued
(i)
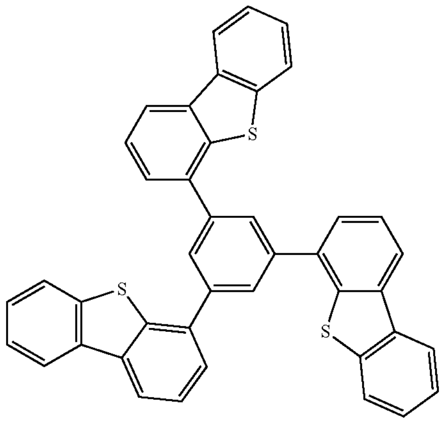
DBT3P-II
(xiii)
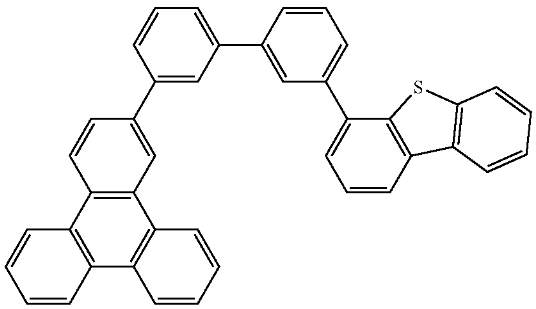
2mDBTBPDBq-II
(xii)
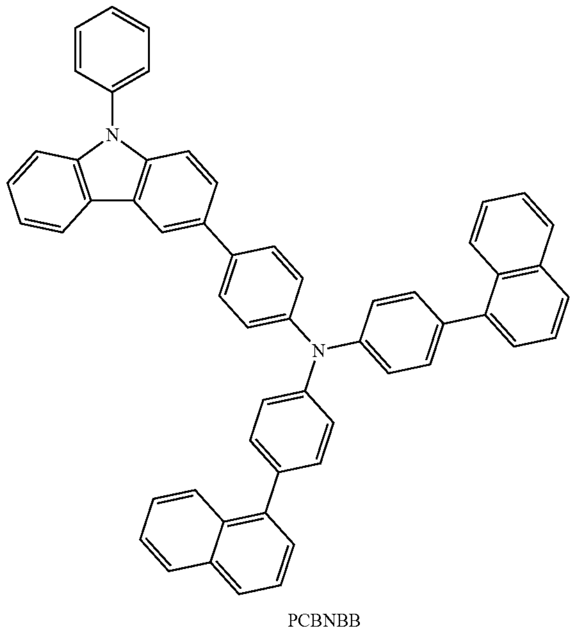
PCBNBB
(v)
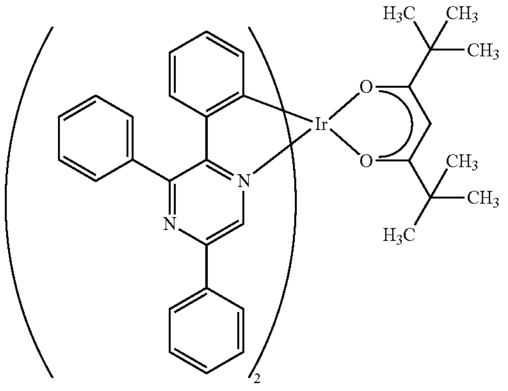
[Ir(tppr)$_2$(dpm)]
(xi)
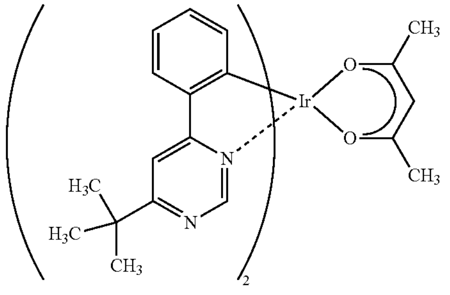
[Ir(tBuppm)$_2$(acac)]
(vi)
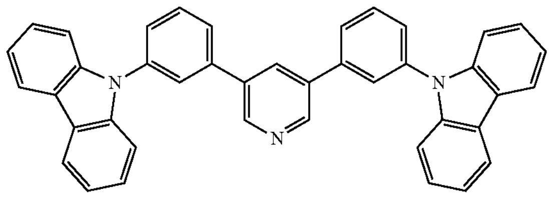
35DCzPPy
(vii)
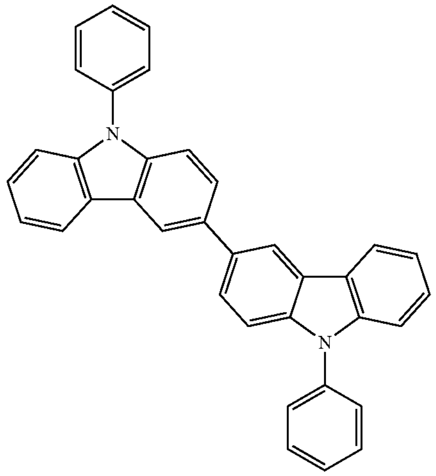
PCCP -continued (viii)

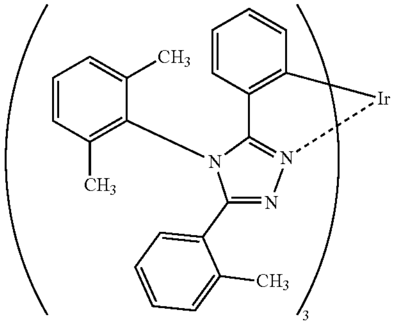

[Ir(mpptz-dmp)3]

(x)

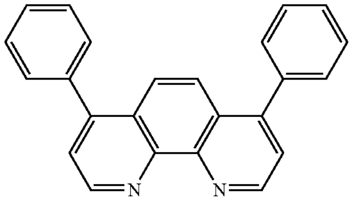

BPhen

Next, a method for fabricating the light-emitting element 4 in this example will be described below.

First, a film of indium oxide-tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 functions as an anode of the light-emitting element.

Next, as pretreatment for forming the light-emitting element over the substrate, UV-ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

thickness of the hole-injection layer 111 was set to 40 nm, and the weight ratio of DBT3P-II to molybdenum oxide was adjusted to 4:2. Note that the co-evaporation method refers to an evaporation method in which evaporation is carried out from a plurality of evaporation sources at the same time in one treatment chamber.

Next, a film of 4,4'-di(1-naphthyl)-4"-(9-phenyl-9H-carbazol-3-yl)triphenylamine (PCBNBB)] which is represented by Structural Formula (xii) was formed to a thickness of 20 nm over the hole-injection layer 111 to form the hole-transport layer 112.

Over the hole-transport layer 112, 2-[3'-(dibenzothiophen-4-yl)biphenyl-3-yl]dibenzo[f,h]quinoxaline (abbreviation: 2mDBTBPDBq-II) represented by Structural Formula (xiii), PCBNBB, and [Ir(tppr)$_2$(dpm)] were deposited by co-evaporation to a thickness of 20 nm with a weight ratio of 2mDBTBPDBq-II to PCBNBB and [Ir(tppr)$_2$(dpm)] being 0.5:0.5:0.05, so that the third light-emitting layer 113*c* was formed; then, 2mDBTBPDBq-II, PCBNBB, and [Ir(tBuppm)$_2$(acac)] were deposited by co-evaporation to a thickness of 10 nm with a weight ratio of 2mDBTBPDBq-II to PCBNBB and [Ir(tBuppm)$_2$(acac)] being 0.5:0.5:0.05, so that the second light-emitting layer 113*b* was formed; after that, 35DCzPPy, PCCP, and [Ir(mpptz-dmp)$_3$] were deposited by co-evaporation to a thickness of 30 nm with a weight ratio of 35DCzPPy to PCCP and [Ir(mpptz-dmp)$_3$] being 0.7:0.3:0.06, so that the first light-emitting layer 113 a was formed.

Then, the electron-transport layer 114 was formed over the light-emitting layer 113 in such a way that a 10-nm-thick film of 35DCzPPy was formed and a 20-nm-thick film of BPhen was formed.

After the formation of the electron-transport layer 114, lithium fluoride (LiF) was deposited by evaporation to a thickness of 1 nm, so that the electron-injection layer 115 was formed.

Lastly, aluminum was deposited by evaporation to a thickness of 200 nm to form the second electrode 102 functioning as a cathode. Thus, the light-emitting element 4 in this example was fabricated.

Note that in all the above evaporation steps, evaporation was performed by a resistance-heating method.

Table 5 shows an element structure of the light-emitting element 4 obtained in the above manner.

TABLE 5

| | First electrode | Hole-injection layer | Hole-transport layer | Light-emitting layer | | | Electron-transport layer | | Electron-injection layer | Second electrode |
|---|---|---|---|---|---|---|---|---|---|---|
| Light-emitting element 4 | ITSO (110 nm) | DBT3P-II:MoOx (4:2 40 nm) | PCBNBB (20 nm) | * | ** | *** | 35DCzPPy (10 nm) | Bphen (20 nm) | LiF (1 nm) | Al (200 nm) |

* 2mDBTBPDBq-II:PCBNBB:[Ir(tppr)$_2$(dpm)] (0.5:0.5:0.05 20 nm)

** 2mDBTBPDBq-II:PCBNBB:[Ir(tBuppm)$_2$(acac)] (0.5:0.5:0.05 10 nm)

*** 35DCzPPy:PCCP:[Ir(mpptz-dmp)$_3$] (0.7:0.3:0.06 30 nm)

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, over the first electrode 101, DBT3P-II and molybdenum(VI) oxide were deposited by co-evaporation by an evaporation method using resistance heating, so that the hole-injection layer 111 was formed. The The light-emitting element 4 was sealed using a glass substrate in a glove box containing a nitrogen atmosphere so as not to be exposed to the air (specifically, a sealing material was applied onto an outer edge of the element and heat treatment was performed at 80° C. for 1 hour at the time of sealing).

Element characteristics of the light-emitting element were measured. Note that the measurements were carried out at room temperature (in an atmosphere kept at 25° C.).

Figure 24:
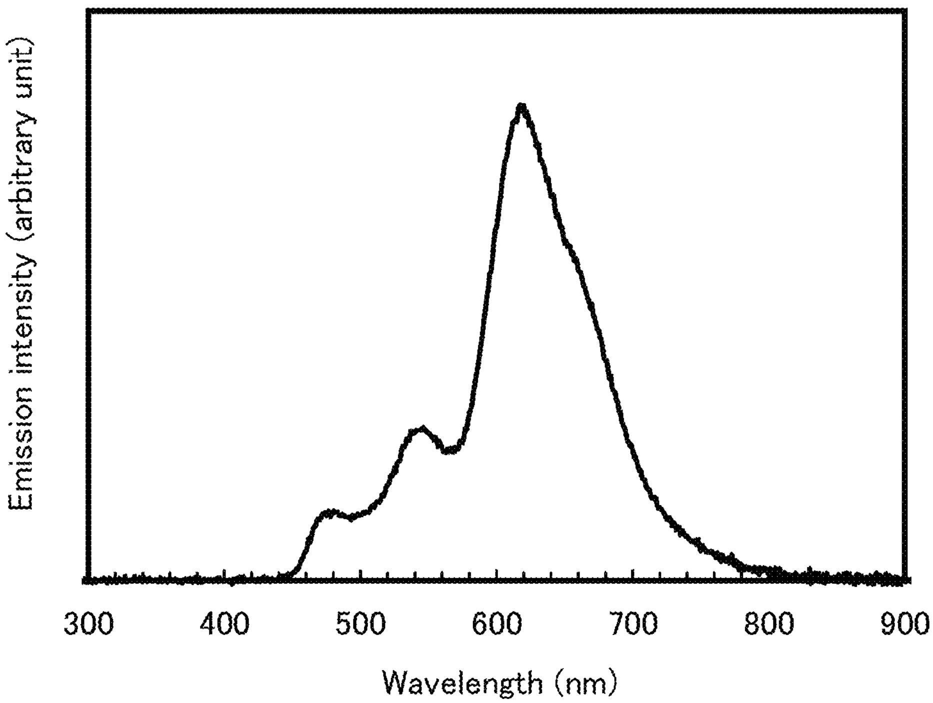
FIG. 24 shows an emission spectrum of a light-emitting element 4.

FIG. 24 shows an emission spectrum of the light-emitting element 4 which was obtained when a current of 0.1 mA was made to flow in the light-emitting element 4. FIG. 24 indicates that the light-emitting element 4 shows an emission spectrum including light with a wavelength in the blue wavelength range which originates from $[Ir(mpptz\text{-}dmp)_3]$, light with a wavelength in the green wavelength range which originates from $[Ir(tBuppm)_2(acac)]$, and light with a wavelength in the red wavelength range which originates from $[Ir(tppr)_2(dpm)]$.

Figure 25:
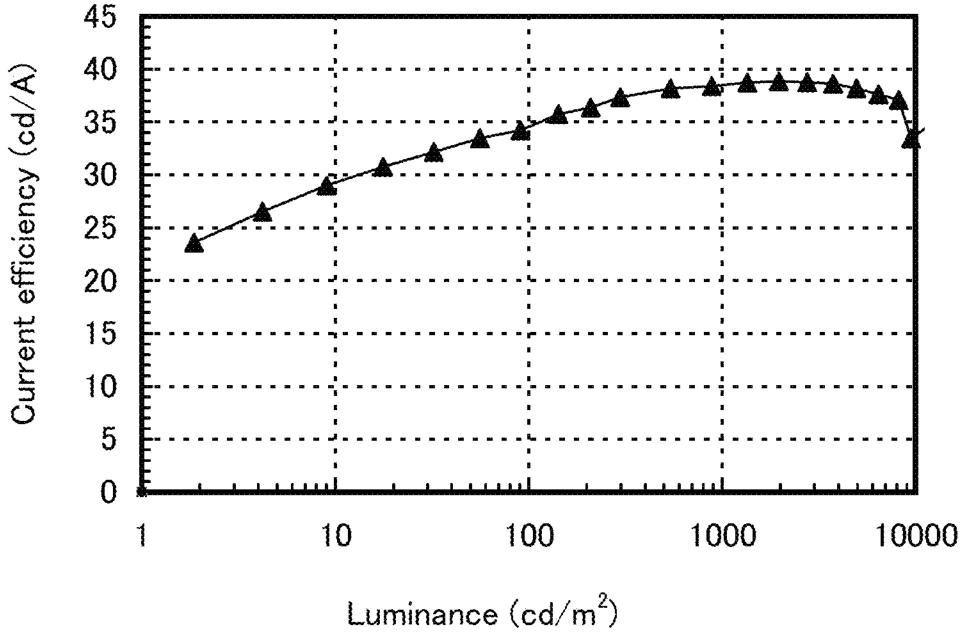
FIG. 25 shows luminance-current efficiency characteristics of the light-emitting element 4.
Figure 26:
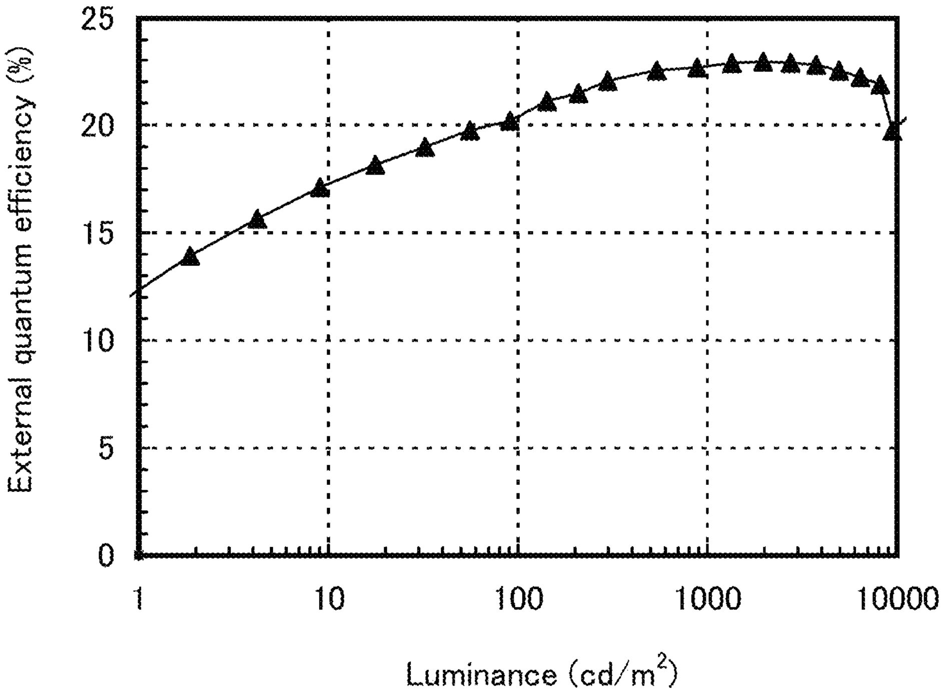
FIG. 26 shows luminance-external quantum efficiency characteristics of the light-emitting element 4.
Figure 27:
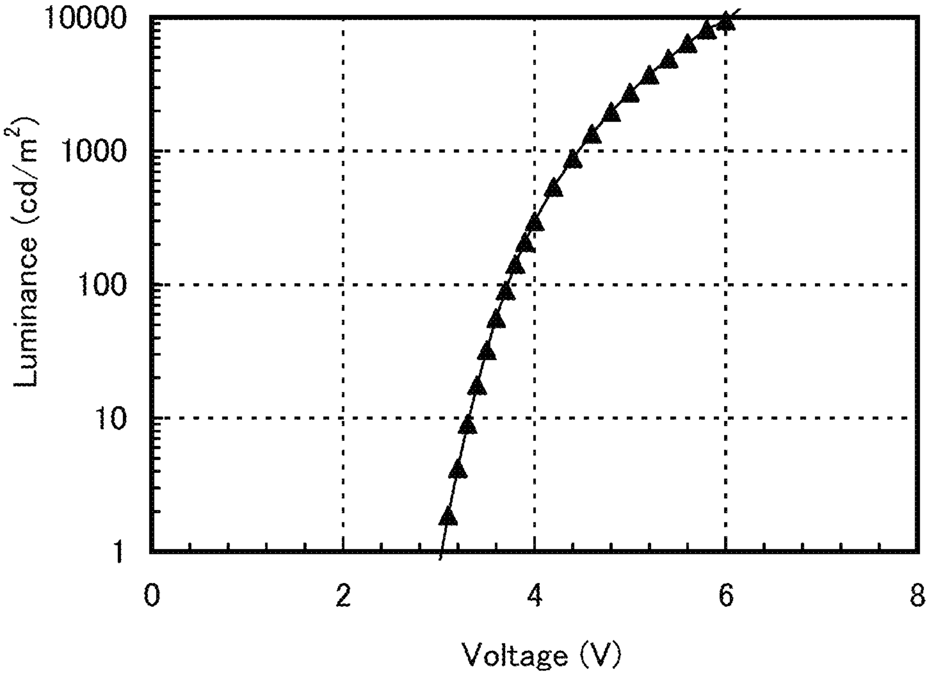
FIG. 27 shows voltage-luminance characteristics of the light-emitting element 4.
Figure 28:
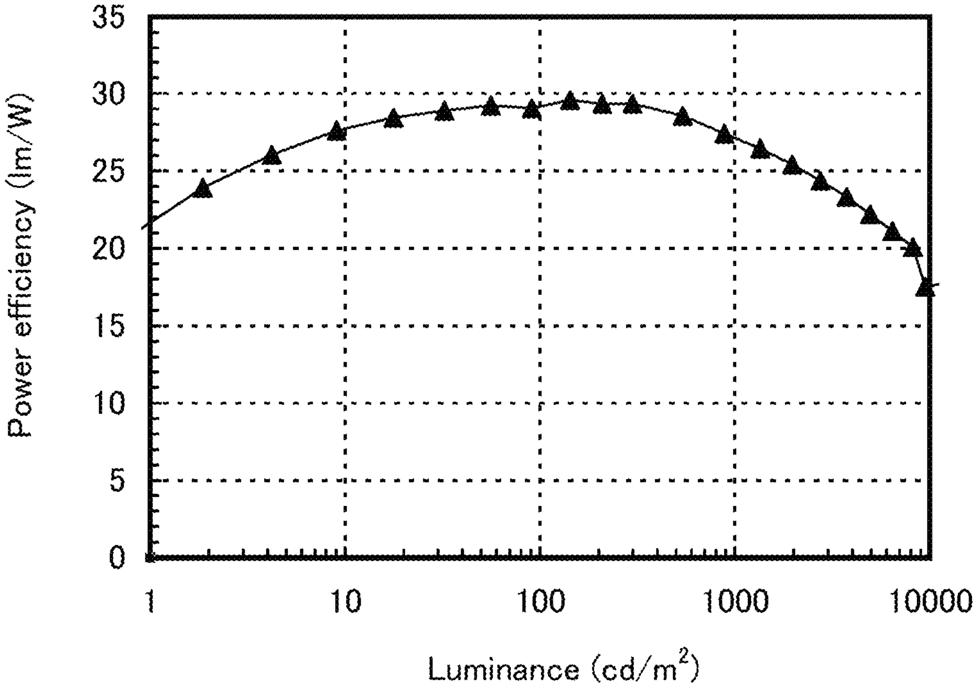
FIG. 28 shows luminance-power efficiency characteristics of the light-emitting element 4.

FIG. 25 shows luminance-current efficiency characteristics of the light-emitting element 4; FIG. 26 shows luminance-external quantum efficiency characteristics thereof, FIG. 27 shows voltage-luminance characteristics thereof; and FIG. 28 shows luminance-power efficiency characteristics thereof. Table 6 shows main characteristics of the light-emitting element 4 at around 1000 cd/$m^2$.

TABLE 6

| | Voltage (V) | Current (mA) | Current density (mA/$cm^2$) | Chromaticity (x, y) | Current efficiency (cd/A) | Power efficiency (lm/W) | External quantum efficiency (%) |
|---|---|---|---|---|---|---|---|
| Light-emitting element 4 | 4.4 | 0.092 | 2.3 | (0.53, 0.41) | 38 | 27 | 23 |

From the above, the light-emitting element 4 turned out to have excellent element characteristics. In particular, as can be seen from FIG. 25 and FIG. 26, the light-emitting element 4 has extremely high emission efficiency and has a high external quantum efficiency exceeding 20% at around a practical luminance (1000 cd/$m^2$). Further, FIG. 27 shows that the light-emitting element 4 has favorable voltage-luminance characteristics, and is driven at a low voltage. Thus, as is clear from FIG. 28, the light-emitting element 4 has favorable power efficiency.

The above shows that the light-emitting element 4 corresponding to one embodiment of the present invention has favorable element characteristics and provides lights from three kinds of emission center substances in a good balance.

Figure 29:
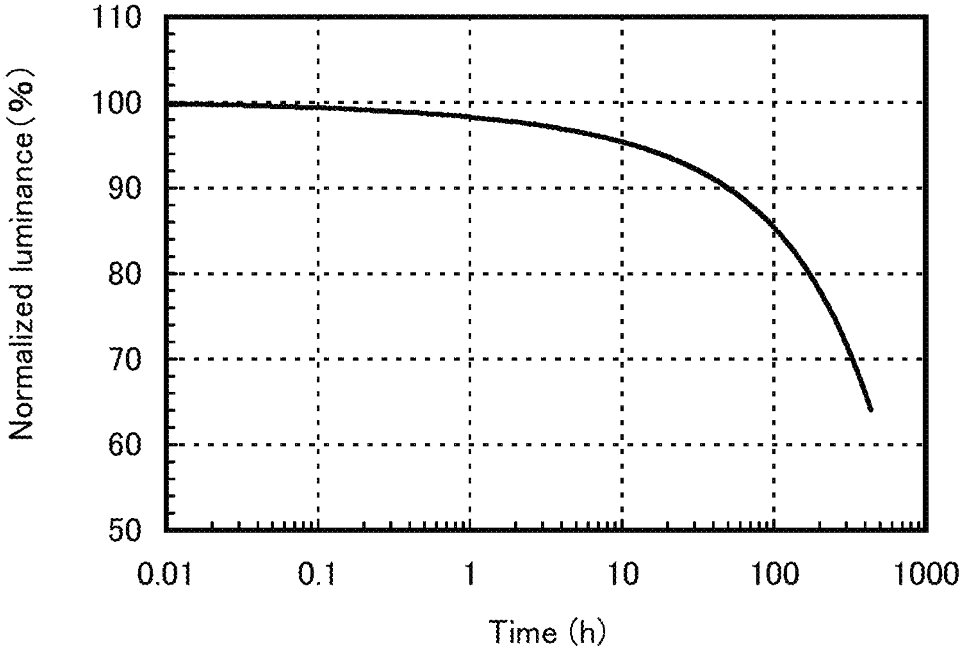
FIG. 29 shows time dependence of normalized luminance of the light-emitting element 4.
Figure 30:
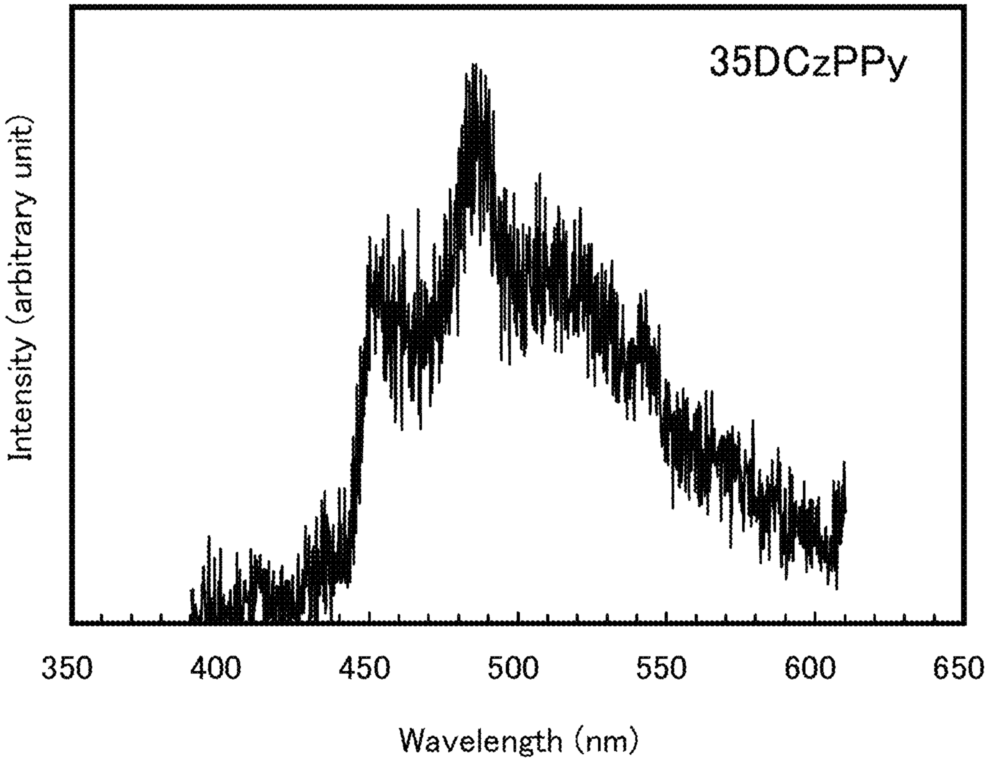
FIG. 30 shows a phosphorescent spectrum of 35DCzPPy.
Figure 31:
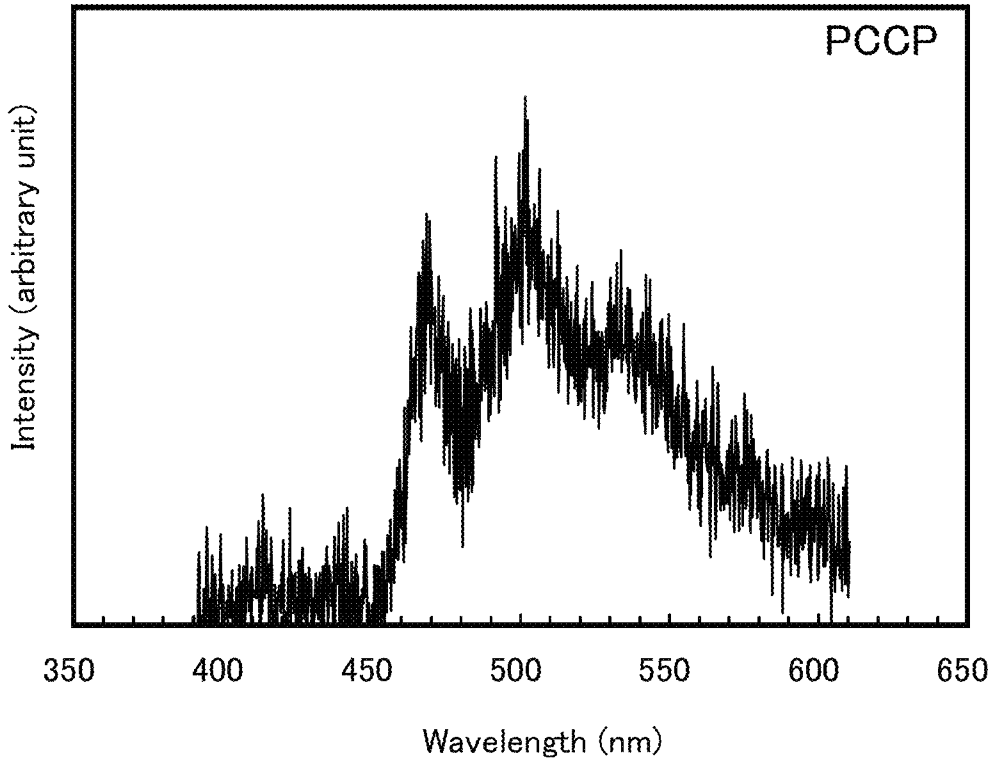
FIG. 31 shows a phosphorescent spectrum of PCCP.
Figure 32:
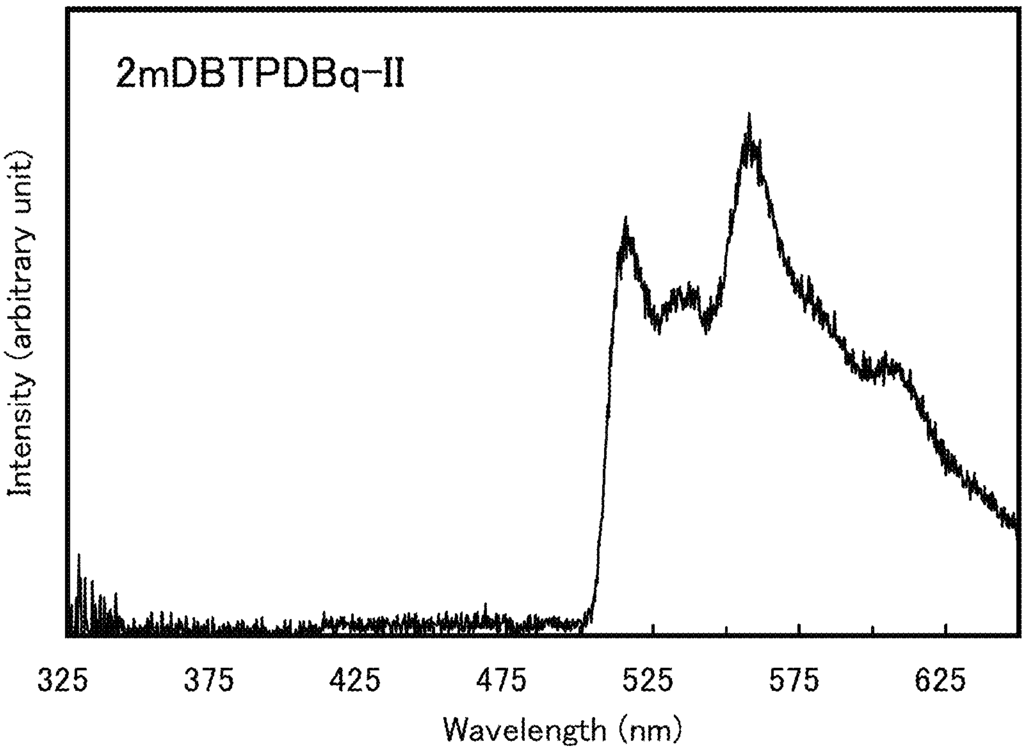
FIG. 32 shows a phosphorescent spectrum of 2mDBTPDBq-II.
Figure 33:
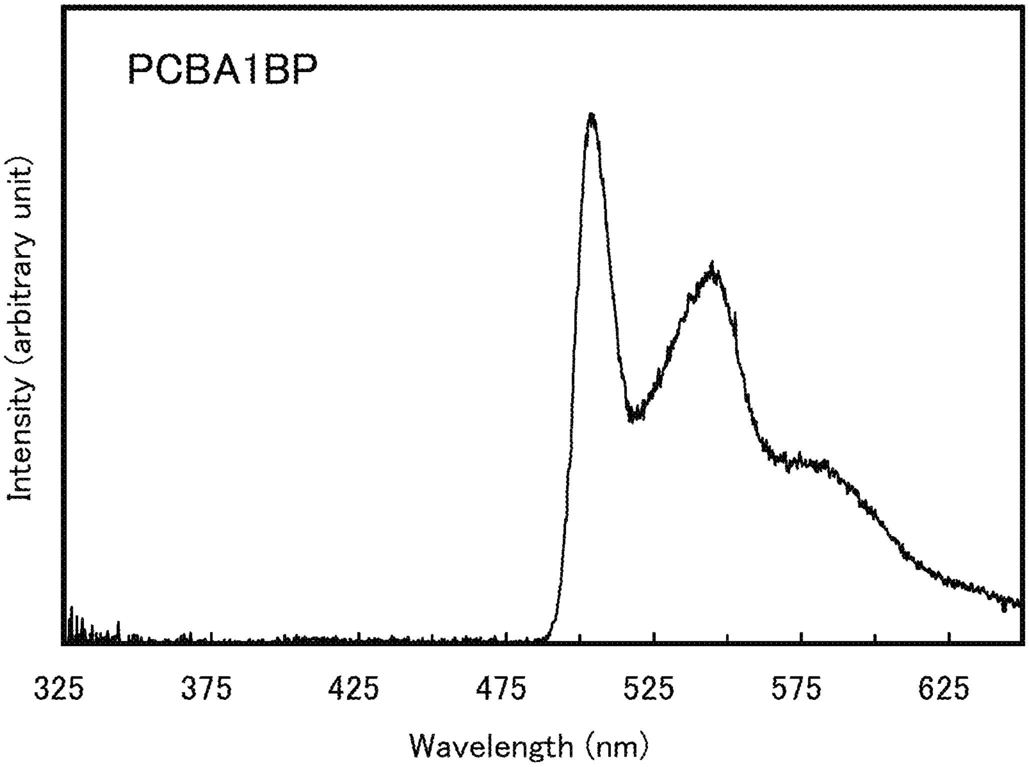
FIG. 33 shows a phosphorescent spectrum of PCBA1BP.
Figure 34:
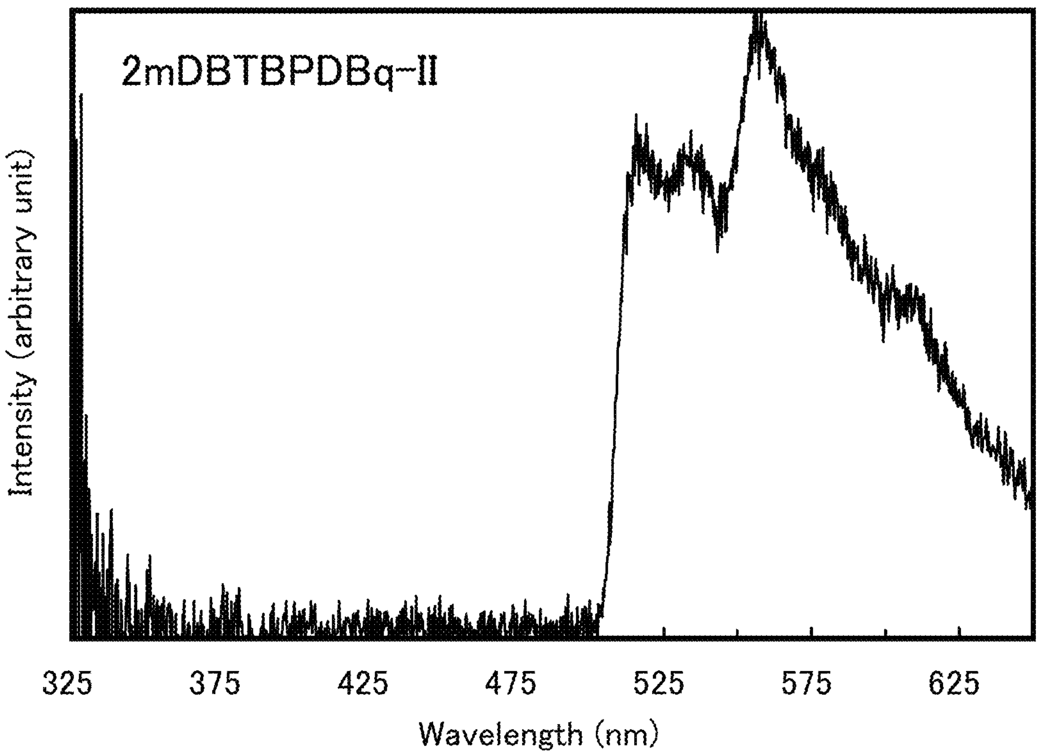
FIG. 34 shows a phosphorescent spectrum of 2mDBTBPDBq-II.
Figure 35:
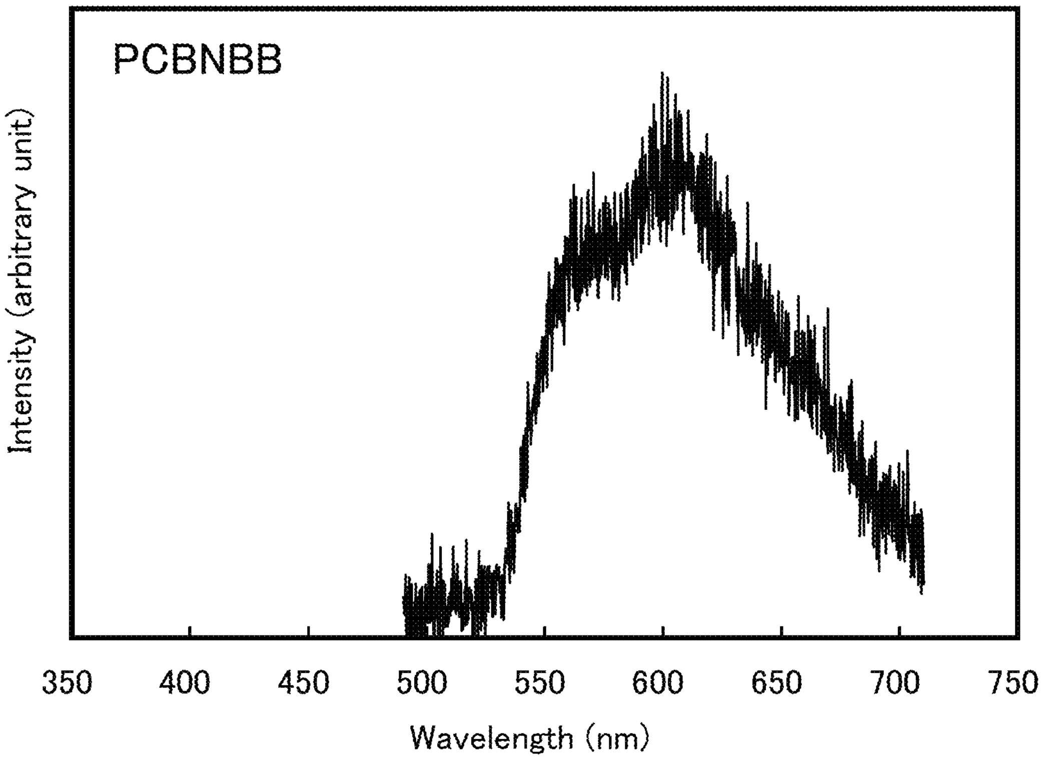
FIG. 35 shows a phosphorescent spectrum of PCBNBB.

Further, FIG. 29 shows the results of a reliability test under conditions where the initial luminance was 3000 cd/$m^2$ and the current density was constant. FIG. 29 shows a change in normalized luminance with an initial luminance of 100%. The results show that a decrease in luminance over driving time of the light-emitting element 4 is small, and thus the light-emitting element 4 has favorable reliability.

Reference Example 1

The triplet excitation energies of 35DCzPPy, PCCP, 2mDBTPDBq-II, PCBA1BP, 2mDBTBPDBq-II, and PCBNBB used for the light-emitting elements in the above examples were measured. Note that the triplet excitation energies were measured in such a manner that phosphorescent emission of each substance was measured and a phosphorescence wavelength was converted into electron volt. In the measurement, each substance was irradiated with excitation light with a wavelength of 325 nm and the measurement temperature was 10 K. Note that in measuring an energy level, calculation from an absorption wavelength is more accurate than calculation from an emission wavelength. However, here, absorption of the triplet excitation energy was extremely low and difficult to measure; thus, the triplet excitation energy was measured by measuring a peak wavelength located on the shortest wavelength side in a phosphorescence spectrum. For that reason, a few errors may be included in the measured values.

FIG. 30, FIG. 31, FIG. 32, FIG. 33, FIG. 34, and FIG. 35 show measured phosphorescence. Table 7 shows the measurement results. As apparent from these results, the triplet excitation energies of 35DCzPPy and PCCP used for the first light-emitting layer are higher than those of 2mDBTPDBq-II, PCBA1BP, 2mDBTBPDBq-II, and PCBNBB used for the second light-emitting layer or the third light-emitting layer.

TABLE 7

| Triplet excitation energies of substances | |
|---|---|
| 35DCzPPy | 2.74 eV |
| PCCP | 2.64 eV |
| 2mDBTPDBq-II | 2.40 eV |
| PCBA1BP | 2.46 eV |
| 2mDBTBPDBq-II | 2.41 eV |
| PCBNBB | 2.21 eV |

Reference Example 2

A synthetic example of an organometallic complex (acetylacetonato)bis(6-tert-butyl-4-phenylpyrimidinato) iridium(III) (another name: bis[2-(6-tert-butyl-4-pyrimidinyl-κN3)phenyl-κC](2,4-pentanedionato-$\kappa^2$O,O')iridium (III)) (abbreviation: $[Ir(tBuppm)_2(acac)]$), which is used in the above examples, will be described. The structure of $[Ir(tBuppm)_2(acac)]$ is shown below.

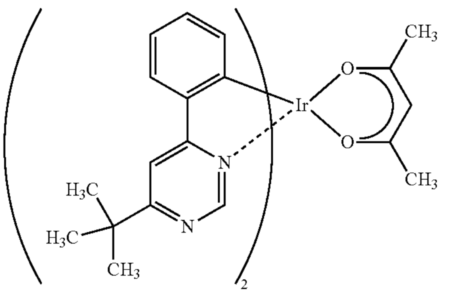

$Ir(tBuppm)_2(acac)$

Step 1: Synthesis of 4-tert-butyl-6-phenylpyrimidine (Abbreviation: HtBuppm

First, 22.5 g of 4,4-dimethyl-1-phenylpentane-1,3-dione and 50 g of formamide were put into a recovery flask equipped with a reflux pipe, and the air in the flask was replaced with nitrogen. This reaction container was heated, so that the reacted solution was refluxed for 5 hours. After that, this solution was poured into an aqueous solution of sodium hydroxide, and an organic layer was extracted with dichloromethane. The obtained organic layer was washed with water and saturated saline, and dried with magnesium sulfate. The solution after drying was filtered. The solvent of this solution was distilled off, and then the obtained residue was purified by silica gel column chromatography using hexane and ethyl acetate as a developing solvent in a volume ratio of 10:1, so that a pyrimidine derivative HtBuppm (colorless oily substance, yield of 14%) was obtained. A synthesis scheme of Step 1 is shown below.

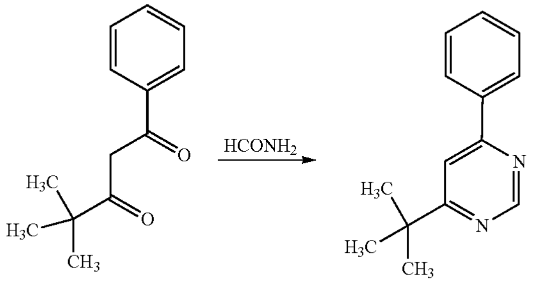

HtBuppm

Step 2: Synthesis of di-μ-chloro-bis[bis(6-tert-butyl-4-phenylpyrimidinato)iridium(III)](Abbreviation: $[Ir(tBuppm)_2Cl]_2$ Next, 15 mL of 2-ethoxyethanol, 5 mL of water, 1.49 g of HtBuppm obtained in Step 1, and 1.04 g of iridium chloride hydrate ($IrCl_3 \cdot H_2O$) were put into a recovery flask equipped with a reflux pipe, and the air in the flask was replaced with argon. After that, irradiation with microwaves (2.45 GHz, 100 W) was performed for 1 hour to cause a reaction. The solvent was distilled off, and then the obtained residue was suction-filtered and washed with ethanol, so that a dinuclear complex $[Ir(tBuppm)_2Cl]_2$ (yellow green powder, yield of 73%) was obtained. A synthesis scheme of Step 2 is shown below.

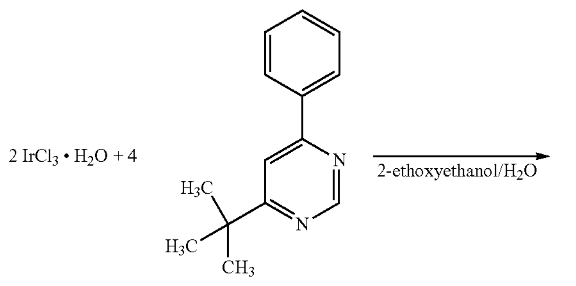

HtBuppm

-continued

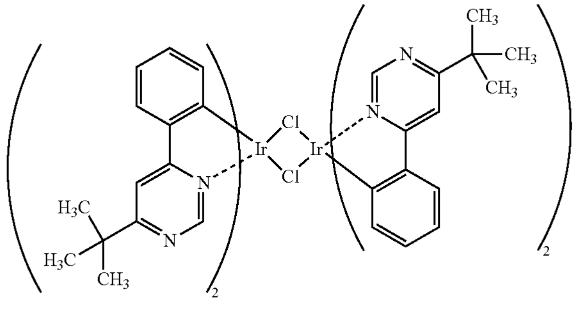

$[Ir(tBuppm)_2Cl]_2$

Step 3: Synthesis of (acetylacetonato)bis(6-tert-butyl-4-phenylpyrimidinato)iridium(III) (Abbreviation: $[Ir(tBuppm)_2(acac)]$ Further, 40 mL of 2-ethoxyethanol, 1.61 g of the dinuclear complex $[Ir(tBuppm)_2Cl]_2$ obtained in Step 2, 0.36 g of acetylacetone, and 1.27 g of sodium carbonate were put into a recovery flask equipped with a reflux pipe, and the air in the flask was replaced with argon. After that, irradiation with microwaves (2.45 GHz, 120 W) was performed for 60 minutes to cause a reaction. The solvent was distilled off, and the obtained residue was suction-filtered with ethanol and washed with water and ethanol. This solid was dissolved in dichloromethane, and the mixture was filtered through a filter aid in which Celite (produced by Wako Pure Chemical Industries, Ltd., Catalog No. 531-16855), alumina, and Celite were stacked in this order. The solvent was distilled off, and the obtained solid was recrystallized with a mixed solvent of dichloromethane and hexane, so that the objective substance was obtained as yellow powder (yield of 68%). A synthesis scheme of Step 3 is shown below.

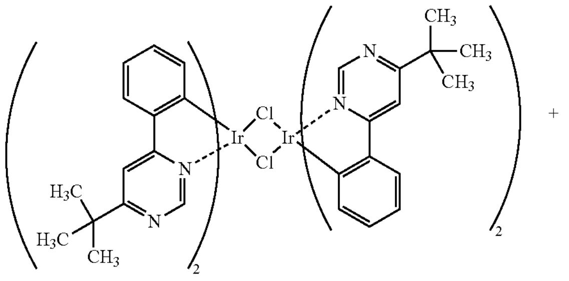

$[Ir(tBuppm)_2Cl]_2$

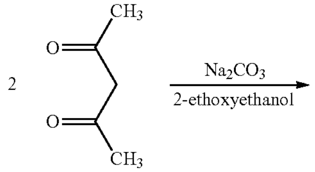

-continued

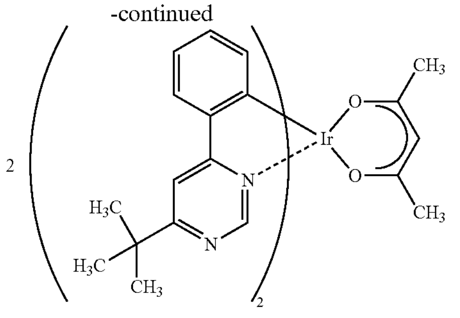

$Ir(tBuppm)_2(acac)$

An analysis result by nuclear magnetic resonance spectrometry ($^1H$ NMR) of the yellow powder obtained in Step 3 is described below. These results revealed that the organometallic complex $Ir(tBuppm)_2(acac)$ was obtained.

$^1H$ NMR. δ ($CDCl_3$): 1.50 (s, 18H), 1.79 (s, 6H), 5.26 (s, 1H), 6.33 (d, 2H), 6.77 (t, 2H), 6.85 (t, 2H), 7.70 (d, 2H), 7.76 (s, 2H), 9.02 (s, 2H).

Reference Example 3

In this reference example, a synthesis method of tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), which is used in the above example, will be described. A structure of [Ir(mpptz-dmp)$_3$] is shown below.

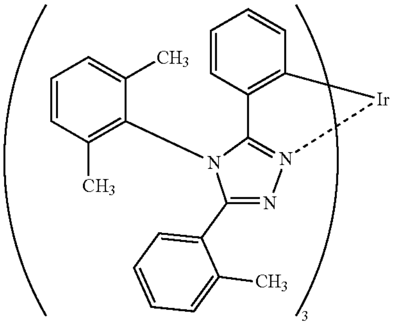

$Ir(mpptz\text{-}dmp)_3$

Step 1: Synthesis of N-benzoyl-N'-2-methylbenzoylhydrazide

First, 15.0 g (110.0 mmol) of benzoylhydrazine and 75 ml of N-methyl-2-pyrrolidinone (NMP) were put into a 300-ml three-neck flask and stirred while being cooled with ice. To this mixed solution, a mixed solution of 17.0 g (110.0 mmol) of o-toluoyl chloride and 15 ml of N-methyl-2-pyrrolidinone (NMP) was slowly added dropwise. After the addition, the mixture was stirred at room temperature for 24 hours. After reaction for the predetermined time, this reacted solution was slowly added to 500 ml of water, so that a white solid was precipitated. The precipitated solid was subjected to ultrasonic cleaning in which water and 1M hydrochloric acid were used alternately. Then, ultrasonic cleaning using hexane was performed, so that 19.5 g of a white solid of N-benzoyl-N'-2-methylbenzoylhydrazide was obtained in a yield of 70%. A synthesis scheme of Step 1 is shown below.

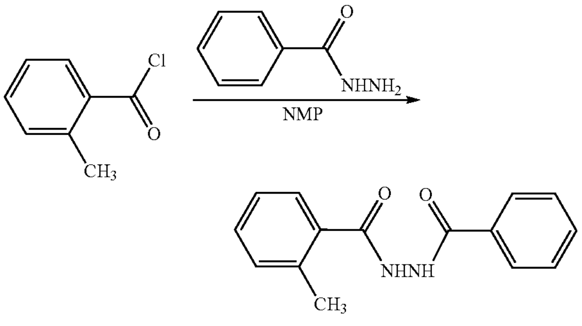

Step 2: Synthesis of N-[1-chloro-1-(2-methylphenyl)methylidene]-N-[1-chloro-(1-phenyl)methylidene]hydrazine Next, 12.0 g (47.2 mmol) of N-benzoyl-N'-2-methylbenzoylhydrazide obtained in Step 1 and 200 ml of toluene were put into a 500-ml three-neck flask. To this mixed solution, 19.4 g (94.4 mmol) of phosphorus pentachloride was added and the mixture was heated and stirred at 120° C. for 6 hours. After reaction for the predetermined time, the reacted solution was slowly poured into 200 ml of water and the mixture was stirred for 1 hour. After the stirring, an organic layer and an aqueous layer were separated, and the organic layer was washed with water and a saturated aqueous solution of sodium hydrogen carbonate. After the washing, the organic layer was dried with anhydrous magnesium sulfate. The magnesium sulfate was removed from this mixture by gravity filtration, and the filtrate was concentrated; thus, 12.6 g of a brown liquid of N-[1-chloro-1-(2-methylphenyl)methylidene]-N-[1-chloro-(1-phenyl)methylidene]hydrazine was obtained in a yield of 92%. A synthesis scheme of Step 2 is shown below.

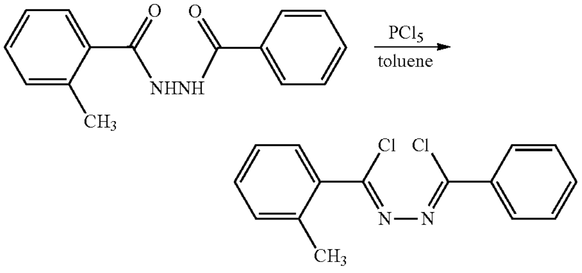

Step 3: Synthesis of 3-(2-methylphenyl)-4-(2,6-dimethylphenyl)-5-phenyl-4H-1,2,4-triazole (Abbreviation: Hmpptz-dmp First, 12.6 g (43.3 mmol) of N-[1-chloro-1-(2-methylphenyl)methylidene]-N-[1-chloro-(1-phenyl)methylidene]hydrazine obtained in Step 2, 15.7 g (134.5 mmol) of 2,6-dimethylaniline, and 100 ml of N,N-dimethylaniline were put into a 500-ml recovery flask and heated and stirred at 120° C. for 20 hours. After reaction for the predetermined time, this reacted solution was slowly added to 200 ml of 1N hydrochloric acid. Dichloromethane was added to this solution and an objective substance was extracted to an organic layer. The obtained organic layer was washed with water and an aqueous solution of sodium hydrogen carbonate, and was dried with magnesium sulfate. The magnesium sulfate was removed by gravity filtration, and the obtained filtrate was concentrated to give a black liquid. This liquid was purified by silica gel column chromatography. A mixed solvent of ethyl acetate and hexane in a ratio of 1:5 was used as a developing solvent. The obtained fraction was concentrated to give a white solid. This solid was recrystallized with ethyl acetate to give 4.5 g of a white solid of Hmpptz-dmp in a yield of 31%. A synthesis scheme of Step 3 is shown below.

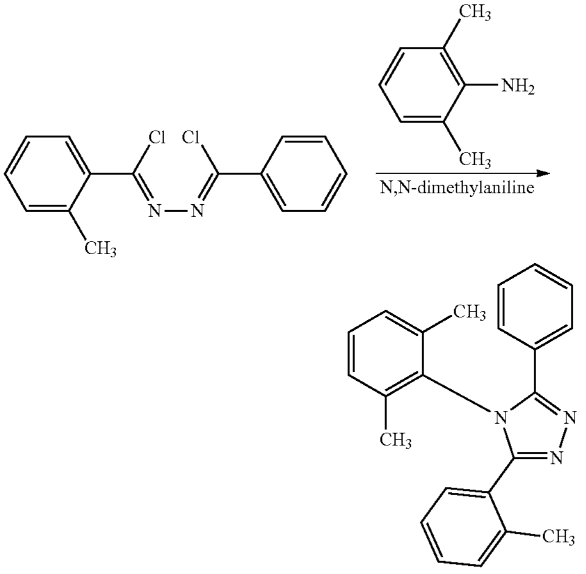

Hmpptz-dmp

Step 4: Synthesis of $[Ir(mpptz\text{-}dmp)_3]$

Then, 2.5 g (7.4 mmol) of Hmpptz-dmp, which was the ligand obtained in Step 3, and 0.7 g (1.5 mmol) of tris(acetylacetonato)iridium(III) were put into a container for high-temperature heating, and degasification was carried out. The mixture in the reaction container was heated and stirred at 250° C. for 48 hours under Ar flow. After reaction for the predetermined time, the obtained solid was washed with dichloromethane, and an insoluble green solid was obtained by suction filtration. This solid was dissolved in toluene and filtered through a stack of alumina and Celite. The obtained fraction was concentrated to give a green solid. This solid was recrystallized with toluene, so that 0.8 g of a green powder was obtained in a yield of 45%. A synthesis scheme of Step 4 is shown below.

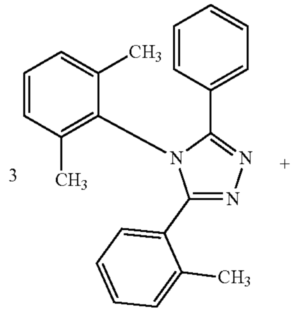

Hmpptz-dmp

-continued

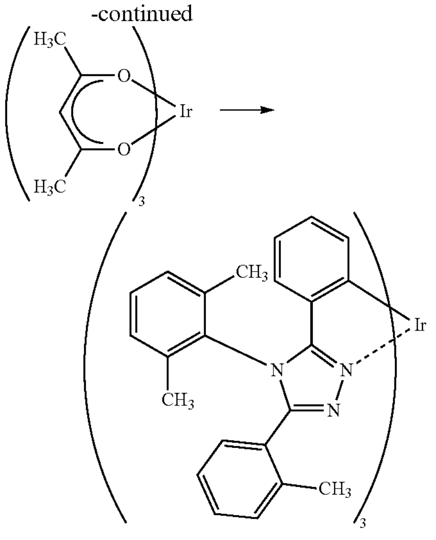

$Ir(mpptz\text{-}dmp)_3$

An analysis result by nuclear magnetic resonance ($^1$H-NMR) spectroscopy of the green powder obtained in Step 4 is described below. The result revealed that $[Ir(mpptz\text{-}dmp)_3]$ was obtained by the synthesis method.

$^1$H-NMR. δ (toluene-d8): 1.82 (s, 9H), 1.90 (s, 9H), 2.64 (s, 9H), 6.56-6.62 (m, 9H), 6.67-6.75 (m, 9H), 6.82-6.88 (m, 3H), 6.91-6.97 (t, 3H), 7.00-7.12 (m, 6H), 7.63-7.67 (d, 3H).

This application is based on Japanese Patent Application serial no. 2012-177795 filed with Japan Patent Office on Aug. 10, 2012, the entire contents of which are hereby incorporated by reference.

What is claimed is:

1. A light-emitting device comprising:
- a substrate;
- an anode over the substrate;
- a first light-emitting unit over the anode;
- a first charge-generation layer over the first light-emitting unit;
- a second light-emitting unit over the first charge-generation layer; and
- a cathode over the second light-emitting unit,
- wherein one of the first light-emitting unit and the second light-emitting unit comprises:
  - a first light-emitting layer comprising a first compound and a first host material; and
  - a second light-emitting layer in contact with the first light-emitting layer, the second light-emitting layer comprising a second compound and a second host material;
- wherein the first host material comprises a first host compound,
- wherein the second host material comprises a second host compound and a third host compound,
- wherein the second host compound has a π-electron deficient heteroaromatic skeleton,
- wherein an emission wavelength of the first compound is longer than an emission wavelength of the second compound,
- wherein the second host compound is configured to form a first exciplex with the third host compound,
- wherein a difference in energy between an emission peak wavelength of the first exciplex and a peak wavelength of a lowest-energy absorption band of the second compound is 0.2 eV or less, and wherein at least one of the first compound and the second compound is a phosphorescent compound.

2. The light-emitting device according to claim 1, wherein the lowest-energy absorption band corresponds to a direct transition from a ground state to a triplet excitation state.

3. The light-emitting device according to claim 1, wherein the first host material further comprises a fourth host compound which is configured to form a second exciplex with the first host compound.

4. The light-emitting device according to claim 1, further comprising a third light-emitting layer in contact with the first light-emitting layer or the second light-emitting layer, wherein the third light-emitting layer comprises a third compound and a third host material, wherein the third compound is a phosphorescent compound.

5. The light-emitting device according to claim 4, wherein the second host material further comprises a fourth host compound, wherein the fourth host compound is configured to form a second exciplex with the second host compound, and wherein the third host material comprises a fifth host compound and a sixth host compound.

6. The light-emitting device according to claim 1, further comprising:

a second charge-generation layer over the second light-emitting unit; and a third light-emitting unit over the second charge-generation layer.

7. The light-emitting device according to claim 1, wherein the first light-emitting unit and the second light-emitting unit have the same structure.

8. The light-emitting device according to claim 1, wherein the other of the first light-emitting unit and the second light-emitting unit comprises a third light-emitting layer, and wherein the third light-emitting layer is configured to emit a different color from the first light-emitting layer and the second light-emitting layer.

9. A lighting device comprising the light-emitting device according to claim 1.

10. An electronic device comprising the light-emitting device according to claim 1.

* * * * *